(12) United States Patent
Kamikawa et al.

(10) Patent No.: US 8,344,413 B2
(45) Date of Patent: Jan. 1, 2013

(54) NITRIDE SEMICONDUCTOR WAFER, NITRIDE SEMICONDUCTOR CHIP, AND METHOD OF MANUFACTURE OF NITRIDE SEMICONDUCTOR CHIP

(75) Inventors: Takeshi Kamikawa, Osaka (JP); Masataka Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 60 days.

(21) Appl. No.: 12/801,218

(22) Filed: May 27, 2010

(65) Prior Publication Data

US 2010/0301348 A1    Dec. 2, 2010

(30) Foreign Application Priority Data

May 29, 2009  (JP) .................................. 2009-130741

(51) Int. Cl.
*H01L 33/00*  (2010.01)
(52) U.S. Cl. .......................................... 257/99; 257/103
(58) Field of Classification Search ............ 257/87–103, 257/E33.072
See application file for complete search history.

(56) References Cited

U.S. PATENT DOCUMENTS

| | | | |
|---|---|---|---|
| 6,576,932 B2 | 6/2003 | Khare et al. | |
| 7,847,280 B2 | 12/2010 | Yamada et al. | |
| 2002/0050596 A1 | 5/2002 | Otsuka et al. | |
| 2003/0165169 A1 | 9/2003 | Nomoto et al. | |
| 2005/0025204 A1 | 2/2005 | Kamikawa et al. | |
| 2005/0151153 A1* | 7/2005 | Kamikawa et al. | 257/103 |
| 2005/0232327 A1 | 10/2005 | Nomura et al. | |
| 2006/0094244 A1 | 5/2006 | Yamada et al. | |
| 2006/0131590 A1 | 6/2006 | Takakura et al. | |
| 2006/0187989 A1 | 8/2006 | Tanaka | |
| 2007/0051961 A1 | 3/2007 | Kamikawa et al. | |
| 2007/0121692 A1 | 5/2007 | Kawakami et al. | |
| 2007/0221932 A1 | 9/2007 | Kano et al. | |
| 2008/0112448 A1 | 5/2008 | Ueda et al. | |
| 2008/0283851 A1 | 11/2008 | Akita | |
| 2008/0285609 A1 | 11/2008 | Ohta et al. | |
| 2008/0304528 A1 | 12/2008 | Yamamoto et al. | |
| 2008/0308815 A1 | 12/2008 | Kasai et al. | |
| 2008/0308906 A1 | 12/2008 | Osada et al. | |
| 2009/0092166 A1 | 4/2009 | Kamikawa et al. | |
| 2009/0161711 A1 | 6/2009 | Kubota | |
| 2009/0200573 A1 | 8/2009 | Kawakami et al. | |

(Continued)

FOREIGN PATENT DOCUMENTS

CN            1770578            5/2006

(Continued)

*Primary Examiner* — Cuong Q Nguyen
(74) *Attorney, Agent, or Firm* — Harness, Dickey & Pierce, P.L.C.

(57) ABSTRACT

A nitride semiconductor chip is provided that offers enhanced luminous efficacy as a result of an improved EL emission pattern. The nitride semiconductor laser chip (nitride semiconductor chip) has an n-type GaN substrate having as a principal growth plane a plane having an off-angle in the a-axis direction relative to the m plane, and a nitride semiconductor layer formed on the principal growth plane of the n-type GaN substrate. The n-type GaN substrate includes a depressed portion (carved region), which is carved from the principal growth plane in the thickness direction, and an uncarved region, which is a region not carved. The nitride semiconductor layer formed on the n-type GaN substrate has a gradient thickness region whose thickness decreases in a gradient fashion toward the depressed portion (carved region) and an emission portion formation region whose thickness varies very little. In the emission portion formation region 6, a ridge portion is formed.

16 Claims, 31 Drawing Sheets

U.S. PATENT DOCUMENTS

| | | |
|---|---|---|
| 2009/0262771 A1 | 10/2009 | Inoue et al. |
| 2009/0309135 A1 | 12/2009 | Udagawa |
| 2009/0323750 A1 | 12/2009 | Inoue et al. |
| 2010/0032644 A1 | 2/2010 | Akita et al. |
| 2010/0046566 A1 | 2/2010 | Kudo |
| 2010/0117055 A1 | 5/2010 | Nakanishi et al. |
| 2010/0133506 A1 | 6/2010 | Nakanishi et al. |
| 2010/0220761 A1 | 9/2010 | Enya et al. |
| 2010/0246624 A1 | 9/2010 | Hiroyama et al. |
| 2010/0295054 A1 | 11/2010 | Okamoto et al. |

FOREIGN PATENT DOCUMENTS

| | | |
|---|---|---|
| CN | 1983751 | 6/2007 |
| CN | 101308896 | 11/2008 |
| JP | 10-135576 | 5/1998 |
| JP | 11-150321 | 6/1999 |
| JP | 2000-277846 | 10/2000 |
| JP | 2003-031894 | 1/2003 |
| JP | 2003-258370 | 9/2003 |
| JP | 2004-311964 | 11/2004 |
| JP | 2004-356454 | 12/2004 |
| JP | 2004-363401 | 12/2004 |
| JP | 2005-064204 | 3/2005 |
| JP | 2005064469 A | 3/2005 |
| JP | 2005-294322 | 10/2005 |
| JP | 2006-093548 | 4/2006 |
| JP | 2006-134926 | 5/2006 |
| JP | 2006-156953 | 6/2006 |
| JP | 2006-190980 | 7/2006 |
| JP | 2006303471 A | 11/2006 |
| JP | 2007-088270 | 4/2007 |
| JP | 2007-096200 | 4/2007 |
| JP | 2007-184503 | 7/2007 |
| JP | 2008-016584 | 1/2008 |
| JP | 2008-091488 A | 4/2008 |
| JP | 2008-118049 | 5/2008 |
| JP | 2008-226865 | 9/2008 |
| JP | 2008-277539 | 11/2008 |
| JP | 2008-285364 | 11/2008 |
| JP | 2008-306062 | 12/2008 |
| JP | 2008-311640 | 12/2008 |
| JP | 2009-018983 | 1/2009 |
| JP | 2009-094360 | 4/2009 |
| JP | 2009-117662 | 5/2009 |
| JP | 2009-141132 | 6/2009 |
| JP | 2009-152502 | 7/2009 |
| JP | 2009-152511 | 7/2009 |
| JP | 2009-158955 | 7/2009 |
| JP | 2010-123803 | 6/2010 |
| JP | 2010-205835 | 9/2010 |
| WO | WO 2006/054543 | 5/2006 |
| WO | WO 2008/126695 | 10/2008 |
| WO | WO 2008/153130 | 12/2008 |
| WO | WO 2008/155958 | 12/2008 |

* cited by examiner

NITRIDE SEMICONDUCTOR WAFER, NITRIDE SEMICONDUCTOR CHIP, AND METHOD OF MANUFACTURE OF NITRIDE SEMICONDUCTOR CHIP

This nonprovisional application claims priority under 35 U.S.C. §119(a) on Patent Application No. 2009-130741 filed in Japan on May 29, 2009, the entire contents of which are hereby incorporated by reference.

BACKGROUND OF THE INVENTION

1. Field of the Invention

The present invention relates to a nitride semiconductor wafer, a nitride semiconductor chip, and a method of manufacture of a nitride semiconductor chip.

2. Description of Related Art

Nitride semiconductors as exemplified by GaN, AlN, InN, and their mixed crystals are characterized by having wider band gaps Eg than AlGaInAs- and AlGaInP-based semiconductors and in addition being direct band gap materials. For these reasons, nitride semiconductors have been receiving attention as materials for building semiconductor light-emitting chips such as semiconductor laser chips emitting light in wavelength regions from ultraviolet to green and light-emitting diode chips covering wide emission wavelength ranges from ultraviolet to red, and are expected to find wide application in projectors and full-color displays, and further in environmental, medical, and other fields.

On the other hand, in recent years, many research institutions have been making vigorous attempts to realize semiconductor light-emitting chips emitting light in a green region (green semiconductor lasers) by making longer the emission wavelengths of semiconductor light-emitting chips using nitride semiconductors.

Generally, in a semiconductor light-emitting chip using a nitride semiconductor, a substrate (nitride semiconductor substrate) of GaN, which has a hexagonal crystal system, is used, and its c plane (the (0001) plane) is used as the principal growth plane. By stacking nitride semiconductor layers including an active layer on the c plane, a nitride semiconductor light-emitting chip is formed. Generally, in a case where a nitride semiconductor light-emitting chip is formed by use of a nitride semiconductor substrate, an active layer containing In is used, and by increasing the In composition ratio, a longer emission wavelength is sought.

Inconveniently, however, the c plane of a GaN substrate is a polar plane having polarity in the c-axis direction, and therefore stacking nitride semiconductor layers including an active layer on the c plane causes spontaneous polarization in the active layer. Also inconveniently, when nitride semiconductor layers including an active layer are stacked on the c plane, as the In composition ratio increases, lattice distortion increases, inducing in the active layer a strong internal electric field due to piezoelectric polarization. The internal electric field reduces the overlap between the wave functions of electrons and holes, and thus diminishes the rate of radiative recombination. Accordingly, increasing the In composition ratio in an attempt to realize light emission in a green region suffers from the problem that, as the emission wavelength is lengthened, luminous efficacy significantly lowers.

To avoid the effects of spontaneous polarization and piezoelectric polarization, therefore, there are nowadays proposed nitride semiconductor light-emitting chips having nitride semiconductor layers stacked not on the c plane as commonly practiced but on the m plane (the {1-100} plane), which is a non-polar plane. Such nitride semiconductor light-emitting chips are disclosed, for example, in JP-A-2008-91488.

The nitride semiconductor light-emitting chip (light-emitting diode chip) disclosed in JP-A-2008-91488 mentioned above is provided with a GaN substrate of which the m plane, which is a non-polar plane, is used as the principal growth plane, and on this principal growth plane (the m plane), nitride semiconductor layers including an active layer are stacked. The m plane is a crystal plane perpendicular to the c plane, and therefore stacking nitride semiconductor layers including an active layer on the m plane causes the c axis, which is an axis of polarization, to lie on the plane of the active layer. Thus, the effects of spontaneous polarization and piezoelectric polarization are avoided, and the lowering of luminous efficacy is suppressed. Incidentally, in the nitride semiconductor light-emitting chip (light-emitting diode chip) disclosed in JP-A-2008-91488, from the viewpoint of suppressing deterioration of surface morphology, the m plane of the GaN substrate is so adjusted that its off-angle (alignment error) is not more than ±1 degree.

As described above, by use of a nitride semiconductor substrate having the m plane as the principal growth plane, it is possible to obtain a nitride semiconductor light-emitting chip in which the lowering of luminous efficacy due to spontaneous polarization and piezoelectric polarization is suppressed.

Inconveniently, however, through measurement of luminous efficacy (of light emission resulting from current injection, that is, electroluminescence, abbreviated to EL) with regard to nitride semiconductor light-emitting chips using a nitride semiconductor substrate having the m plane as the principal growth plane, it was confirmed that, as the In composition ratio in the active layer increased, the luminous efficacy sharply lowered. Through intensive studies in search of the cause of the phenomenon, the inventors of the present invention have found out that the lowering of luminous efficacy is caused by the EL emission pattern (the light distribution across the plane as observed when light is emitted by current injection) becoming bright-spotted. That is, the inventors have found out that, as the In composition ratio in the active layer increases, the EL emission pattern of nitride semiconductor light-emitting chips become bright-spotted.

Specifically, when nitride semiconductor light-emitting chips (light-emitting diode chips) using a nitride semiconductor substrate having the m plane as the principal growth plane were fabricated and were made to emit light by current injection, a bright-spotted EL emission pattern as shown in FIG. 47 was observed. What conditions cause this phenomenon have not conventionally been known at all. Through close studies in search for the cause, it has been found out that, as the In composition ratio in the active layer increases, the EL emission pattern becomes increasingly bright-spotted. Such a bright-spotted EL emission pattern becomes more prominent as the In composition ratio in the active layer increases, and a tendency has been observed that a bright-spotted EL emission pattern is especially prominent starting around a green region (with the In composition ratio in the active layer (well layer) 0.15 or more). As the In content increases further, the number of light-emitting bright spots (the area of light emission) decreases. Thus, a strong correlation is observed between the bright-spotted EL emission pattern and the In composition ratio, and it has therefore been found out that the phenomenon of the EL emission pattern becoming bright-spotted causes the lowering of luminous efficacy that occurs with increased In composition ratios in the active layer. Used as the nitride semiconductor substrate in the studies was a just substrate with an off-angle of 0 degrees (that is, a substrate with no off-angle).

The bright-spotted EL emission pattern described above is a phenomenon prominent in nitride semiconductor light-emitting chips using a nitride semiconductor substrate having a non-polar plane, in particular the m plane, as the principal growth plane.

As discussed above, it has been found out that, in nitride semiconductor light-emitting chips using a nitride semiconductor substrate having the m plane as the principal growth plane, as distinct from nitride semiconductor light-emitting chips using the c plane, the lowering of luminous efficacy due to spontaneous polarization and piezoelectric polarization is suppressed, but there is the problem of lower luminous efficacy due to a bright-spotted EL emission pattern. In nitride semiconductor light-emitting chips using the m plane, such a bright-spotted EL emission pattern poses a great problem because it hampers the lengthening of the emission wavelength. In particular, in semiconductor laser chips, low luminous efficacy is a serious problem because it leads to low gain.

On the other hand, in nitride semiconductor light-emitting chips (nitride semiconductor chips) such as nitride semiconductor laser chips, when a nitride semiconductor layer is grown on the m plane of a nitride semiconductor substrate, a difference in lattice constant, thermal expansion coefficient, etc. between the nitride semiconductor substrate and the nitride semiconductor layer may produce strain in the nitride semiconductor layer, and the strain may cause a crack to develop in the nitride semiconductor layer. Development of a crack in the nitride semiconductor layer reduces the number of acceptable chips obtained from a single wafer, and thus leads to the problem of low yields. Development of a crack also diminishes reliability and degrades chip characteristics such as the emission lifetime. It is therefore very important, from the perspective of chip production, to suppress development of cracks.

In particular, in the fabrication of semiconductor light-emitting chips emitting light in an ultraviolet region or those emitting light in a green region (for example, green semiconductor lasers), for effective light confinement, a semiconductor layer whose lattice constant greatly differs from that of a substrate may be formed on the substrate. In this case, cracks develop very easily, leading to the problem that it is extremely difficult to enhance chip characteristics and increase yields.

SUMMARY OF THE INVENTION

The present invention has been devised to overcome the problems mentioned above, and it is an object of the present invention to provide a nitride semiconductor wafer, a nitride semiconductor chip, and a method of manufacture of a nitride semiconductor chip that offer enhanced luminous efficacy as a result of an improved EL emission pattern.

It is another object of the present invention to provide a nitride semiconductor wafer, a nitride semiconductor chip, and a method of manufacture of a nitride semiconductor chip that offer enhanced chip characteristics and increased yields.

It is yet another object of the present invention to provide a nitride semiconductor chip that offers superb chip characteristics combined with high reliability, and to provide a method of manufacture of such a nitride semiconductor chip.

Through various experiments and intensive studies done in view of the problems mentioned above, the inventors of the present invention have found out that it is possible to suppress a bright-spotted EL emission pattern by using as the principal growth plane of a nitride semiconductor substrate a plane having an off-angle relative to the m plane.

Specifically, according to a first aspect of the invention, a nitride semiconductor wafer is provided with: a nitride semiconductor substrate having, as a principal growth plane, a plane having an off-angle in the a-axis direction relative to the m plane; and a nitride semiconductor layer formed on the principal growth plane of the nitride semiconductor substrate. Here, the nitride semiconductor substrate includes a carved region, which is a region carved from the principal growth plane in the thickness direction, and an uncarved region, which is a region not carved. In the present invention, a "nitride semiconductor substrate" includes a substrate in which a carved region and an uncarved region are formed of a nitride semiconductor.

In the nitride semiconductor wafer according to the first aspect, as described above, a plane having an off-angle in the a-axis direction relative to the m plane is taken as the principal growth plane of the nitride semiconductor substrate, and this makes it possible to suppress a bright-spotted EL emission pattern. That is, with that structure, it is possible to improve the EL emission pattern. In this way, it is possible to enhance the luminous efficacy of the nitride semiconductor chip obtained by splitting the nitride semiconductor wafer. Moreover, by enhancing luminous efficacy, it is possible to obtain a high-luminance nitride semiconductor chip. One reason that the above-described effect of suppressing bright-spotted emission is obtained is considered to be that, as a result of the principal growth plane of the nitride semiconductor substrate having an off-angle in the a-axis direction relative to the m plane, when the nitride semiconductor layer is grown on the principal growth plane, the direction of migration of atoms changes.

According to the first aspect, by suppressing a bright-spotted EL emission pattern, it is possible to make the EL emission pattern even, and thus it is possible to reduce the driving voltage. Incidentally, by suppressing bright-spotted emission, it is possible to obtain an EL emission pattern of even light emission, and thus it is possible to increase gain in the formation of a nitride semiconductor laser chip. Moreover, with the structure described above, it is possible to suppress a bright-spotted EL emission pattern, and thus it is possible to enhance luminous efficacy. This makes it possible to enhance chip characteristics and reliability. That is, by use of the nitride semiconductor wafer structured as described above, it is possible to obtain a nitride semiconductor chip with superb chip characteristics and high reliability.

According to the first aspect, by taking as the principal growth plane a plane having an off-angle in the a-axis direction relative to the m plane as described above, it is possible to give the nitride semiconductor layer formed on the principal growth plane good crystallinity. This makes a crack unlikely to develop in the nitride semiconductor layer. Moreover, with the above structure, it is possible to give the nitride semiconductor layer very good surface morphology, and thus it is possible to obtain a nitride semiconductor layer with a uniform thickness. Thus, it is possible to suppress the inconvenience of the nitride semiconductor layer having a locally thicker region due to the nitride semiconductor layer being not uniformly thick. Since a crack is likely to develop in such a thicker region, by suppressing formation of a locally thicker region in the nitride semiconductor layer, it is possible to make a crack more unlikely to develop.

According to the first aspect, by forming the carved region on the nitride semiconductor substrate, it is possible to form a concavity on the surface of the nitride semiconductor layer over the carved region. Thus, even in a case where there is a large difference in lattice constant, thermal expansion coefficient, etc. between the nitride semiconductor substrate and the nitride semiconductor layer and as a result the nitride semiconductor layer is strained, the strain in the nitride semiconductor layer (the nitride semiconductor layer formed over the uncarved region) can be alleviated with the concavity formed on the surface of the nitride semiconductor layer over the carved region. Thus, it is possible to effectively suppress development of cracks in the nitride semiconductor layer.

An inconvenience here is that, when a nitride semiconductor substrate having a non-polar plane such as the m plane as a principal growth plane is used, compared with a case where a nitride semiconductor substrate having the c plane as a principal growth plane is used, the inside of the carved region gets more readily filled. Through various studies, however, the inventors of the present invention have found out that using a nitride semiconductor substrate having as a principal growth plane a plane having an off-angle in the a-axis direction relative to the m plane makes it more difficult to fill the inside of the carved region. Thus, by use of such a nitride semiconductor substrate, it is possible to readily form a concavity on the surface of the nitride semiconductor layer over the carved region, and thus it is possible to suppress development of cracks easily.

As described above, with the nitride semiconductor wafer according to the first aspect, it is possible to effectively suppress development of cracks, and thus it is possible to increase the number of acceptable chips obtained from a single wafer. This makes it possible to increase yields. Suppressing development of cracks also helps enhance chip reliability and chip characteristics.

With the nitride semiconductor wafer according to the first aspect, owing to the structure described above, it is possible to obtain a very powerful effect of suppressing cracks. This makes it possible to form, easily without developing a crack, a nitride semiconductor layer having a more different composition from the nitride semiconductor substrate. Thus, for example, even in a case where a semiconductor light-emitting chip that emits light in a ultraviolet region, a semiconductor light-emitting chip that emits light in a green region (for example, a green semiconductor laser), or the like is fabricated, it is possible to suppress development of cracks. Thus, it is possible to fabricate, with enhanced chip characteristics and at high yields, semiconductor light-emitting chips that emit light in a ultraviolet or green region, or the like.

According to the first aspect, with the structure described above, it is possible to give the nitride semiconductor layer very good surface morphology, and thus it is possible to reduce variations in chip characteristics. This helps increase the number of chips having characteristics within the rated ranges, and this too helps increase yields. Moreover, enhancing surface morphology helps enhance chip characteristics and reliability.

In the nitride semiconductor wafer according to the first aspect described above, preferably, the nitride semiconductor layer includes a gradient thickness region, which is formed over the uncarved region and whose thickness decreases in a gradient fashion toward the carved region. With this structure, it is possible to alleviate strain in the nitride semiconductor layer also with the gradient thickness region, and thus it is possible to obtain a still more powerful effect of suppressing cracks. This makes it possible to form, easily without developing a crack, a nitride semiconductor layer having a more different composition from the nitride semiconductor substrate. For example, in a case where a GaN substrate is used as a nitride semiconductor substrate, it is possible to form an AlGaN layer with a higher Al composition thicker than ever. This makes it possible to fabricate chips that require a nitride semiconductor film with a high Al composition (for example, semiconductor light-emitting chips that emit light in a ultraviolet or green region) and that have conventionally been difficult to fabricate. The above-mentioned gradient thickness region can be formed close to the carved region (next to the carved region) by controlling the off-angle in the a-axis direction in the nitride semiconductor substrate. The reason that a powerful effect of suppressing cracks as described above is obtained is considered to be as follows: because the gradient thickness region is thin in the first place, it contains little strain itself; in addition, since its thickness varies gradually (in a gradient fashion), the strain is alleviated progressively, resulting in a more powerful effect of alleviating strain.

In the nitride semiconductor wafer according to the first aspect described above, preferably, the carved region is formed to extend in the c-axis direction as seen in a plan view. With this structure, it is possible to easily form, in a part of the nitride semiconductor layer close to the carved region (next to the carved region), a gradient thickness region whose thickness decreases in a gradient fashion (gradually) toward the carved region. The carved region may be formed to extend in a direction crossing the c-axis direction at an angle of ±15 degrees or smaller as observed on the principal growth plane. Also with this structure, it is possible to form the gradient thickness region easily, and thus it is possible to suppress development of cracks in the nitride semiconductor layer easily.

According to a second aspect of the invention, a nitride semiconductor chip is formed by use of the nitride semiconductor wafer according to the first aspect described above. With this structure, it is possible to obtain, at high yields, a nitride semiconductor chip that exhibits an improved EL emission pattern and thus offers high luminous efficacy. In the nitride semiconductor chip according to the second aspect, the nitride semiconductor substrate may or may not include a carved region; the nitride semiconductor substrate may include part of a carved region. Even when the nitride semiconductor substrate includes no carved region, or includes part of a carved region, it is possible to obtain, at high yields, a nitride semiconductor chip that exhibits an improved EL emission pattern and thus offers high luminous efficacy.

According to a third aspect of the invention, a nitride semiconductor chip is provided with: a nitride semiconductor substrate having, as a principal growth plane, a plane having an off-angle in the a-axis direction relative to the m plane; and a nitride semiconductor layer formed on the principal growth plane of the nitride semiconductor substrate. Here, the nitride semiconductor substrate includes a carved region, which is a region carved from the principal growth plane in the thickness direction, and an uncarved region, which is a region not carved.

In the nitride semiconductor chip according to the third aspect, as described above, a plane having an off-angle in the a-axis direction relative to the m plane is taken as the principal growth plane of the nitride semiconductor substrate, and this makes it possible to suppress a bright-spotted EL emission pattern. That is, with that structure, it is possible to improve the EL emission pattern of the nitride semiconductor chip. In this way, it is possible to enhance the luminous efficacy of the nitride semiconductor chip. Moreover, by enhancing luminous efficacy, it is possible to obtain a high-luminance nitride semiconductor chip.

According to the third aspect, by suppressing a bright-spotted EL emission pattern, it is possible to make the EL emission pattern even, and thus it is possible to reduce the driving voltage. Incidentally, by suppressing bright-spotted emission, it is possible to obtain an EL emission pattern of even light emission, and thus it is possible to increase gain in the formation of a nitride semiconductor laser chip. Moreover, with the structure described above, it is possible to suppress a bright-spotted EL emission pattern, and thus it is possible to enhance luminous efficacy. This makes it possible to enhance chip characteristics and reliability. That is, with the structure described above, it is possible to obtain a nitride semiconductor chip with superb chip characteristics and high reliability.

According to the third aspect, by taking as the principal growth plane a plane having an off-angle in the a-axis direction relative to the m plane as described above, it is possible to give the nitride semiconductor layer formed on the principal growth plane good crystallinity. This makes a crack unlikely to develop in the nitride semiconductor layer. Moreover, with the above structure, it is possible to give the nitride semiconductor layer very good surface morphology, and thus it is possible to obtain a nitride semiconductor layer with a uniform thickness. Thus, it is possible to suppress the inconvenience of the nitride semiconductor layer having a locally thicker region due to the nitride semiconductor layer being not uniformly thick. Since a crack is likely to develop in such a thicker region, by suppressing formation of a locally thicker region in the nitride semiconductor layer, it is possible to make a crack more unlikely to develop.

According to the third aspect, by forming the carved region on the nitride semiconductor substrate, it is possible to form a concavity on the surface of the nitride semiconductor layer over the carved region. Thus, even in a case where there is a large difference in lattice constant, thermal expansion coefficient, etc. between the nitride semiconductor substrate and the nitride semiconductor layer and as a result the nitride semiconductor layer is strained, the strain in the nitride semiconductor layer (the nitride semiconductor layer formed over the uncarved region) can be alleviated with the concavity formed on the surface of the nitride semiconductor layer over the carved region. Thus, it is possible to effectively suppress development of cracks in the nitride semiconductor layer.

According to the third aspect, using a nitride semiconductor substrate having as the principal growth plane a plane having an off-angle in the a-axis direction relative to the m plane makes it difficult to fill the inside of the carved region. Thus, it is possible to readily form a concavity on the surface of the nitride semiconductor layer over the carved region, and thus it is possible to suppress development of cracks easily.

As described above, with the nitride semiconductor chip according to the third aspect, it is possible to effectively suppress development of cracks, and thus it is possible to easily obtain a nitride semiconductor chip that allows increased yields. Suppressing development of cracks also helps enhance chip reliability and chip characteristics.

With the nitride semiconductor chip according to the third aspect, owing to the structure described above, it is possible to obtain a very powerful effect of suppressing cracks. This makes it possible to form, without developing a crack, a nitride semiconductor layer having a more different composition from the nitride semiconductor substrate.

According to the third aspect, with the structure described above, it is possible to give the nitride semiconductor layer very good surface morphology, and this too helps enhance chip characteristics and reliability.

In the nitride semiconductor chip according to the third aspect described above, preferably, the nitride semiconductor layer includes a gradient thickness region, which is formed over the uncarved region and whose thickness decreases in a gradient fashion toward the carved region. With this structure, it is possible to alleviate strain in the nitride semiconductor layer also with the gradient thickness region, and thus it is possible to obtain a still more powerful effect of suppressing cracks. This makes it possible to form, easily without developing a crack, a nitride semiconductor layer having a more different composition from the nitride semiconductor substrate. For example, in a case where a GaN substrate is used as a nitride semiconductor substrate, it is possible to form an AlGaN layer with a higher Al composition thicker than ever. This makes it possible to easily obtain chips that require a nitride semiconductor film with a high Al composition (for example, semiconductor light-emitting chips that emit light in a ultraviolet or green region) and that have conventionally been difficult to fabricate. The above-mentioned gradient thickness region can be formed close to the carved region (next to the carved region) by controlling the off-angle in the a-axis direction in the nitride semiconductor substrate.

In the nitride semiconductor chip according to the third aspect described above, preferably, the carved region is formed to extend in the c-axis direction as seen in a plan view. With this structure, it is possible to easily form, in a part of the nitride semiconductor layer close to the carved region (next to the carved region), a gradient thickness region whose thickness decreases in a gradient fashion (gradually) toward the carved region. The carved region may be formed to extend in a direction crossing the c-axis direction at an angle of ±15 degrees or smaller as observed on the principal growth plane. Also with this structure, it is possible to form the gradient thickness region easily, and thus it is possible to suppress development of cracks in the nitride semiconductor layer easily.

In the nitride semiconductor chip according to the third aspect described above, preferably, the absolute value of the off-angle in the a-axis direction in the nitride semiconductor substrate is larger than 0.1 degrees. With this structure, it is possible to suppress a bright-spotted EL emission pattern easily. By making the absolute value of the off-angle in the a-axis direction larger than 0.1 degrees, it is also possible to suppress the inconvenience of surface morphology deteriorating due to the absolute value of the off-angle in the a-axis direction being 0.1 degrees or smaller. Thus, with that structure, it is possible, while obtaining good surface morphology, to suppress a bright-spotted EL emission pattern easily.

In this case, more preferably, the absolute value of the off-angle in the a-axis direction in the nitride semiconductor substrate is 0.5 degrees or larger. With this structure, it is possible, while obtaining good surface morphology, to suppress a bright-spotted EL emission pattern more easily. Moreover, by making the absolute value of the off-angle in the a-axis direction equal to or larger than 0.5 degrees, it is possible to suppress the inconvenience of the gradient thickness region being too large due to the absolute value of the off-angle in the a-axis direction being smaller than 0.5 degrees, and it is also possible to effectively suppress the inconvenience of a diminished effect of suppressing cracks (effect of alleviating strain) by the gradient thickness region.

In the nitride semiconductor chip according to the third aspect described above, the nitride semiconductor substrate may have an off-angle in a c-axis direction in addition to in the a-axis direction. In this case, it is preferable that the off-angle in the a-axis direction be larger than the off-angle in the c-axis direction. With this structure, it is possible to more effectively suppress a bright-spotted EL emission pattern.

In the nitride semiconductor chip according to the third aspect described above, it is preferable that the nitride semiconductor layer have an active layer containing In, and that the In composition ratio in the active layer be 0.15 or more but 0.45 or less. With the nitride semiconductor chip according to the third aspect, even in a case where the In composition ratio in the active layer is 0.15 or more, that is, even under conditions where a bright-spotted EL emission pattern is prominent, it is possible to effectively suppress a bright-spotted EL emission pattern, and thus it is possible to obtain a prominent effect of suppressing bright-spotted emission. On the other hand, by making the In composition ratio in the active layer equal to or less than 0.45, it is possible to effectively suppress the inconvenience of a large number of dislocations developing in the active layer as a result of strain such as lattice mismatch due to the In composition ratio in the active layer being more than 0.45.

In the nitride semiconductor chip according to the third aspect described above, preferably, the nitride semiconductor layer has a p-type semiconductor layer containing Al, and the Al composition ratio in the p-type semiconductor layer is 0.08 or more but 0.35 or less. Here, in the present invention, a "p-type semiconductor layer containing Al" denotes a layer for preventing the carriers (electrons) injected into the active layer from flowing into the p-type semiconductor layer. With this structure, it is possible to form an energy barrier sufficiently high with respect to carriers (electrons), and it is thereby possible to enable the p-type semiconductor layer to function sufficiently as a layer for blocking carrier. Thus, it is possible to more effectively prevent the carriers injected into the active layer from flowing into the p-type nitride semiconductor layer, and it is thereby possible to suppress a bright-spotted EL emission pattern effectively. In this way, it is possible to further enhance the luminous efficacy of the nitride semiconductor chip. On the other hand, by making the Al composition ratio in the p-type semiconductor layer equal to or less than 0.35, it is possible to suppress an increase in the resistance of the p-type semiconductor layer due to the Al composition ratio being too high. Incidentally, by use of a nitride semiconductor substrate having as a principal growth plane a plane having an off-angle in the a-axis direction relative to the m plane, even in a case where the In composition ratio in the active layer is 0.15 or more but 0.45 or less, it is possible to form a p-type semiconductor layer with an Al composition ratio of 0.08 or more but 0.35 or less with good crystallinity. This makes it possible to suppress a bright-spotted EL emission pattern effectively and make the EL emission pattern even.

In the nitride semiconductor chip according to the third aspect described above, preferably, the nitride semiconductor layer includes an optical waveguide region, and the optical waveguide region is located over the uncarved region. With this structure, it is possible to easily obtain a high-luminous-efficacy, high-gain nitride semiconductor laser chip with suppressed development of cracks.

In this case, it is preferable that the optical waveguide region be formed to extend in the c-axis direction as seen in a plan view.

In the nitride semiconductor chip according to the third aspect described above, it is preferable that the nitride semiconductor layer include a light-emitting region, and that the light-emitting region be located over the uncarved region.

In the nitride semiconductor chip according to the third aspect described above, it is preferable that the nitride semiconductor substrate be formed of GaN.

According to a fourth aspect of the invention, a method of manufacture of a nitride semiconductor chip includes: a step of preparing a nitride semiconductor substrate having, as a principal growth plane, a plane having an off-angle in the a-axis direction relative to the m plane; a step of forming a carved region, which is a region carved in a depressed shape, by carving a predetermined region of the principal growth plane of the nitride semiconductor substrate in the thickness direction; and a step of forming a nitride semiconductor layer on the principal growth plane of the nitride semiconductor substrate.

In the nitride semiconductor chip manufacturing method according to the fourth aspect, as described above, a plane having an off-angle in the a-axis direction relative to the m plane is taken as the principal growth plane of the nitride semiconductor substrate, and this makes it possible to suppress a bright-spotted EL emission pattern. That is, with that scheme, it is possible to improve the EL emission pattern. In this way, it is possible to enhance the luminous efficacy of the nitride semiconductor chip. Moreover, by enhancing luminous efficacy, it is possible to manufacture a high-luminance nitride semiconductor chip.

According to the fourth aspect, by suppressing a bright-spotted EL emission pattern, it is possible to make the EL emission pattern even, and thus it is possible to reduce the driving voltage. Incidentally, by suppressing bright-spotted emission, it is possible to obtain an EL emission pattern of even light emission, and thus it is possible to increase gain in the formation of a nitride semiconductor laser chip. Moreover, with the scheme described above, it is possible to suppress a bright-spotted EL emission pattern, and thus it is possible to enhance luminous efficacy. This makes it possible to enhance chip characteristics and reliability. That is, with the scheme described above, it is possible to manufacture a nitride semiconductor chip with superb chip characteristics and high reliability.

According to the fourth aspect, by taking as the principal growth plane a plane having an off-angle in the a-axis direction relative to the m plane as described above, it is possible to give the nitride semiconductor layer formed on the principal growth plane good crystallinity. This makes a crack unlikely to develop in the nitride semiconductor layer. Moreover, with the above scheme, it is possible to give the nitride semiconductor layer very good surface morphology, and thus it is possible to obtain a nitride semiconductor layer with a uniform thickness. Thus, it is possible to suppress the inconvenience of the nitride semiconductor layer having a locally thicker region due to the nitride semiconductor layer being not uniformly thick. Since a crack is likely to develop in such a thicker region, by suppressing formation of a locally thicker region in the nitride semiconductor layer, it is possible to make a crack more unlikely to develop.

According to the fourth aspect, by forming the carved region on the nitride semiconductor substrate, it is possible to form a concavity on the surface of the nitride semiconductor layer over the carved region. Thus, even in a case where there is a large difference in lattice constant, thermal expansion coefficient, etc. between the nitride semiconductor substrate and the nitride semiconductor layer and as a result the nitride semiconductor layer is strained, the strain in the nitride semiconductor layer (the nitride semiconductor layer formed over the uncarved region) can be alleviated with the concavity formed on the surface of the nitride semiconductor layer over the carved region. Thus, it is possible to effectively suppress development of cracks in the nitride semiconductor layer.

According to the fourth aspect, using a nitride semiconductor substrate having as the principal growth plane a plane having an off-angle in the a-axis direction relative to the m plane makes it difficult to fill the inside of the carved region. Thus, it is possible to readily form a concavity on the surface of the nitride semiconductor layer over the carved region, and thus it is possible to suppress development of cracks easily.

As described above, with the nitride semiconductor chip manufacturing method according to the fourth aspect, it is possible to effectively suppress development of cracks, and thus it is possible to increase the number of acceptable chips obtained from a single wafer. This makes it possible to increase yields. Suppressing development of cracks also helps enhance chip reliability and chip characteristics.

With the nitride semiconductor chip manufacturing method according to the fourth aspect, owing to the scheme described above, it is possible to obtain a very powerful effect of suppressing cracks. This makes it possible to form, without developing a crack, a nitride semiconductor layer having a more different composition from the nitride semiconductor substrate. Thus, for example, even in a case where a semiconductor light-emitting chip that emits light in a ultraviolet region, a semiconductor light-emitting chip that emits light in a green region (for example, a green semiconductor laser), or the like is fabricated, it is possible to suppress development of cracks. Thus, it is possible to fabricate, with enhanced chip characteristics and at high yields, semiconductor light-emitting chips that emit light in a ultraviolet or green region, or the like.

According to the fourth aspect, with the scheme described above, it is possible to give the nitride semiconductor layer very good surface morphology, and thus it is possible to reduce variations in chip characteristics. This helps increase the number of chips having characteristics within the rated ranges, and this too helps increase yields. Moreover, enhancing surface morphology helps enhance chip characteristics and reliability.

In the nitride semiconductor chip manufacturing method according to the fourth aspect described above, preferably, the step of forming the carved region includes a step of forming, in a region of the principal growth plane other than the carved region, an uncarved region, which is a region not carved, and the step of forming the nitride semiconductor layer includes a step of forming, in a region over the uncarved region, a gradient thickness region, whose thickness decreases in a gradient fashion toward the carved region. With this scheme, it is possible to alleviate strain in the nitride semiconductor layer also with the gradient thickness region, and thus it is possible to obtain a still more powerful effect of suppressing cracks. This makes it possible to form, easily without developing a crack, a nitride semiconductor layer having a more different composition from the nitride semiconductor substrate. For example, in a case where a GaN substrate is used as a nitride semiconductor substrate, it is possible to form an AlGaN layer with a higher Al composition thicker than ever. This makes it possible to fabricate chips that require a nitride semiconductor film with a high Al composition (for example, semiconductor light-emitting chips that emit light in a ultraviolet or green region) and that have conventionally been difficult to fabricate. The above-mentioned gradient thickness region can be formed close to the carved region (next to the carved region) by controlling the off-angle in the a-axis direction in the nitride semiconductor substrate.

In the nitride semiconductor chip manufacturing method according to the fourth aspect described above, preferably, the step of forming the carved region includes a step of forming the carved region such that the carved region extends in the c-axis direction as seen in a plan view. With this scheme, it is possible to easily form, in a part of the nitride semiconductor layer close to the carved region (next to the carved region), a gradient thickness region whose thickness decreases in a gradient fashion (gradually) toward the carved region. The carved region may be formed to extend in a direction crossing the c-axis direction at an angle of ±15 degrees or smaller as observed on the principal growth plane. Also with this scheme, it is possible to form the gradient thickness region easily, and thus it is possible to suppress development of cracks in the nitride semiconductor layer easily.

In the nitride semiconductor chip manufacturing method according to the fourth aspect described above, preferably, the absolute value of the off-angle in the a-axis direction in the nitride semiconductor substrate is larger than 0.1 degrees. With this scheme, it is possible to suppress a bright-spotted EL emission pattern easily. By making the absolute value of the off-angle in the a-axis direction larger than 0.1 degrees, it is also possible to suppress the inconvenience of surface morphology deteriorating due to the absolute value of the off-angle in the a-axis direction being 0.1 degrees or smaller. Thus, with that scheme, it is possible, while obtaining good surface morphology, to suppress a bright-spotted EL emission pattern easily.

In this case, more preferably, the absolute value of the off-angle in the a-axis direction in the nitride semiconductor substrate is 0.5 degrees or larger. With this scheme, it is possible, while obtaining good surface morphology, to suppress a bright-spotted EL emission pattern more easily. Moreover, by making the absolute value of the off-angle in the a-axis direction equal to or larger than 0.5 degrees, it is possible to suppress the inconvenience of the gradient thickness region being too large due to the absolute value of the off-angle in the a-axis direction being smaller than 0.5 degrees, and it is also possible to effectively obtain the effect of suppressing cracks by the gradient thickness region.

In the nitride semiconductor chip manufacturing method according to the fourth aspect described above, the nitride semiconductor substrate may have an off-angle in the c-axis direction in addition to in the a-axis direction. In this case, it is preferable that the off-angle in the a-axis direction be larger than the off-angle in the c-axis direction. With this scheme, it is possible to more effectively suppress a bright-spotted EL emission pattern.

As described above, according to the present invention, it is possible to easily obtain a nitride semiconductor wafer, a nitride semiconductor chip, and a method of manufacture of a nitride semiconductor chip that offer enhanced luminous efficacy as a result of an improved EL emission pattern.

Moreover, according to the invention, it is possible to easily obtain a nitride semiconductor wafer, a nitride semiconductor chip, and a method of manufacture of a nitride semiconductor chip that offer enhanced chip characteristics and increased yields.

Furthermore, according to the invention, it is possible to easily obtain a nitride semiconductor chip that offers superb chip characteristics combined with high reliability, and a method of manufacture of such a nitride semiconductor chip.

DETAILED DESCRIPTION OF PREFERRED EMBODIMENTS

Hereinafter, specific embodiments of the present invention will be described in detail with reference to the accompanying drawings. In the following embodiments, a "nitride semiconductor" denotes a semiconductor of the composition $Al_xGa_yIn_zN$ (where $0 \leq x \leq 1$, $0 \leq y \leq 1$, $0 \leq z \leq 1$, and $x+y+z=1$).

Embodiment 1

Figure 1:
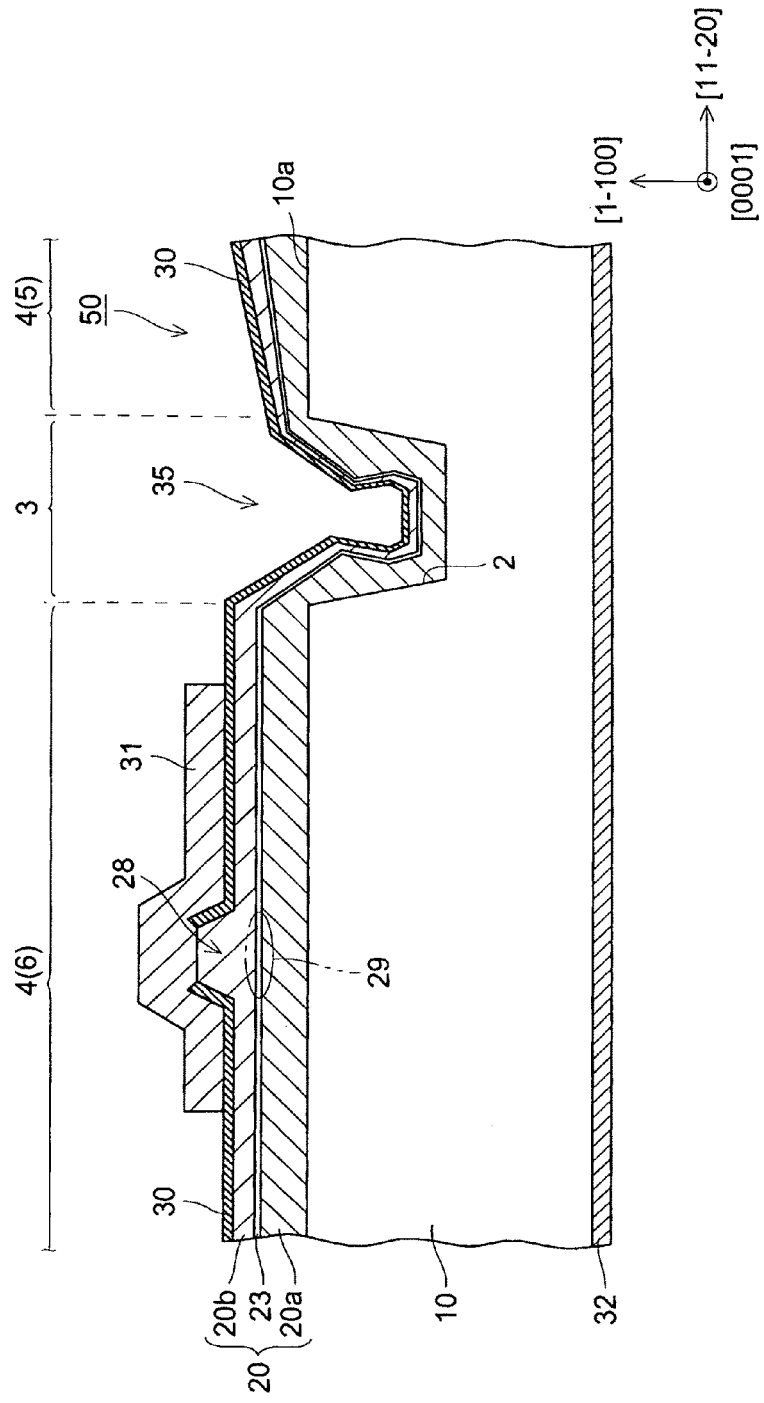
FIG. 1 is a sectional view schematically showing part of a nitride semiconductor wafer according to Embodiment 1 of the invention.
Figure 2:
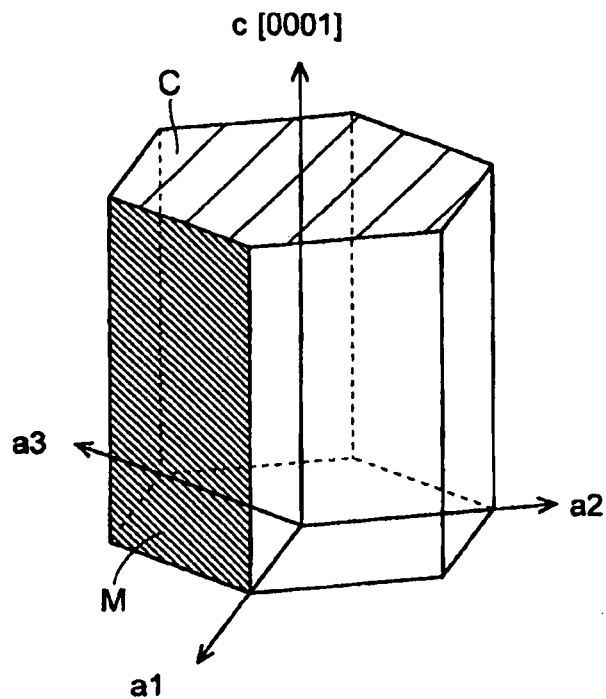
FIG. 2 is a schematic diagram illustrating the crystal structure of a nitride semiconductor (a diagram showing a unit cell)
Figure 3:
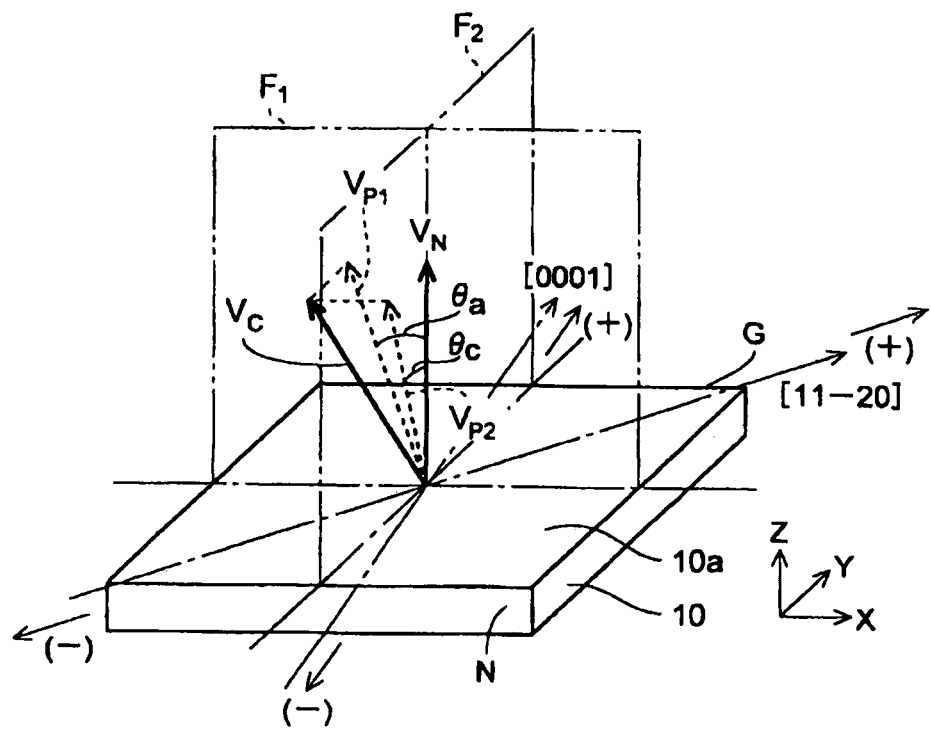
FIG. 3 is a schematic diagram illustrating the off angle of a substrate.

FIG. 1 is a sectional view schematically showing part of a nitride semiconductor wafer according to a first embodiment (Embodiment 1) of the invention. FIG. 2 is a schematic diagram illustrating the crystal structure of a nitride semiconductor. FIG. 3 is a schematic diagram illustrating the off angle of a substrate. FIGS. 4 to 9 are diagrams illustrating a nitride semiconductor wafer according to Embodiment 1 of the invention. First, with reference to FIGS. 1 to 9, a description will be given of a nitride semiconductor wafer 50, including a nitride semiconductor laser chip (nitride semiconductor chip), according to Embodiment 1 of the invention. Embodiment 1 deals with an example in which a nitride semiconductor chip according to the invention is applied to a nitride semiconductor laser chip.

The nitride semiconductor wafer 50 according to Embodiment 1 is formed of a nitride semiconductor having a crystal structure of a hexagonal crystal system as shown in FIG. 2. In this crystal structure, when the hexagonal crystal system is considered a hexagonal column about a c axis [0001], the c plane (the top face C of the hexagonal column) to which the c axis is normal is called the c plane (0001), and any of the side wall faces M of the hexagonal column is called the m plane {1-100}. In a nitride semiconductor, no plane of symmetry exists in the c-axis direction, and therefore a direction of polarization runs along the c-axis direction. Thus, the c plane exhibits different properties between the +c axis side and the −c axis side. Specifically, the +c plane (the (0001) plane, a Ga polar plane G) and the −c plane (the (000-1) plane, a N polar plane N) are not equivalent planes, and have different chemical properties. On the other hand, the m plane is a crystal plane perpendicular to the c plane, and therefore a normal to the m plane is perpendicular to the direction of polarization. Thus, the m plane is a non-polar plane, that is, a plane having no polarity. Since, as described above, the side wall faces of the hexagonal column are each the m plane, the m plane can be represented by six plane orientations, namely (1-100), (10-10), (01-10), (−1100), (−1010), and (0-110); these plane orientations are equivalent in terms of crystal geometry, and are therefore collectively represented by {1-100}.

As shown in FIG. 1, the nitride semiconductor wafer 50 according to Embodiment 1 is provided with an n-type GaN substrate 10 as a nitride semiconductor substrate. The principal growth plane 10a of the n-type GaN substrate 10 is a plane having an off-angle relative to the m plane. Specifically, the n-type GaN substrate 10 of the nitride semiconductor wafer 50 has an off-angle in the a-axis direction (the [11-20] direction) relative to the m plane. The n-type GaN substrate 10 may have, in addition to the off-angle in the a-axis direction, an off-angle in the c-axis direction (the [0001] direction) as well.

Now, with reference to FIG. 3, the off-angle of the n-type GaN substrate 10 will be described in more detail. First, with respect to the m plane, two crystal axis directions are defined, namely the a-axis [11-20] direction and the c-axis [0001] direction. These axes, namely the a and c axes, are perpendicular to each other, and in addition are both perpendicular to the m axis. Moreover, the directions that are parallel to the a-, c-, and m-axis directions when the crystal axis vector (the m axis [1-100]) $V_C$ of the n-type GaN substrate 10 coincides with the normal vector $V_N$ of the substrate surface (the principal growth plane 10a) (that is, when the off-angle is 0 in all directions) are taken as the X, Y, and Z directions respectively. Next, a first plane $F_1$ a normal to which runs in the Y direction and a second plane $F_2$ a normal to which runs in the X direction are considered. Then, the crystal axis vector $V_C$ that appears when the crystal axis vector $V_C$ is projected on the first and second planes $F_1$ and $F_2$ are taken as a first and a second projected vector $V_{P1}$ and $V_{P2}$ respectively. Here, the angle θa between the first projected vector $V_{P1}$ and the normal vector $V_N$ is the off-angle in the a-axis direction, and the angle θc between the second projected vector $V_{P2}$ and the normal vector $V_N$ is the off-angle in the c-axis direction. An off-angle in the a-axis direction, irrespective of whether it is in the + or − direction, indicates the same surface status from a crystallographic point of view, and thus behaves in the same manner in the + and − directions; this permits an off-angle in the a-axis direction to be given in terms of an absolute value. On the other hand, an off-angle in the c-axis direction makes either the Ga polar plane G or the N polar plane N stronger depending on whether it is in the + or − direction, and thus behaves differently depending on the direction; therefore, an off-angle in the c-axis direction is given with a distinction made between the + and − directions.

As described above, the n-type GaN substrate 10 according to Embodiment 1 has, as the principal growth plane 10a, a plane inclined relative to the m plane {1-100}.

Here, in Embodiment 1, the above-described n-type GaN substrate 10 has the absolute value of the off-angle in the a-axis direction relative to the m plane adjusted to be larger than 0.1 degrees. Moreover, to suppress deterioration of surface morphology, the above-described n-type GaN substrate 10 has the absolute value of the off-angle in the a-axis direction adjusted to be 10 degrees or smaller. In a case where it has an off-angle in the c-axis direction as well, it is preferable that the off-angle in the c-axis direction be adjusted to be larger than ±0.1 degrees. It is also preferable that the off-angle in the c-axis direction be adjusted to be smaller than the off-angle in the a-axis direction. In that case, the off-angle in the c-axis direction is smaller than ±10 degrees.

In the case described above, it is preferable that the off-angle in the a-axis direction be adjusted to be larger than 1 degree but 10 degrees or smaller. Adjusting the off-angle in the a-axis direction in that range is more preferable because it is then possible to obtain a marked effect of reducing the driving voltage and in addition an effect of improving surface morphology.

Figure 4:
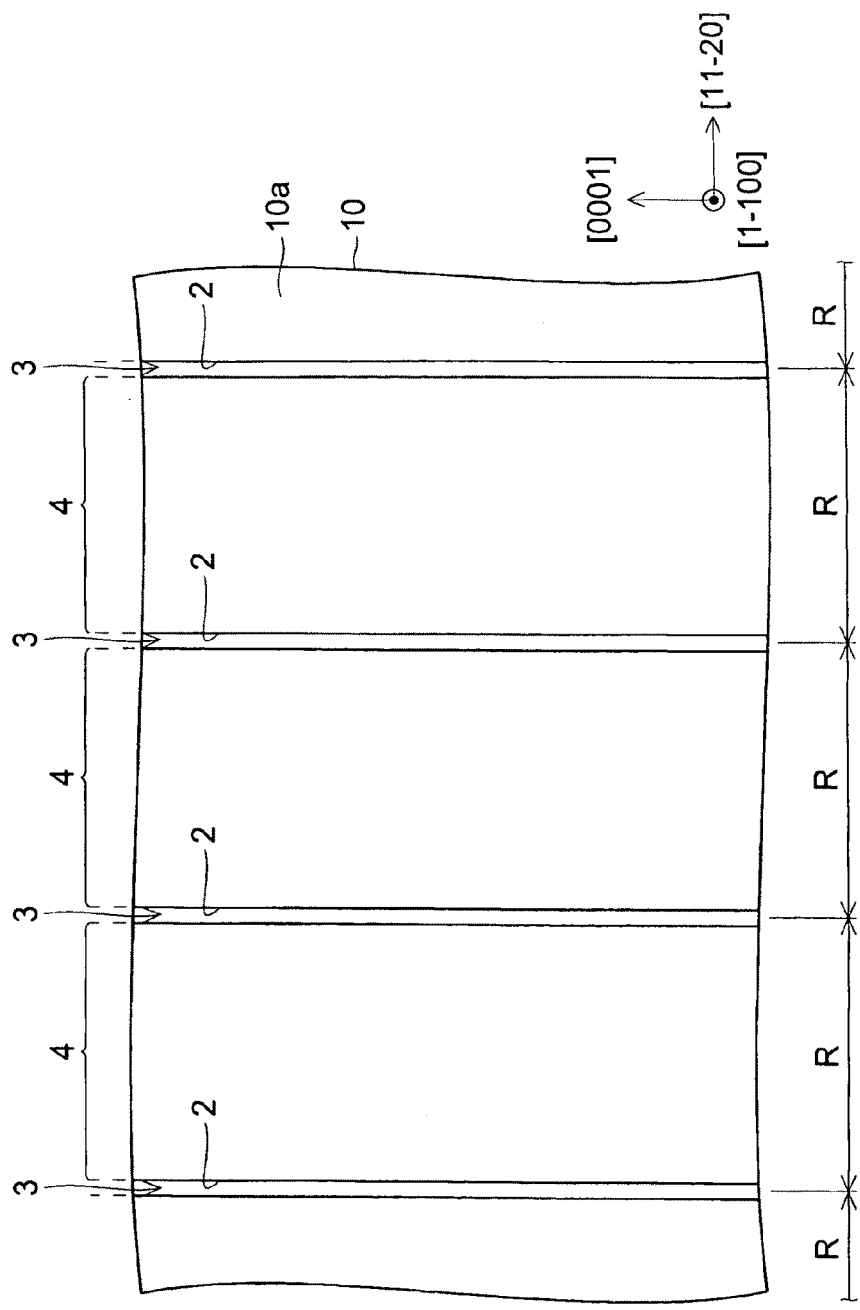
FIG. 4 is a plan view of a substrate used in a nitride semiconductor wafer according to Embodiment 1 of the invention.

In Embodiment 1, as shown in FIGS. 1 and 4, the above-described n-type GaN substrate 10 has a plurality of depressed portions 2 formed by being carved from the principal growth plane 10a in the thickness direction. As seen in a plan view, the depressed portions 2 are formed to extend in the direction parallel to the c-axis [0001] direction, and are arranged at equal intervals, with a period R (see FIG. 4) of about 150 μm to about 600 μm (for example, about 400 μm), in the a-axis [11-20] direction, which is perpendicular to the c-axis [0001] direction. That is, the depressed portions 2 are formed in the shape of stripes on the principal growth plane 10a of the n-type GaN substrate 10. Moreover, in the above-described n-type GaN substrate 10, the regions where the depressed portions 2 are formed (the regions that are carved) are carved regions 3. On the other hand, the regions on the principal growth plane 10a where the depressed portions 2 are not formed (the regions that are not carved) are uncarved regions 4.

Figure 5:
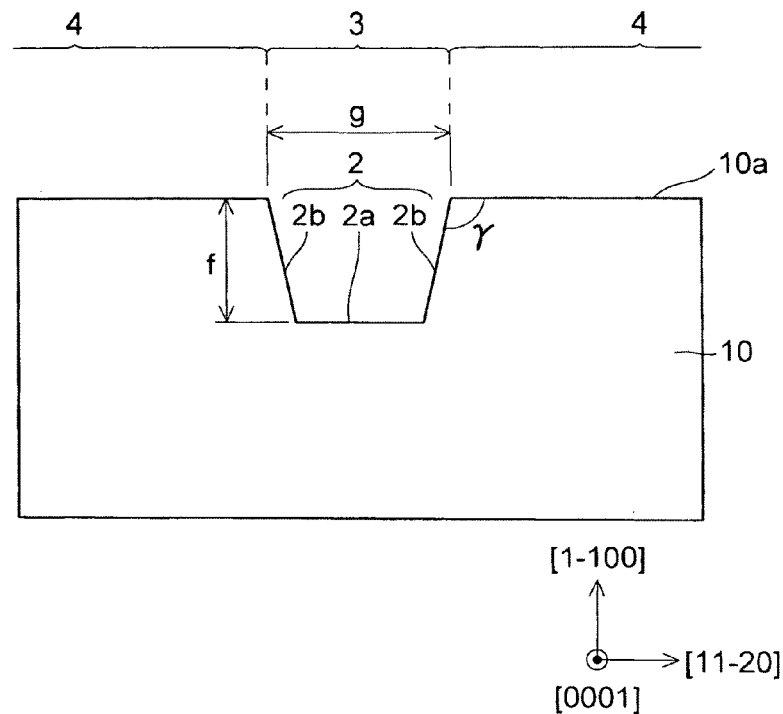
FIG. 5 is an enlarged sectional view of part of a substrate used in a nitride semiconductor wafer according to Embodiment 1 of the invention.

As shown in FIG. 5, the depressed portions 2 each include a floor surface portion 2a and a pair of side surface portions 2b. The side surface portions 2b are inclined at a predetermined inclination angle γ (see FIG. 5) larger than 90 degrees. Thus, the side surface portions 2b of the depressed portion 2 are inclined surfaces. Accordingly, the depressed portion 2 is formed such that its opening width is increasingly large upward. The depressed portion 2 has an opening width g (width at the open end) of about 5 μm in the [11-20] direction, and has a depth f of about 5 μm in the thickness direction of the n-type GaN substrate 10.

Figure 6:
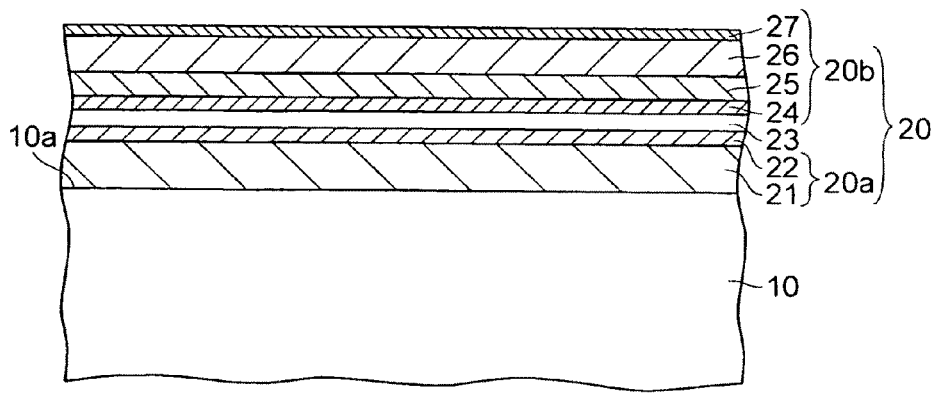
FIG. 6 is a sectional view illustrating the structure of a semiconductor layer in a nitride semiconductor wafer according to Embodiment 1 of the invention.

As shown in FIG. 1, the nitride semiconductor wafer 50 according to Embodiment 1 has a structure in which a nitride semiconductor layer 20, which includes an n-type nitride semiconductor layer 20a, an active layer 23, and a p-type nitride semiconductor layer 20b, is formed on the principal growth plane 10a of the above-described n-type GaN substrate 10. The n-type nitride semiconductor layer 20a includes an n-type clad layer and an n-type guide layer, and the p-type nitride semiconductor layer 20b includes a carrier block layer, a p-type clad layer, a p-type guide layer, and a p-type contact layer. By an epitaxial growth process such as an MOCVD (metal organic chemical vapor deposition) process, individual nitride semiconductor layers are stacked on the principal growth plane 10a of the n-type GaN substrate 10, in the order the n-type nitride semiconductor layer 20a, the active layer 23, and the p-type nitride semiconductor layer 20b. Specifically, as shown in FIG. 6, on the principal growth plane 10a of the n-type GaN substrate 10, the following layers are successively formed: an n-type clad layer 21 of n-type $Al_{0.06}Ga_{0.94}N$ (with a thickness of about 2.2 μm); an n-type guide clad layer 22 of n-type GaN (with a thickness of about 0.1 μm); an active layer 23; a carrier block layer 24 of p-type $Al_{0.15}Ga_{0.85}N$ (with a thickness of about 20 nm); a p-type guide layer 25 of p-type GaN (with a thickness of about 0.05 μm); a p-type clad layer 26 of p-type $Al_{0.05}Ga_{0.95}N$ (with a thickness of about 0.5 μm); and a p-type contact layer 27 of p-type GaN (with a thickness of about 0.1 μm). The n-type GaN substrate 10 and the n-type nitride semiconductor layer 20a are doped with, for example, Si as an n-type impurity, and the p-type nitride semiconductor layer 20b is doped with, for example, Mg as a p-type impurity.

Here, a high Al content in those layers in the nitride semiconductor layer 20 which contain Al, Ga, and N results in a large difference in lattice constant between those layers and the n-type GaN substrate 10, and this makes a crack likely to develop. In particular, the n-type clad layer 21 is given a high Al composition ratio for satisfactory light confinement, and thus the difference in lattice constant is larger between it and the n-type GaN substrate 10; in addition the n-type clad layer 21 has a thickness as large as about 2.2 μm. Thus, a crack is extremely likely to develop in the n-type clad layer 21.

On the other hand, in the nitride semiconductor wafer 50 according to Embodiment 1, since the principal growth plane 10a of the n-type GaN substrate 10 is a plane having an off-angle in the a-axis direction relative to the m plane, it is difficult to fill the inside of the depressed portion 2 with the nitride semiconductor layer 20. As a result, a concavity 35 is formed on the surface of the nitride semiconductor layer 20 (on the surface of each individual layer constituting the nitride semiconductor layer 20) over the depressed portion 2 (carved region 3). The concavity 35 serves to alleviate strain in the nitride semiconductor layer 20 such as results from lattice mismatch with the n-type GaN substrate 10.

Figure 7:
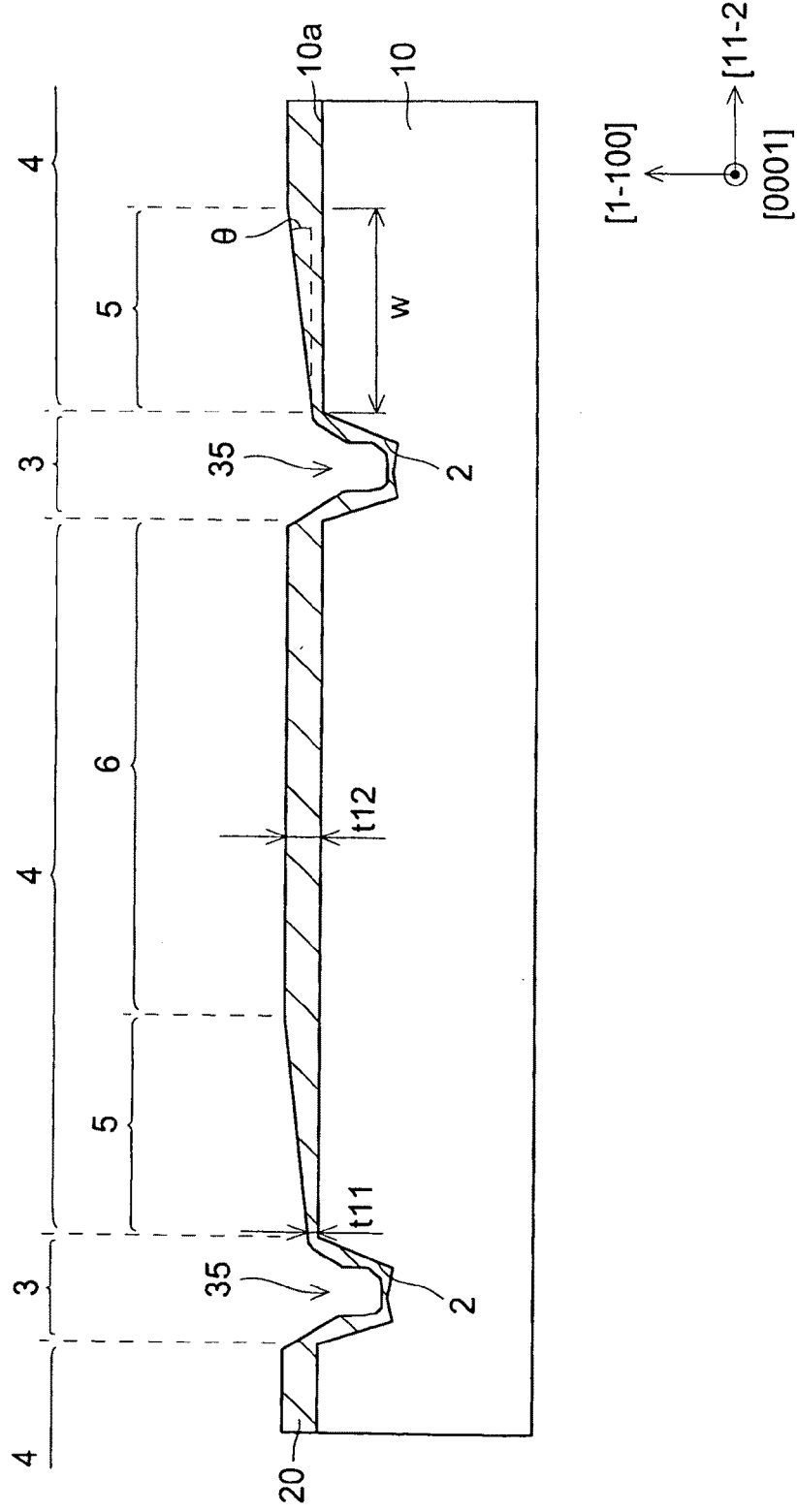
FIG. 7 is a sectional view illustrating the structure of a nitride semiconductor wafer according to Embodiment 1 of the invention.
Figure 8:
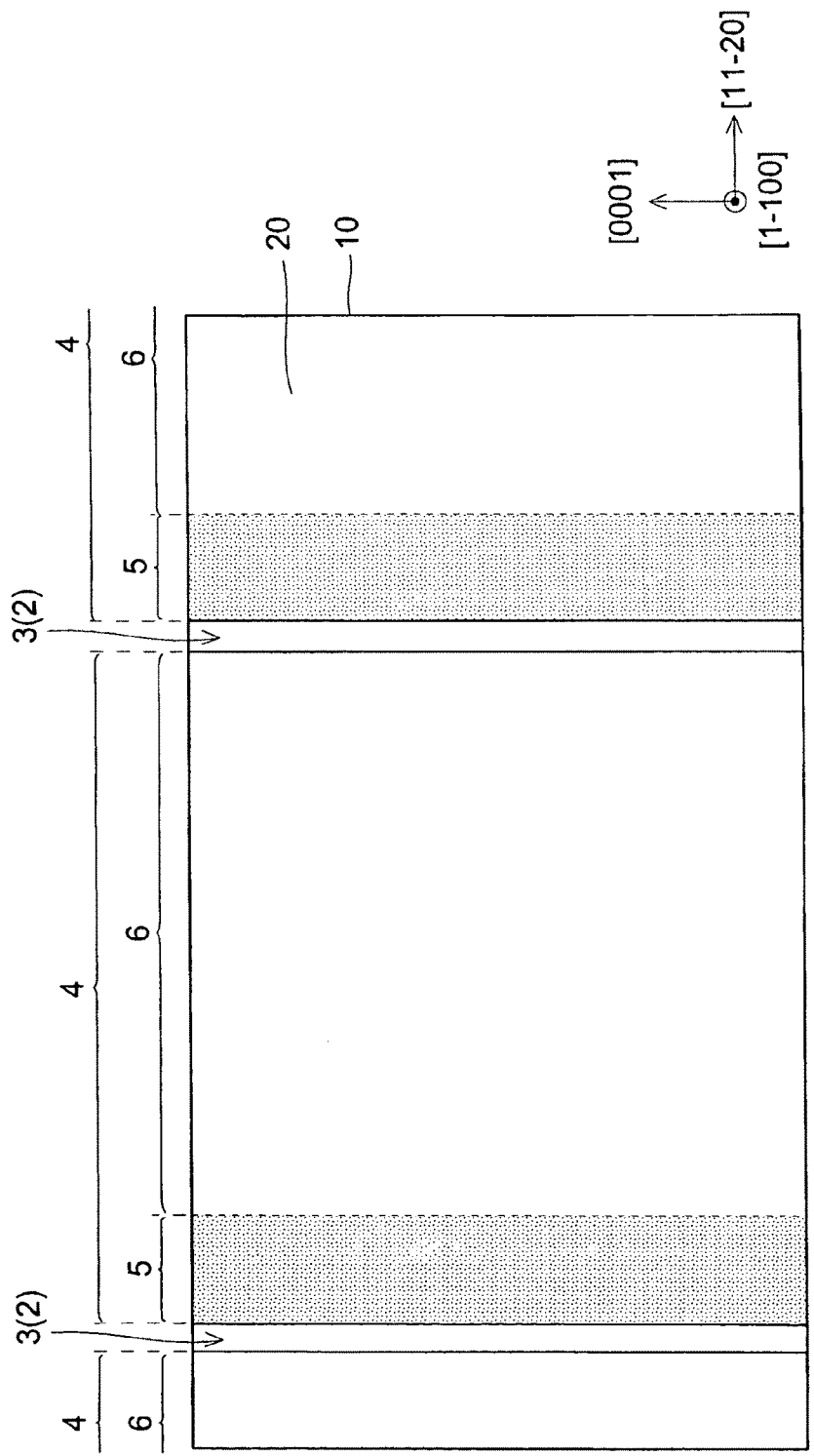
FIG. 8 is a plan view illustrating the structure of a nitride semiconductor wafer according to Embodiment 1 of the invention.

Moreover, in Embodiment 1, as shown in FIGS. 1 and 7, as a result of the nitride semiconductor layer 20 being formed on the principal growth plane 10a of the above-described n-type GaN substrate 10, in the nitride semiconductor layer 20 over the uncarved region 4, a gradient thickness region 5 is formed whose thickness decreases in a gradient fashion (gradually) toward the depressed portion 2 (carved region 3). As shown in FIGS. 7 and 8, the gradient thickness region 5 is formed in a region closely on one (for example, right) side of the depressed portion 2 (carved region 3), substantially in the shape of a band extending in the direction parallel to the depressed portion 2 (carved region 3). The gradient thickness region 5 too serves to alleviate strain in the nitride semiconductor layer 20 such as results from lattice mismatch with the n-type GaN substrate 10.

Thus, owing to the double strain alleviating effect by the concavity 35 formed on the surface of the nitride semiconductor layer 20 and by the gradient thickness region 5 formed in the nitride semiconductor layer 20 over the uncarved region 4, the nitride semiconductor wafer 50 according to Embodiment 1 offers a very powerful effect of suppressing cracks. In addition, the use of the n-type GaN substrate 10 having as the principal growth plane 10a a plane having an off-angle in the a-axis direction relative to the m plane gives the nitride semiconductor layer 20 formed on the principal growth plane 10a good crystallinity. This makes a crack unlikely to develop in the nitride semiconductor layer 20. Thus, development of cracks is suppressed even in the n-type clad layer 21, in which a crack is extremely likely to develop. Needless to say, development of cracks is suppressed in the other individual nitride semiconductor layers than the n-type clad layer 21 as well.

In a case where the n-type GaN substrate 10 is used that has as the principal growth plane 10a a plane having an off-angle in the a-axis direction relative to the m plane and that has the depressed portion 2 (carved region 3) formed on it, the gradient thickness region 5 is formed in a region on one (for example, right) side of the depressed portion 2 (carved region 3) (in a region close to the depressed portion 2). The reason is considered to be as follows: due to the principal growth plane 10a of the n-type GaN substrate 10 having an off-angle in the a-axis direction relative to the m plane, the direction of the flow of source material atoms changes so as to be aligned with the a axis, and moreover the flow of source material atoms is split by the depressed portion 2 (carved region 3), with the result that the supply of source material atoms is reduced in a region in the uncarved regions 4 closely on one side of the depressed portion 2 (carved region 3). Whether the gradient thickness region 5 is formed on one (for example, right) side of the depressed portion 2 (carved region 3) or on the other (for example, left) side of the depressed portion 2 (carved region 3) depends on whether the off-angle in the a-axis direction is positive (+) or negative (−). This is considered to be because the direction of the flow of source material atoms changes according to whether the off-angle in the a-axis direction is positive (+) or negative (−). Whether the off-angle in the a-axis direction is positive (+) or negative (−) makes no difference from a crystallographic point of view, and this permits the off-angle in the a-axis direction to be discussed in terms of its absolute value. Incidentally, in a case where a GaN substrate having the c plane as the principal growth plane is used, even when a depressed portion (carved region) like that described above is formed, no gradient thickness region as described above is formed. Also, even with a GaN substrate having the m plane as the principal growth plane, if it has no off-angle in the a-axis direction, even when a depressed portion (carved region) like that described above is formed, no gradient thickness region as described above is formed.

As shown in FIG. 7, the gradient thickness region 5 in the nitride semiconductor layer 20 is thinnest at its part closest to the depressed portion 2 (carved region 3) and its thickness increases gradually (in a gradient fashion) away from the depressed portion 2 (carved region 3). In a part of the gradient thickness region 5 close to the depressed portion 2 (carved region 3), each layer involved, whether it is the n-type nitride semiconductor layer 20*a* (see FIG. 1) or the p-type nitride semiconductor layer 20*b* (see FIG. 1), is formed thinner. The thinnest part of the gradient thickness region 5 has a thickness t11 about one-half to two-thirds of the thickness t12 of the region (the emission portion formation region 6 described later) of the nitride semiconductor layer 20 over the uncarved region 4 other than the gradient thickness region 5.

The width w of the gradient thickness region 5 (its width in the [11-20] direction) and the thickness gradient angle θ of the gradient thickness region 5 (the angle of the surface of the gradient thickness region 5 to the principal growth plane 10*a* of the n-type GaN substrate 10) are controlled by the off-angle in the a-axis direction. Specifically, the larger the off-angle in the a-axis direction, the smaller the width w of the gradient thickness region 5, and the larger the thickness gradient angle θ. Accordingly, in Embodiment 1, through adjustment of the off-angle in the a-axis direction, the width w of the gradient thickness region 5 is set at a predetermined width, and the thickness gradient angle θ is set at a predetermined angle. Too small an off-angle in the a-axis direction results in too large a width w of the gradient thickness region 5. On the other hand, the larger the thickness gradient angle θ, the more the thickness of the gradient thickness region 5 varies. Thus, for alleviation of stress in the nitride semiconductor layer 20, the larger the thickness gradient angle θ, the more preferable. Accordingly, with consideration given to the conditions for forming the gradient thickness region 5, it is preferable that the absolute value of the off-angle in the a-axis direction be 0.5 degrees or larger. In a case where the period R (see FIG. 4) of the depressed portions 2 is, for example, 400 μm, it is more preferable that, through adjustment of the off-angle in the a-axis direction, the width w of the gradient thickness region 5 be set to be 1 μm or more but 150 μm or less. Setting the width w of the gradient thickness region 5 to be 1 μm or more makes it possible to suppress the inconvenience of the effect of suppressing cracks being diminished due to the width w of the gradient thickness region 5 being less than 1 μm.

Since the gradient thickness region 5 is a region whose thickness varies, forming an emission portion (the ridge portion described later) there will make it difficult to suppress variations in characteristics. For this reason, the gradient thickness region 5 can be said to be a region unsuitable for formation of an emission portion (ridge portion).

On the other hand, the nitride semiconductor layer 20 over the uncarved region 4 has an emission portion formation region 6 where there is far less variation in thickness than in the gradient thickness region 5 and which is thus suitable for formation of an emission portion (ridge portion). That is, the nitride semiconductor layer 20 formed on the principal growth plane 10*a* of the n-type GaN substrate 10 includes, over the uncarved region 4, the gradient thickness region 5, which is unsuitable for formation of an emission portion (ridge portion), and the emission portion formation region 6, which is very uniformly thick and is suitable for formation of an emission portion (ridge portion). Incidentally, the effect of suppressing bright-spotted emission is weaker in the gradient thickness region 5 than in the emission portion formation region 6.

In Embodiment 1, the emission portion formation region 6 in the nitride semiconductor layer 20 has very good surface morphology. In the emission portion formation region 6, although there is very little variation in thickness overall, when a comparison is made between the variation in thickness in the c-axis [0001] direction and the variation in thickness in the a-axis [11-20] direction, the former is smaller than the latter.

Figure 9:
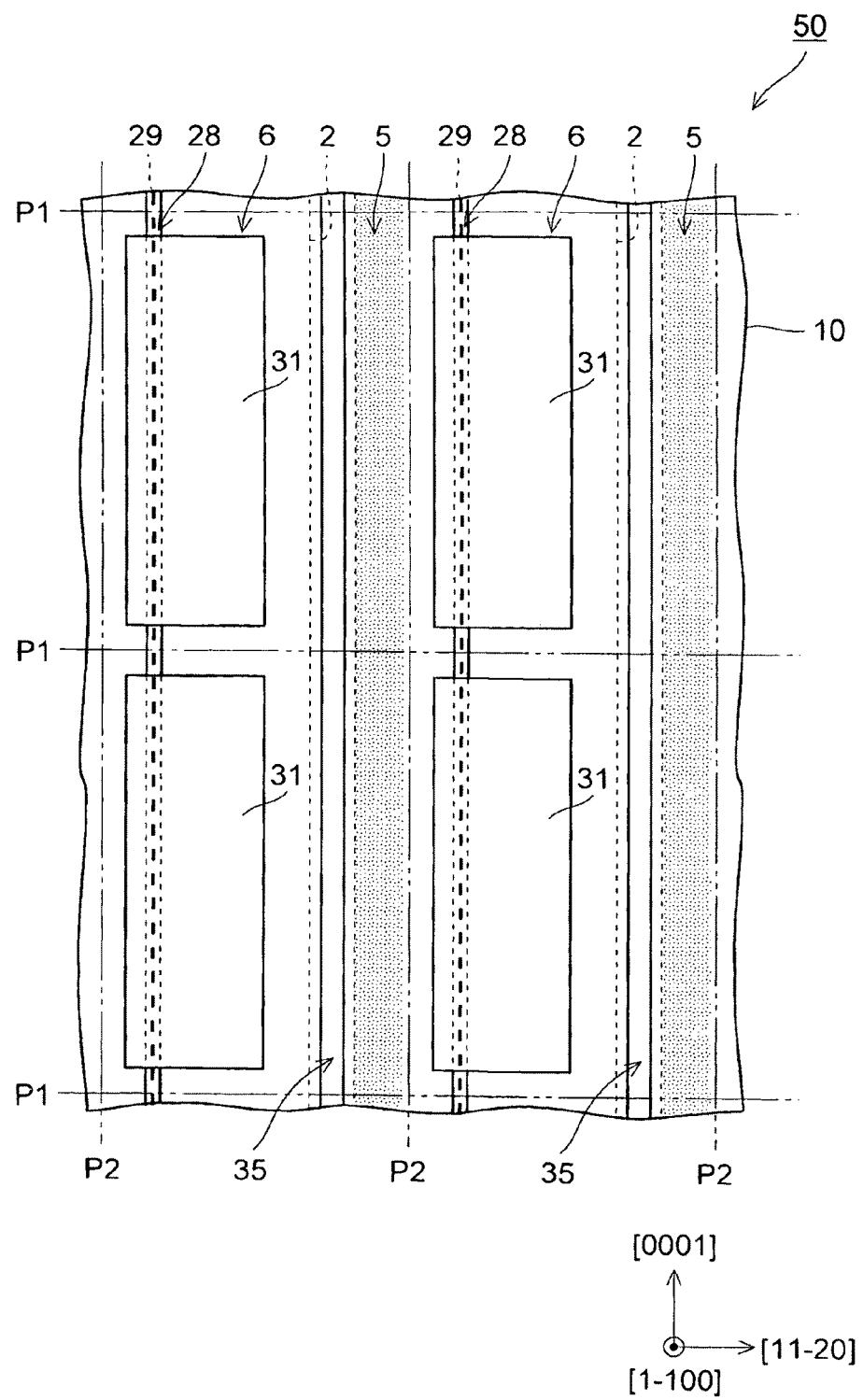
FIG. 9 is a plan view schematically showing part of a nitride semiconductor wafer according to Embodiment 1 of the invention.

As shown in FIG. 1, in a predetermined region in the emission portion formation region 6 in the nitride semiconductor layer 20, a ridge portion 28 is formed that is an elevated portion serving as a current passage portion. As shown in FIG. 9, as seen in a plan view, such ridge portions 28 are formed to extend in the c-axis [0001] direction, in which there is less variation in thickness, and are arranged with a period of about 150 μm to about 600 μm (for example, about 400 μm) in the a-axis [11-20] direction. Thus, a plurality of ridge portions 28 are formed in the shape of stripes. With the ridge portions 28 so formed, in the nitride semiconductor layer 20, optical waveguide regions 29 (see FIGS. 1 and 9) serving as emission portions are formed in the shape of stripes. As shown in FIG. 1, the ridge portion 28 is formed in the emission portion formation region 6, away from the depressed portion 2 by a predetermined distance or more (for example, 5 μm or more). On the top face of the nitride semiconductor layer 20, and on both side faces of the ridge portion 28, an insulating layer 30 for current constriction is formed.

On the nitride semiconductor layer 20, a p-side electrode 31 for supplying electric current to the optical waveguide region 29 is formed. On the other hand, on the back face of the n-type GaN substrate 10, an n-side electrode 32 is formed.

As shown in FIG. 9, on the nitride semiconductor wafer 50, planned splitting lines P1 and P2 along which to split it into individual pieces of nitride semiconductor laser chips are set. As seen on a plan view, the planned splitting lines P1 are set to extend in the a-axis [11-20] direction; as seen on a plan view, the planned splitting lines P2 are set to extend in the c-axis [0001] direction. The planned splitting lines P2 are so set that each nitride semiconductor laser chip after the splitting includes one depressed portion 2 and at least part of a gradient thickness region 5.

The nitride semiconductor wafer 50 according to Embodiment 1 structured as described above is split along the planned splitting lines P1 and P2 into individual pieces of nitride semiconductor laser chips.

Figure 10:
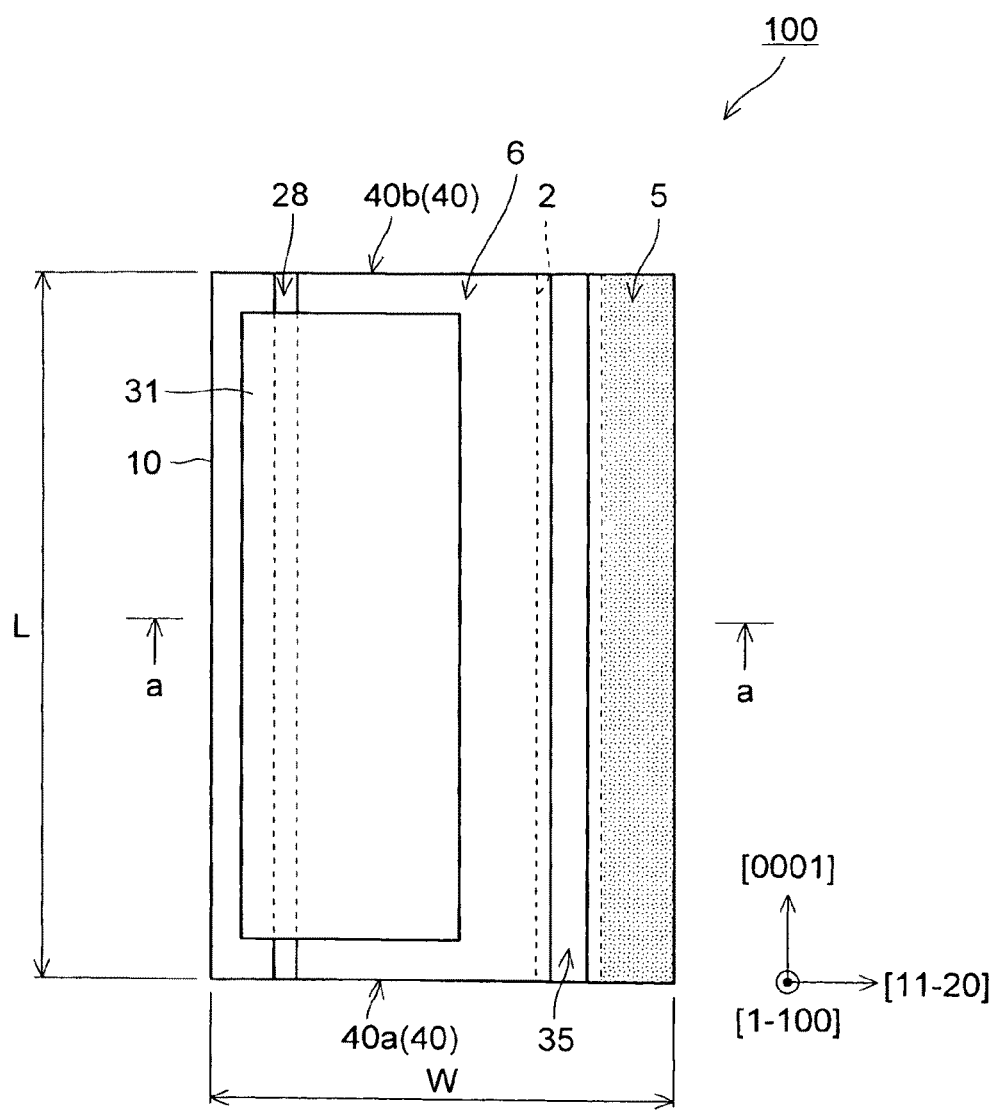
FIG. 10 is a plan view of a nitride semiconductor laser chip according to Embodiment 1 of the invention.
Figure 11:
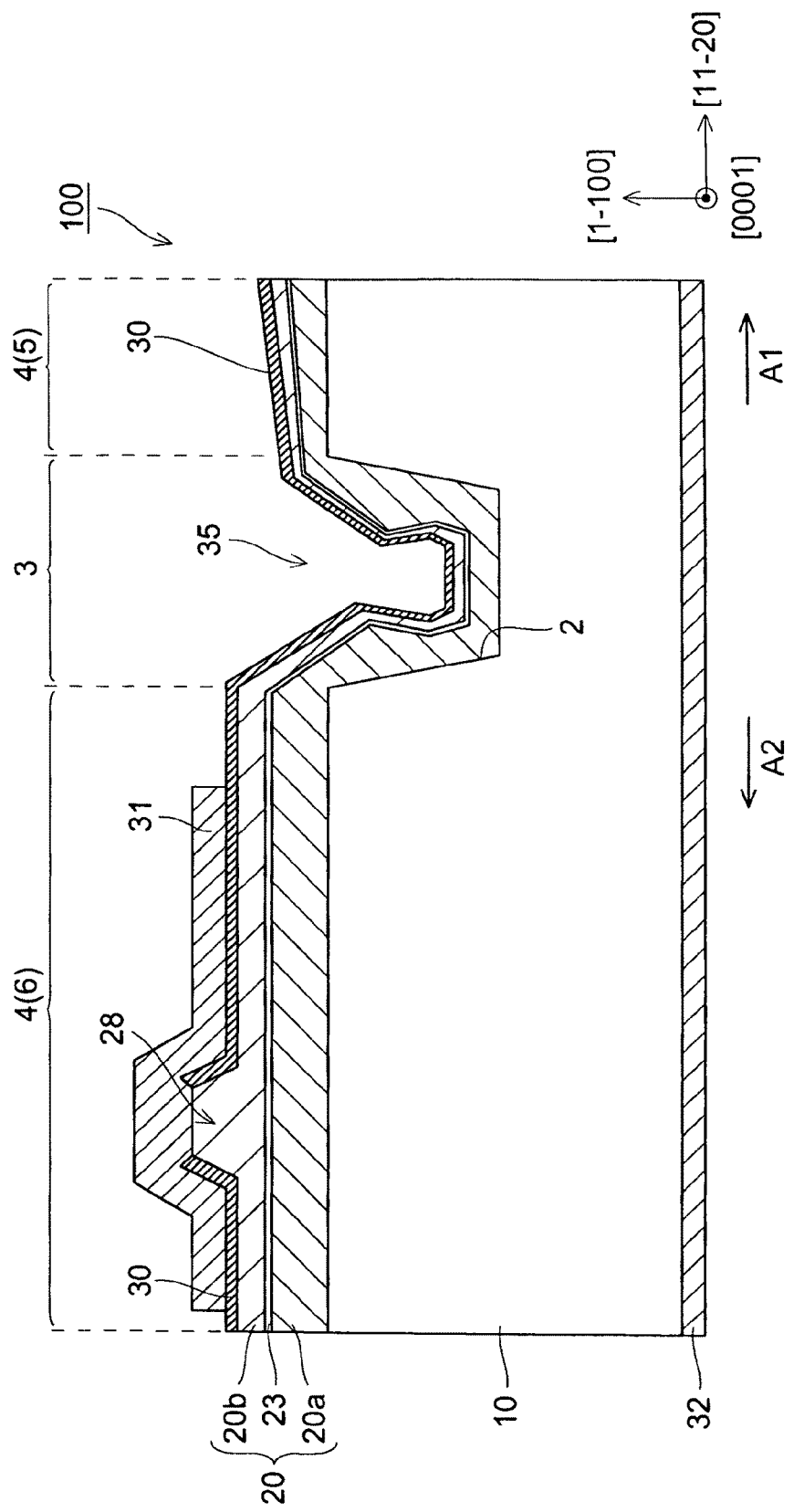
FIG. 11 is a sectional view schematically showing a nitride semiconductor laser chip according to Embodiment 1 of the invention (a diagram corresponding to a section along line a-a in FIG. 10)
Figure 12:
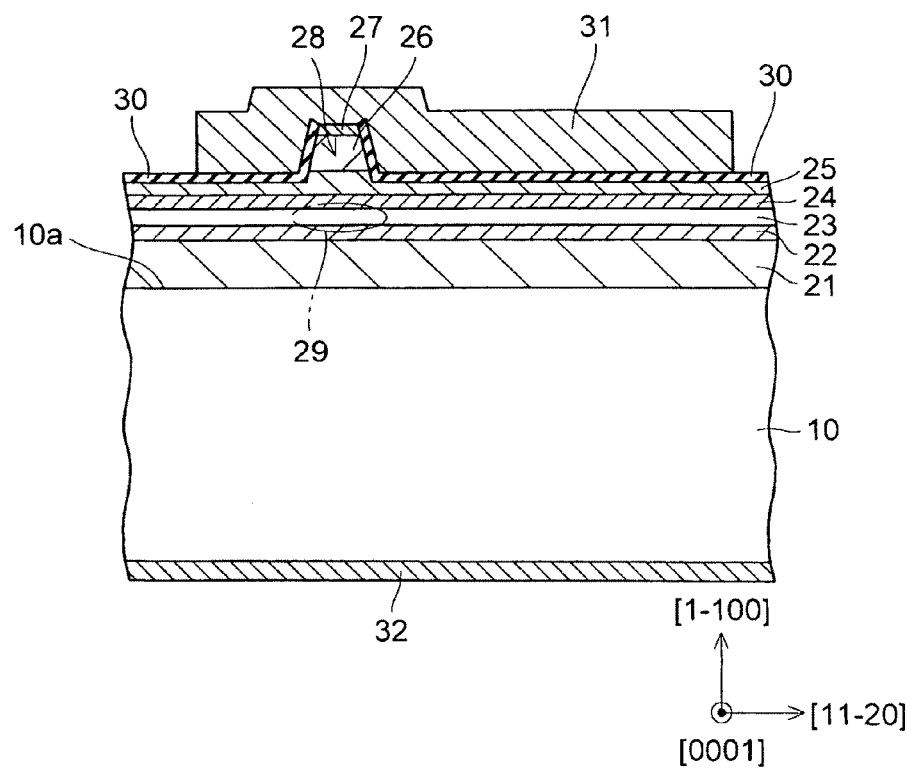
FIG. 12 is a sectional view showing part of a nitride semiconductor laser chip according to Embodiment 1 of the invention.
Figure 13:
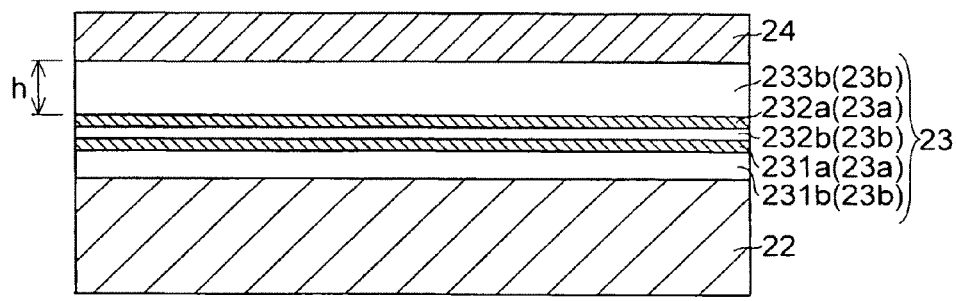
FIG. 13 is a sectional view illustrating the structure of an active layer in a nitride semiconductor laser chip according to Embodiment 1 of the invention.

FIG. 10 is a plan view of a nitride semiconductor laser chip according to Embodiment 1 of the invention, and FIG. 11 is a sectional view schematically showing a nitride semiconductor laser chip according to Embodiment 1 of the invention. FIG. 12 is a sectional view showing part of a nitride semiconductor laser chip according to Embodiment 1 of the invention, and FIG. 13 is a sectional view illustrating the structure of an active layer in a nitride semiconductor laser chip according to Embodiment 1 of the invention. Next, with reference to FIGS. 10 to 13, a description will be given of a nitride semiconductor laser chip 100 according to Embodiment 1 of the invention. A nitride semiconductor laser chip 100 according to Embodiment 1 can be obtained from the nitride semiconductor wafer 50 according to Embodiment 1 described above; therefore, the following description deals with, as an example, a nitride semiconductor laser chip 100 obtained from the nitride semiconductor wafer 50 described above.

As shown in FIG. 10, the nitride semiconductor laser chip 100 according to Embodiment 1 has a pair of resonator (cavity) faces 40, which include a light emission face 40a from which laser light is emitted and a light reflection face 40b opposite from the light emission face 40a. The nitride semiconductor laser chip 100 has a length L (chip length L (resonator length L)) of about 300 µm to about 1800 µm (for example, about 600 µm) in the direction (the c-axis [0001] direction) perpendicular to the resonator faces 40, and has a width W (chip width W) of about 150 µm to about 600 µm (for example, about 400 µm) in the direction (the a-axis [11-20] direction) along the resonator faces 40.

As shown in FIG. 11, the nitride semiconductor laser chip 100 according to Embodiment 1 is provided with an n-type GaN substrate 10 having as the principal growth plane 10a a plane having an off-angle in the a-axis direction relative to the m plane, and is formed by stacking, on the principal growth plane 10a of this n-type GaN substrate 10, a nitride semiconductor layer 20 including an n-type nitride semiconductor layer 20a, an active layer 23, and a p-type nitride semiconductor layer 20b. Specifically, as shown in FIG. 12, in the nitride semiconductor laser chip 100, on the principal growth plane 10a of the n-type GaN substrate 10, an n-type clad layer 21 of n-type $Al_{0.06}Ga_{0.94}N$ with a thickness of about 2.2 µm is formed. On the n-type clad layer 21, an n-type guide layer 22 of n-type GaN with a thickness of about 0.1 µm is formed. On the n-type guide layer 22, an active layer 23 is formed.

As shown in FIG. 13, the active layer 23 has a quantum well (DQW, double quantum well) structure in which two well layers 23a of $In_{x1}Ga_{1-x1}N$ and three barrier layers 23b of $In_{x2}Ga_{1-x2}N$ (where x1>x2) are alternately stacked. Specifically, the active layer 23 is formed by successively stacking, in order from the n-type guide layer 22 side, a first barrier layer 231b, a first well layer 231a, a second barrier layer 232b, a second well layer 232a, and a third barrier layer 233b. The two well layers 23a (the first and second well layers 231a and 232a) are each formed to have a thickness of about 3 nm to about 4 nm. The first barrier layer 231b is formed to have a thickness of about 30 nm, the second barrier layer 232b is formed to have a thickness of about 16 nm, and the third barrier layer 233b is formed to have a thickness of about 60 nm. Thus, the three barrier layers 23b are formed in different thicknesses.

In Embodiment 1, the In composition ratio x1 in the well layers 23a (the active layer 23) is 0.15 or more but 0.45 or less (for example, from 0.2 to 0.28). On the other hand, for efficient light confinement, the barrier layers 23b are formed of InGaN, and the In composition ratio x2 there is, for example, from 0.04 to 0.05.

Typically, in a region where the In composition ratio is high ($x1 \geq 0.15$), a well layer is given a thickness of 3 nm or less. This is to reduce occurrence of misfit dislocations and the like that may result from lattice mismatch when the In composition ratio is high. However, in a case where the above-described n-type GaN substrate 10, in which the absolute value of the off-angle in the a-axis direction relative to the m plane is larger than 0.1 degrees, is used, even when the well layers 23a are given a thickness of 3 nm or more, occurrence of misfit dislocations and the like is suppressed. The reason is considered to be as follows. With the absolute value of the off-angle in the a-axis direction equal to or smaller than 0.1 degrees, when a well layer with a high In composition ratio is formed, the In composition varies greatly across the plane, increasing the In composition locally. This produces a local region where the In composition is high, and from there, dislocations occur. In contrast, with the absolute value of the off-angle in the a-axis direction larger than 0.1 degrees, the In composition is extremely even across the plane; thus, even when the well layers are thick, formation of a local region with a high In composition is less likely. This, it is considered, makes it possible to make the well layers thicker. For increased light confinement and the like, it is preferable that the well layers 23a be given a thickness of 3.2 nm or more. Giving the well layers 23a a thickness more than 8 nm, however, causes a large number of misfit dislocations to develop, and therefore it is preferable that the well layers 23a be given a thickness of 8 nm or less.

As shown in FIG. 12, on the active layer 23, a carrier block layer 24 of p-type $Al_yGa_{1-y}N$ with a thickness of 40 nm or less (for example, about 12 nm) is formed. The carrier block layer 24 is so formed that the Al composition ratio there is 0.08 or more but 0.35 or less (for example, about 0.15). On the carrier block layer 24, a p-type guide layer 25 of p-type GaN is formed, which has an elevated portion and, elsewhere than there, a flat portion. On the elevated portion of the p-type guide layer 25, a p-type clad layer 26 of p-type $Al_{0.06}Ga_{0.94}N$ with a thickness of about 0.5 µm is formed. On the p-type clad layer 26, a p-type contact layer 27 of p-type GaN with a thickness of about 0.1 µm is formed. The p-type contact layer 27, the p-type clad layer 26, and the elevated portion of the p-type guide layer 25 together constitute a stripe-shaped (elongate) ridge portion 28 with a width of about 1 µm to about 3 µm (for example, about 1.5 µm). As shown in FIG. 10, as seen in a plan view, the ridge portion 28 is formed to extend in the c-axis [0001] direction. The carrier block layer 24 is an example of a "p-type semiconductor layer containing Al" according to the present invention.

As shown in FIG. 13, for enhanced injection efficiency of carriers into the well layers 23a, the distance h between the carrier block layer 24 and the well layers 23a (the most carrier block layer 24—side one (232a) of the well layers 23a) is set at about 60 nm. It is preferable that the distance h between the carrier block layer 24 and the well layers 23a be set to be 80 nm or less, and more preferably 30 nm or less. In Embodiment 1, the distance h is equal to the thickness of the third barrier layer 233b.

Here, in the nitride semiconductor laser chip 100 according to Embodiment 1, as shown in FIG. 11, the depressed portion 2 is formed in a predetermined region on the n-type GaN substrate 10. As seen in a plan view, the depressed portion 2 is formed to extend in the direction (the c-axis [0001] direction) parallel to the ridge portion 28 (optical waveguide region 29 (see FIG. 12)). Moreover, the depressed portion 2 is arranged on one side-surface side of the nitride semiconductor laser chip 100. In a region over the uncarved region 4 away from the depressed portion 2 by a predetermined distance or more (for example, 5 µm or more), the ridge portion 28 is formed.

In Embodiment 1, as described above, the principal growth plane 10a of the n-type GaN substrate 10 is a plane having an off-angle in the a-axis direction relative to the m plane, and this makes it difficult to fill the inside of the depressed portion 2 with the nitride semiconductor layer 20. As a result, a concavity 35 is formed on the surface of the nitride semiconductor layer 20 (on the surface of each individual layer constituting the nitride semiconductor layer 20) over the depressed portion 2 (carved region 3). The concavity 35 serves to alleviate strain in the nitride semiconductor layer 20 such as results from lattice mismatch with the n-type GaN substrate 10.

Moreover, in Embodiment 1, as a result of the nitride semiconductor layer 20 being formed on the principal growth plane 10a of the n-type GaN substrate 10, in the nitride semiconductor layer 20 over the uncarved region 4, a gradient thickness region 5 and an emission portion formation region 6 are formed. The gradient thickness region 5 is formed on one side (A1 side) of the depressed portion 2 (carved region 3), and the emission portion formation region 6 is formed on the other side (A2 side) of the depressed portion 2 (carved region 3), that is, on the side thereof opposite from the gradient thickness region 5. The gradient thickness region 5 too serves to alleviate strain in the nitride semiconductor layer 20 such as results from lattice mismatch with the n-type GaN substrate 10.

Thus, owing to the double strain alleviating effect by the concavity 35 formed on the surface of the nitride semiconductor layer 20 and by the gradient thickness region 5 formed in the nitride semiconductor layer 20 over the uncarved region 4, the nitride semiconductor laser chip 100 according to Embodiment 1 offers a very powerful effect of suppressing cracks.

In addition, in Embodiment 1, the use of the n-type GaN substrate 10 having as the principal growth plane 10a a plane having an off-angle in the a-axis direction relative to the m plane gives the nitride semiconductor layer 20 formed on the principal growth plane 10a good crystallinity. Moreover, the use of the above-described n-type GaN substrate 10 gives the emission portion formation region 6 in the nitride semiconductor layer 20 very good surface morphology. This makes a crack unlikely to develop in the nitride semiconductor layer 20.

Accordingly, even when an AlGaN layer with a high Al composition, which greatly differs in lattice constant etc. from the n-type GaN substrate 10, is formed on the principal growth plane 10a, development of cracks is suppressed. Thus, development of cracks is suppressed in the nitride semiconductor layer 20 formed on the principal growth plane 10a of the n-type GaN substrate 10.

The ridge portion 28 is formed in a predetermined region in the emission portion formation region 6, which has good crystallinity and good surface morphology.

As shown in FIGS. 11 and 12, on each side of the ridge portion 28, an insulating layer 30 for current constriction is formed. Specifically, on top of the p-type guide layer 25, on the side faces of the p-type clad layer 26, and on the side faces of the p-type contact layer 27, an insulating layer 30 of $SiO_2$ with a thickness of about 0.1 µm to about 0.3 µm (for example, about 0.15 µm) is formed.

On the top faces of the insulating layer 30 and of the p-type contact layer 27, a p-side electrode 31 is formed so as to cover part of the p-type contact layer 27. The p-side electrode 31, in its part covering the p-type contact layer 27, makes direct contact with the p-type contact layer 27. The p-side electrode 31 has a multiple-layer structure having the following layers stacked successively in order from the insulating layer 30 (the p-type contact layer 27) side: a Pd layer (unillustrated) with a thickness of about 15 nm; a Pt layer (unillustrated) with a thickness of about 15 nm; and a Au layer (unillustrated) with a thickness of about 200 nm.

On the back face of the n-type GaN substrate 10, an n-side electrode 32 is formed, which has a multiple-layer structure having the following layers stacked successively in order from the n-type GaN substrate 10's back face side: a Hf layer (unillustrated) with a thickness of about 5 nm; an Al layer (unillustrated) with a thickness of about 150 nm; a Mo layer (unillustrated) with a thickness of about 36 nm; a Pt layer (unillustrated) with a thickness of about 18 nm; and a Au layer (unillustrated) with a thickness of about 200 nm.

In the nitride semiconductor laser chip 100, on the light emission face 40a (see FIG. 10), an emission-side coating (unillustrated) with a reflectance of, for example, 5% to 80% is formed. On the other hand, on the light reflection face 40b (see FIG. 10), a reflection-side coating (unillustrated) with a reflectance of, for example, 95% is formed. The reflectance of the emission-side coating is adjusted to be a desired value according to the laser output. The emission-side coating is composed of, in order from the semiconductor's emission facet side, for example, a film of aluminum oxynitride (oxide-nitride) or aluminum nitride $AlO_xN_{1-x}$ (where $0 \leq x \leq 1$) with a thickness of 30 nm, and a film of $Al_2O_3$ with a thickness of 215 nm. The reflection-side coating is composed of multiple-layered films of, for example, $SiO_2$, $TiO_2$, etc. Other than the materials just mentioned, films of dielectric materials such as SiN, $ZrO_2$, $Ta_2O_5$, $MgF_2$, etc. may be used.

The coating on the light emission face side may instead be composed of a film of $AlO_xN_{1-x}$ (where $0 \leq x \leq 1$) with a thickness of 12 nm, and a film of silicon nitride SiN with a thickness of 100 nm. By forming a film of aluminum oxynitride or aluminum nitride $AlO_xN_{1-x}$ (where $0 \leq x \leq 1$) on a cleaved facet (in this embodiment, the c plane), or an etched facet etched by vapor-phase etching or liquid-phase etching, of an m-plane nitride semiconductor substrate as described above, it is possible to greatly reduce the rate of non-radiative recombination at the interface between the semiconductor and the emission-side coating, and thereby to greatly improve the COD (catastrophic optical damage) level. More preferably, the film of aluminum oxynitride or aluminum nitride $AlO_xN_{1-x}$ (where $0 \leq x \leq 1$) has a crystal of the same hexagonal crystal system as the nitride semiconductor; further preferably, it is crystallized with its crystal axes aligned with those of the nitride semiconductor, because that further reduces the rate of non-radiative recombination and further improves the COD level. To increase the reflectance on the light emission face side, there may be formed, on the above-mentioned coating, stacked films having films of silicon oxide, aluminum oxide, titanium oxide, tantalum oxide, zirconium oxide, silicon oxide, etc. stacked together.

In Embodiment 1, as described above, a plane having an off-angle in the a-axis direction relative to the m plane is taken as the principal growth plane 10a of the n-type GaN substrate 10, and this makes it possible to suppress a bright-spotted EL emission pattern. That is, with that structure, it is possible to improve the EL emission pattern. This makes it possible to enhance the luminous efficacy of the nitride semiconductor laser chip 100 obtained by splitting the nitride semiconductor wafer 50. By enhancing luminous efficacy, it is possible to obtain a high-luminance nitride semiconductor laser chip 100. One reason that the above-described effect of suppressing bright-spotted emission is obtained is considered to be as follows: as a result of the principal growth plane 10a of the n-type GaN substrate 10 having an off-angle in the a-axis direction relative to the m plane, when the active layer 23 (the well layers 23a) is grown on the principal growth plane 10a, the direction of migration of In atoms changes so that, even under conditions with a high In composition ratio (with a large supply of In), agglomeration of In is suppressed. Another reason is considered to be that the growth mode of the p-type nitride semiconductor layer 20b formed on the active layer 23 also changes so as to enhance the activation rate of Mg as a p-type impurity and reduce the resistance of the p-type nitride semiconductor layer 20b. Reducing the resistance of the p-type nitride semiconductor layer 20b makes even injection of current easier, and thus makes the EL emission pattern even.

In a case where the principal growth plane 10a of the n-type GaN substrate 10 has an off-angle also in the c-axis direction relative to the m plane, making the off-angle in the a-axis direction larger than the off-angle in the c-axis direction helps effectively suppress a bright-spotted EL emission pattern. That is, with that structure, it is possible to suppress the inconvenience of the effect of suppressing bright-spotted emission being diminished due to too large an off-angle in the c-axis direction. Thus, it is possible to enhance luminous efficacy easily.

In Embodiment 1, by suppressing a bright-spotted EL emission pattern, since it is possible to make the EL emission pattern even, it is possible to reduce the driving voltage. Incidentally, by suppressing bright-spotted emission, since it is possible to obtain an even EL emission pattern, it is possible to increase gain in the formation of the nitride semiconductor laser chip.

In Embodiment 1, with the structure described above, since it is possible to suppress a bright-spotted EL emission pattern, it is possible to enhance luminous efficacy. This makes it possible to enhance chip characteristics and reliability. That is, it is possible to obtain a nitride semiconductor laser chip 100 with superb chip characteristics and high reliability.

In Embodiment 1, by taking as the principal growth plane 10a a plane having an off-angle in the a-axis direction relative to the m plane, it is possible to give the nitride semiconductor layer 20 formed on the principal growth plane 10a good crystallinity. This makes a crack unlikely to develop in the nitride semiconductor layer 20. Moreover, with that structure, it is possible to give the nitride semiconductor layer 20 very good surface morphology, and thus it is possible to obtain a nitride semiconductor layer 20 with a uniform thickness. Thus, it is possible to suppress the inconvenience of the nitride semiconductor layer having a locally thicker region due to the nitride semiconductor layer being not uniformly thick. Since a crack is likely to develop in such a thicker region, by suppressing formation of a locally thicker region in the nitride semiconductor layer 20, it is possible to make a crack more unlikely to develop.

In Embodiment 1, by forming the depressed portion 2 (carved region 3) on the n-type GaN substrate 10, it is possible to form the concavity 35 on the surface of the nitride semiconductor layer 20 (on the surface of each individual layer constituting the nitride semiconductor layer 20) over the depressed portion 2 (carved region 3). Thus, even in a case where there is a large difference in lattice constant, thermal expansion coefficient, etc. between the n-type GaN substrate 10 and the nitride semiconductor layer 20 and as a result the nitride semiconductor layer 20 is strained, the strain in the nitride semiconductor layer 20 formed over the uncarved region 4 can be alleviated with the concavity formed on the surface of the nitride semiconductor layer 20 over the depressed portion 2 (carved region 3). Thus, it is possible to effectively suppress development of cracks in the nitride semiconductor layer 20.

In Embodiment 1, the use of the n-type GaN substrate 10 having as the principal growth plane 10a a plane having an off-angle in the a-axis direction relative to the m plane makes it difficult to fill the depressed portion 2 (carved region 3) with the nitride semiconductor layer 20. Thus, it is possible to readily form the concavity 35 on the surface of the nitride semiconductor layer 20 over the depressed portion 2 (carved region 3). Thus, it is possible to suppress development of cracks easily.

As described above, in Embodiment 1, since it is possible to effectively suppress development of cracks, it is possible to increase the number of acceptable chips obtained from a single wafer. This makes it possible to increase yields. Suppressing development of cracks also helps enhance chip reliability and chip characteristics.

In Embodiment 1, in the nitride semiconductor layer 20 over the uncarved region 4, the gradient thickness region 5 is formed, whose thickness decreases in a gradient fashion (gradually) toward the depressed portion 2 (carved region 3), and thus strain in the nitride semiconductor layer 20 can be alleviated also with the gradient thickness region 5. Owing to the double strain alleviating effect by the concavity 35 formed on the surface of the nitride semiconductor layer 20 and by the gradient thickness region 5 formed in the nitride semiconductor layer 20 over the uncarved region 4, it is possible to obtain a very powerful effect of suppressing cracks. Thus, even in a case where, for satisfactory light confinement, an n-type clad layer 21 with a high Al composition ratio is formed, it can be formed easily without developing a crack. The reason that a powerful effect of suppressing cracks as described above is obtained is considered to be as follows: because the gradient thickness region 5 is thin in the first place, it contains little strain itself; in addition, since its thickness varies gradually (in a gradient fashion), the strain is alleviated progressively, resulting in a more powerful effect of alleviating strain.

In Embodiment 1, with the structure described above, it is possible to give the emission portion formation region 6 in the depressed portion 2 very good surface morphology, and thus it is possible to reduce variations in chip characteristics. This helps increase the number of chips having characteristics within the rated ranges, and this too helps increase yields. Moreover, enhancing surface morphology helps enhance chip characteristics and reliability.

In Embodiment 1, by forming the depressed portion 2 (carved region 3) such that, as seen in a plan view, it extends in the direction parallel to the c-axis [0001] direction, it is possible to form the gradient thickness region 5 easily, and thus it is possible to obtain a powerful effect of alleviating strain easily.

In Embodiment 1, by making the absolute value of the off-angle in the a-axis direction larger than 0.1 degrees, it is possible to suppress a bright-spotted EL emission pattern easily. By making the absolute value of the off-angle in the a-axis direction larger than 0.1 degrees, it is possible to suppress the inconvenience of surface morphology deteriorating due to the absolute value of the off-angle in the a-axis direction being 0.1 degrees or smaller. Thus, with that structure, it is possible, while obtaining good surface morphology, to suppress a bright-spotted EL emission pattern easily.

By making the absolute value of the off-angle in the a-axis direction in the n-type GaN substrate 10 equal to or larger than 0.5 degrees, it is possible to suppress the inconvenience of the gradient thickness region 5 being too large due to the absolute value of the off-angle in the a-axis direction being smaller than 0.5 degrees, and it is also possible to effectively suppress the inconvenience of a diminished effect of suppressing cracks (effect of alleviating strain) by the gradient thickness region 5.

By making the off-angle in the a-axis direction larger than 1 degree but equal to or smaller than 10 degrees, it is possible, while obtaining good surface morphology, to suppress a bright-spotted EL emission pattern more easily. Setting the off-angle in the a-axis direction in that range is more preferable because it is then possible to obtain a marked effect of reducing the driving voltage and in addition an effect of improving surface morphology. By making the off-angle in the a-axis direction equal to or smaller than 10 degrees, it is possible to suppress the inconvenience of surface morphology deteriorating due to the off-angle in the a-axis direction being larger than 10 degrees.

In a case where an off-angle is provided also in the c-axis direction, by making the off-angle in the c-axis direction larger than ±0.1 degrees, it is possible to suppress the inconvenience of the thickness of the nitride semiconductor layer 20 grown on the principal growth plane 10a varying due to the off-angle in the c-axis direction being smaller than ±0.1 degrees.

In a case where an n-type GaN substrate having the m plane as the principal growth plane is used, growing a nitride semiconductor layer on the principal growth plane results in a pyramid-shaped elevated portion developing on the surface of the nitride semiconductor layer. This leads to the inconvenience of the thickness of the nitride semiconductor layer varying in the pyramid-shaped elevated portion. On the other hand, by making the off-angle in the a-axis direction relative to the m plane larger than 1 degree but equal to or smaller than 10 degrees, even when a nitride semiconductor layer is grown on the principal growth plane 10a, it is possible to effectively suppress development of a pyramid-shaped elevated portion on the layer surface. Thus, it is possible to effectively suppress the above-mentioned inconvenience of the thickness of the nitride semiconductor layer varying.

In Embodiment 1, by use of the above-described n-type GaN substrate 10 having a principal growth plane 10a provided with an off-angle in the a-axis direction relative to the m plane, even in a case where the In composition ratio x1 in the well layers 23a is 0.15 or more, that is, even under conditions where a bright-spotted EL emission pattern is prominent, it is possible to effectively suppress a bright-spotted EL emission pattern. Thus, by making the In composition ratio x1 in the well layers 23a of the active layer 23 equal to or more than 0.15, it is possible to obtain a prominent effect of suppressing bright-spotted emission. On the other hand, by making the In composition ratio x1 in the well layers 23a equal to or less than 0.45, it is possible to effectively suppress the inconvenience of a large number of dislocations developing in the active layer 23 as a result of strain such as lattice mismatch due to the In composition ratio x1 in the well layers 23a being more than 0.45.

In Embodiment 1, by making the Al composition ratio y in the carrier block layer 24 equal to or more than 0.08 but equal to or less than 0.35, it is possible to form an energy barrier sufficiently high with respect to carriers (electrons), and thus it is possible to more effectively prevent the carriers injected into the active layer 23 from flowing into the p-type nitride semiconductor layer 20b. In this way, it is possible to suppress a bright-spotted EL emission pattern effectively. Making the Al composition ratio y in the carrier block layer 24 equal to or less than 0.35 helps suppress an increase in the resistance of the carrier block layer 24 due to the Al composition ratio y being too high. Incidentally, in a region with a high In composition ratio x1 (x1≧0.15) in the well layers 23a, an Al composition ratio y of 0.08 or more in the carrier block layer 24 formed on the active layer 23 makes it extremely difficult to grow the carrier block layer 24 satisfactorily. This is because, as the In concentration in the well layers 23 increases, the flatness of the surface of the active layer 23 deteriorates, and this makes it difficult to form a film with a high Al composition ratio y with good crystallinity. However, by use of the n-type GaN substrate 10 having as the principal growth plane 10a a plane having an off-angle in the a-axis direction relative to the m plane, even in a case where the In composition ratio x1 in the active layer 23 (the well layers 23a) is 0.15 or more but 0.45 or less, it is possible to form a carrier block layer 24 with an Al composition ratio y of 0.08 or more but 0.35 or less with good crystallinity. This makes it possible to suppress a bright-spotted EL emission pattern effectively and make the EL emission pattern even.

In Embodiment 1, giving the active layer 23 of the nitride semiconductor laser chip 100a DQW structure makes it possible to reduce the driving voltage easily. This too helps enhance chip characteristics and reliability. Even when the active layer 23 is given a DQW structure, it is possible to suppress a bright-spotted EL emission pattern. In a case where the above-described n-type GaN substrate 10 having a principal growth plane 10a provided with an off-angle in the a-axis direction relative to the m plane is used, giving the active layer 23 formed on the n-type GaN substrate 10a DQW structure, as compared with giving the active layer 23a multiple quantum well (MQW) structure, helps enhance luminous efficacy. This makes it possible to obtain a high-luminance nitride semiconductor laser chip easily.

In Embodiment 1, by forming the barrier layer 23b formed under the well layers 23a (on the n-type GaN substrate 10 side) out of InGaN, and making the In composition ratio x2 there equal to or more than 0.01, it is possible to greatly enhance the efficiency of absorption of In into the well layers 23a. This makes it possible to maintain a high In composition ratio even when the gas flow amount of In is reduced, and thus helps improve absorption efficiency. In this way, it is possible to achieve wavelength lengthening effectively. It is also possible to reduce the consumption of the material gas (TMIn, i.e., trimethylindium), which is advantageous in terms of cost.

Setting the distance h between the carrier block layer 24 and the well layers 23a to be 200 or more nm permits current to spread when carriers diffuse from the carrier block layer 24 to the active layer 23, and thus helps slightly suppress bright-spotted emission. On the other hand, by the use of the above-described n-type GaN substrate 10 having a principal growth plane 10a provided with an off-angle relative to the m plane, even when the distance h between the carrier block layer 24 and the well layers 23a is not set to be 200 nm or more, it is possible to suppress bright-spotted emission effectively. For example, even when the distance h between the carrier block layer 24 and the well layers 23a is set to be less than 120 nm, it is possible to suppress bright-spotted emission effectively. The smaller the distance h between the carrier block layer 24 and the well layers 23a, the more preferable, because that enhances the injection efficiency of carriers into the well layers 23a. Accordingly, by making the distance h between the carrier block layer 24 and the well layers 23a less than 120 nm, it is possible to enhance the injection efficiency of carriers into the well layers 23a.

FIGS. 14 to 31 are diagrams illustrating a method of manufacture of a nitride semiconductor laser chip according to Embodiment 1 of the invention. Next, with reference to FIGS. 1, 7 to 9, and 13 to 31, a method of manufacture of the nitride semiconductor laser chip 100 according to Embodiment 1 of the invention will be described.

Figure 14:
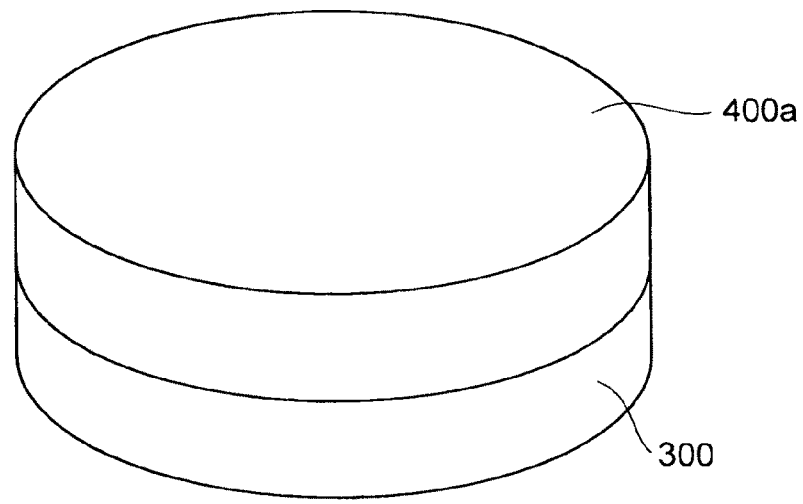
FIG. 14 is a perspective view illustrating a method of manufacture of a nitride semiconductor laser chip according to Embodiment 1 of the invention (a diagram illustrating a method of manufacture of a substrate)
Figure 15:
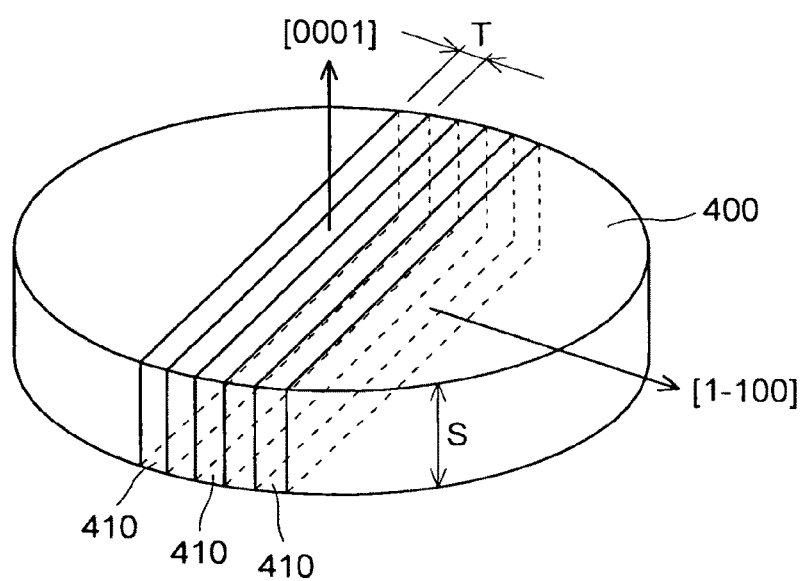
FIG. 15 is a perspective view illustrating a method of manufacture of a nitride semiconductor laser chip according to Embodiment 1 of the invention (a diagram illustrating a method of manufacture of a substrate)

First, an n-type GaN substrate 10 having as a principal growth plane 10a a plane having an off-angle relative to the m plane is prepared. This n-type GaN substrate 10 is fabricated by, for example, using as a seed substrate a substrate cut out of a GaN bulk crystal having the c plane (0001) as a principal plane and growing a GaN crystal on top of that seed substrate. Specifically, as shown in FIG. 14, a protective film (unillustrated) of $SiO_2$ is formed on part of a base substrate 300, and then on top of the base substrate 300, over the protective film, a GaN bulk crystal is grown by an epitaxial growth process such as an MOCVD (metal organic chemical vapor deposition) process. This causes growth to start in the part where the protective film is not formed, and over the protective film, the GaN crystal grows laterally. The parts of the GaN crystal grown laterally meet over the protective film and continue to grow, and thus a GaN crystal layer 400a is formed on top of the base substrate 300. The GaN crystal layer 400a is formed sufficiently thick so that it may be handled independently even after removal of the base substrate 300. Next, from the GaN crystal layer 400a thus formed, the base substrate 300 is removed, for example, by etching. This leaves, as shown in FIG. 15, a GaN bulk crystal 400 having the c plane (0001) as a principal plane. As the base substrate 300, it is possible to use, for example, a GaAs substrate, a sapphire substrate, a ZnO substrate, a SiC substrate, a GaN substrate, etc. The GaN bulk crystal 400 is given a thickness S of, for example, about 3 mm.

Next, both principal planes, that is, the (0001) and (000-1) planes, of the GaN bulk crystal 400 thus obtained are ground and polished so as to each have an average roughness Ra of 5 nm. The average roughness Ra here conforms to the arithmetic average roughness $R^a$ defined in JIS B 0601, and can be measured on an AFM (atomic force microscope).

Figure 16:
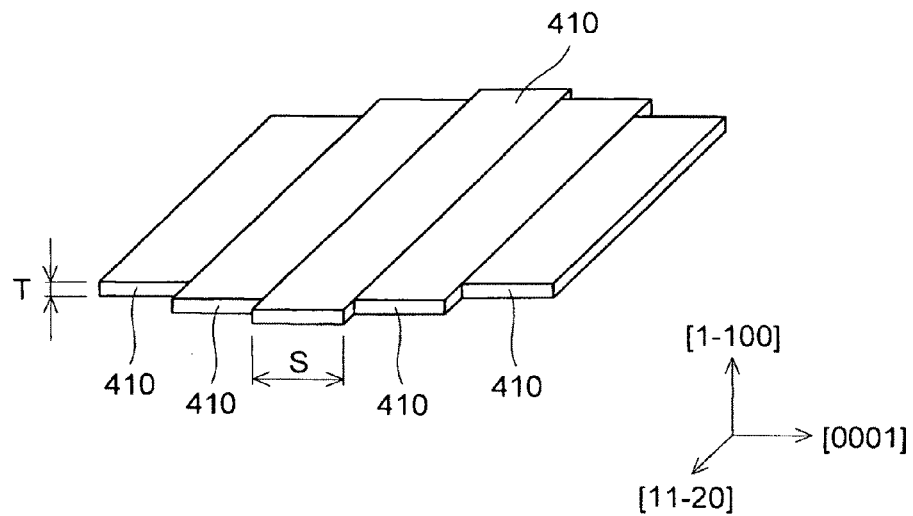
FIG. 16 is a perspective view illustrating a method of manufacture of a nitride semiconductor laser chip according to Embodiment 1 of the invention (a diagram illustrating a method of manufacture of a substrate)
Figure 17:
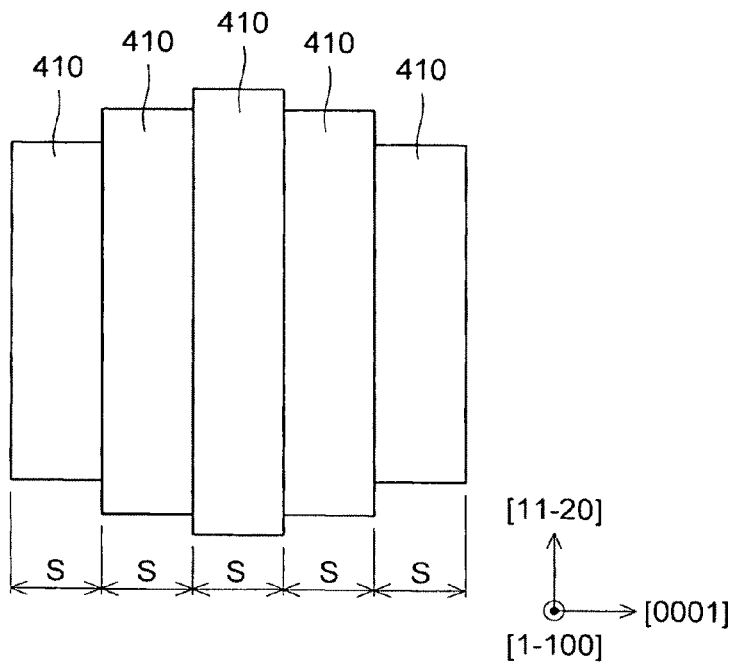
FIG. 17 is a plan view illustrating a method of manufacture of a nitride semiconductor laser chip according to Embodiment 1 of the invention (a diagram illustrating a method of manufacture of a substrate)

Next, the GaN bulk crystal 400 is sliced at a plurality of planes perpendicular to the [1-100] direction so that a plurality of GaN crystal substrates 410 having the m plane {1-100} as a principal plane are cut out each with a thickness T (for example, 1 mm) (and with a width S of 3 mm). Then, with each of the GaN crystal substrates 410 thus cut out, the four faces that have not yet ground or polished are ground and polished so as to have an average roughness Ra of 5 nm. Thereafter, as shown in FIGS. 16 and 17, the plurality of GaN crystal substrates 410 are arranged side by side in such a way that their respective principal planes are parallel to one another and that their respective [0001] directions are aligned with one another.

Figure 18:
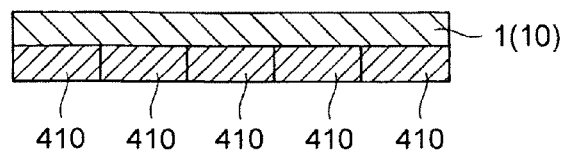
FIG. 18 is a sectional view illustrating a method of manufacture of a nitride semiconductor laser chip according to Embodiment 1 of the invention (a diagram illustrating a method of manufacture of a substrate)

Subsequently, as shown in FIG. 18, the plurality of GaN crystal substrates 410 thus arranged side by side are taken as a seed substrate, and on the m plane {1-100} of those GaN crystal substrates 410, a GaN crystal is grown by an epitaxial growth process such as an HVPE process. In this way, an n-type GaN substrate 1 having the m plane as a principal growth plane is obtained. Next, the principal plane of the n-type GaN substrate 1 thus obtained is polished by chemical and mechanical polishing so as to control the off-angles in the a- and c-axis directions independently, thereby to set the off-angles in the a- and c-axis directions relative to the m plane at desired off-angles. These off-angles can be measured by an X-ray diffraction method. In this way, an n-type GaN substrate 10 having as the principal growth plane a plane having an off-angle relative to the m plane is obtained.

In the above-described fabrication of the n-type GaN substrate 10, in a case where a substrate with a large off-angle is fabricated, when a plurality of GaN crystal substrates 410 are cut out of the GaN bulk crystal 400, they may be cut out at a predetermined cut-out angle relative to the [1-100] direction so that the principal plane of the GaN crystal substrates 410 has a desired off-angle relative to the m plane {1-100}. Doing so permits the principal plane of the GaN crystal substrates 410 to have a desired off-angle relative to the m plane {1-100}, and accordingly the principal plane (principal growth plane) of the n-type GaN substrate 1 (10) formed on that principal plane comes to have the desired off-angle relative to the m plane {1-100}.

Polishing the principal plane of the GaN crystal substrates 410 cut out of the GaN bulk crystal 400 (see FIG. 15) by chemical and mechanical polishing makes it possible to use the GaN crystal substrates 410 as the n-type GaN substrate 10. In that case, the width S of the GaN crystal substrates 410 may be 3 mm or more.

Here, in Embodiment 1, the off-angle in the a-axis direction in the above-described n-type GaN substrate 10 is adjusted to be larger than ±0.1 degrees. Moreover, to suppress deterioration of surface morphology, the off-angle in the a-axis direction is adjusted to be 10 degrees or smaller. In a case where an off-angle is provided also in the c-axis direction, it is preferable that the off-angle in the c-axis direction be adjusted to be larger than ±0.1 degrees. Moreover, it is preferable that the off-angle in the c-axis direction be adjusted to be smaller than the off-angle in the a-axis direction. In this case, the off-angle in the c-axis direction is smaller than ±10 degrees.

Figure 19:
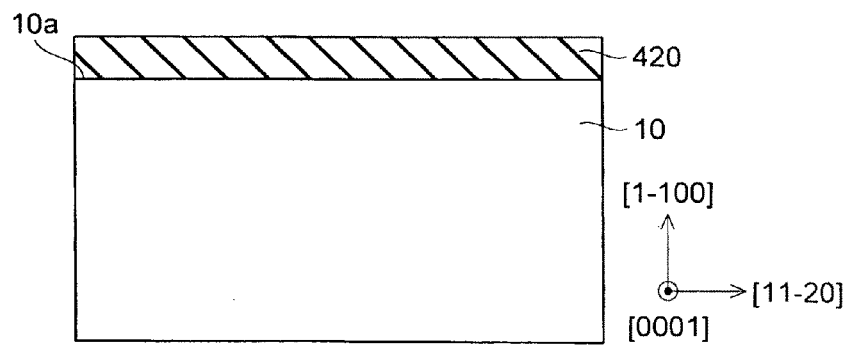
FIG. 19 is a sectional view illustrating a method of manufacture of a nitride semiconductor laser chip according to Embodiment 1 of the invention.
Figure 20:
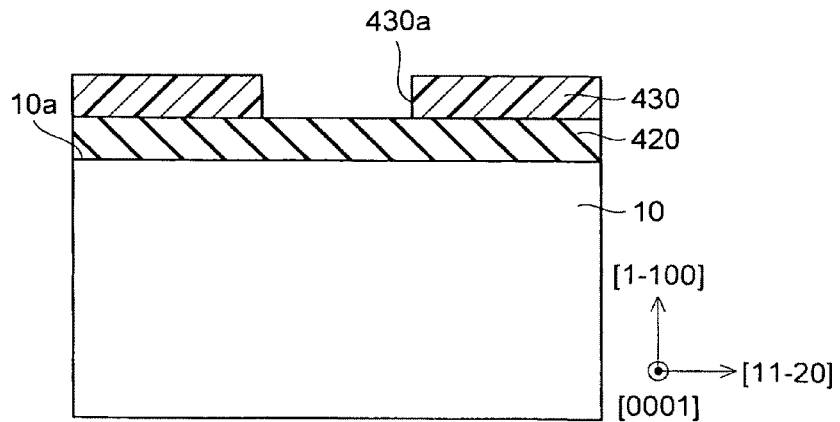
FIG. 20 is a sectional view illustrating a method of manufacture of a nitride semiconductor laser chip according to Embodiment 1 of the invention.
Figure 21:
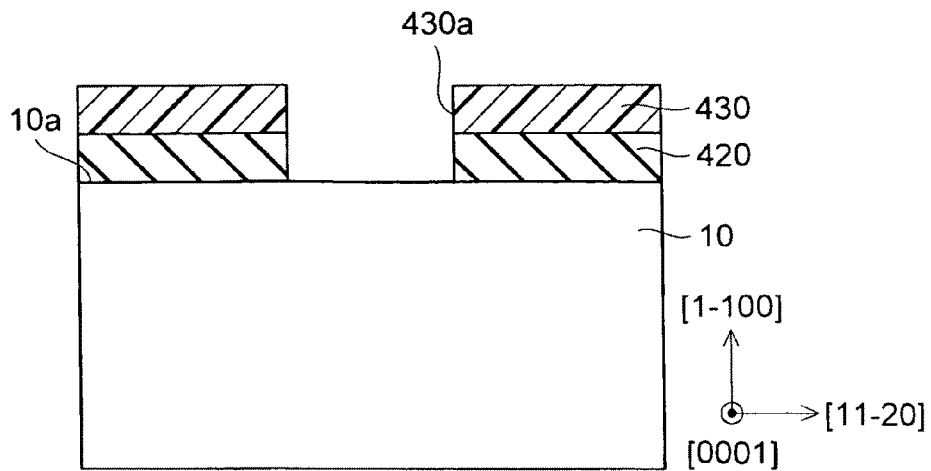
FIG. 21 is a sectional view illustrating a method of manufacture of a nitride semiconductor laser chip according to Embodiment 1 of the invention.

Next, as shown in FIG. 19, over the entire top face (principal growth plane 10a) of the n-type GaN substrate 10 obtained, by a sputtering process or the like, a $SiO_2$ layer 420 with a thickness of about 1 μm is formed. Next, as shown in FIG. 20, by use of a photolithography technology, on the $SiO_2$ layer 420, a resist layer 430 having an opening 430a as a resist pattern is formed. Then, as shown in FIG. 21, by use of a dry etching technology such as RIE (reactive ion etching), and with the resist layer 430 used as a mask, the $SiO_2$ layer 420 is etched so as to selectively remove a predetermined region of the $SiO_2$ layer 420. Thereafter, by use of a resist removal liquid or organic solvent (for example, acetone, ethanol, etc.), the resist layer 430 is removed. An advance to the next process may be made without removing the resist layer 430.

Figure 22:
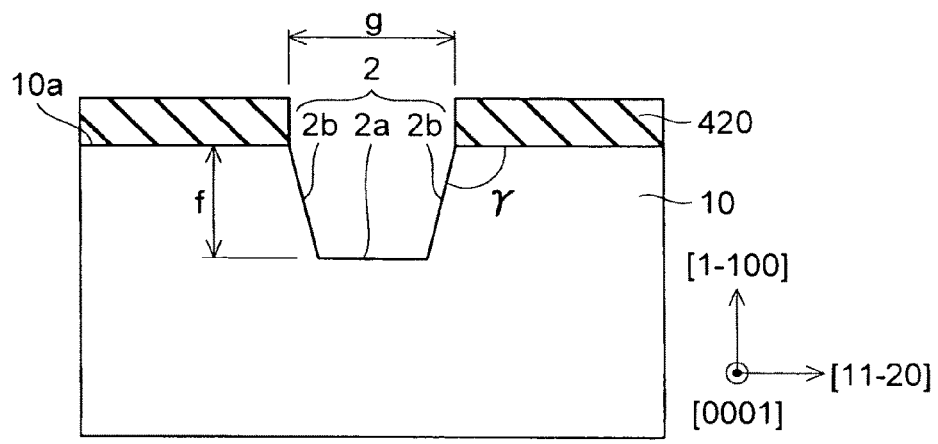
FIG. 22 is a sectional view illustrating a method of manufacture of a nitride semiconductor laser chip according to Embodiment 1 of the invention.

Subsequently, as shown in FIG. 22, by an ICP (inductively coupled plasma) process, or by a RIE process or the like, and with the $SiO_2$ layer 420 used as a mask, the n-type GaN substrate 10 is etched so as to selectively remove a predetermined region of the n-type GaN substrate 10. At this time, the etching conditions are so adjusted that the etched depth f of the n-type GaN substrate 10 is about 5 μm. In this way, the depressed portion 2 described above is formed on the n-type GaN substrate 10. By adjusting the etching conditions or the like, the side surface portions 2b of the depressed portion 2 are so formed that their inclination angle γ is equal to a predetermined angle larger than 90 degrees.

Figure 23:
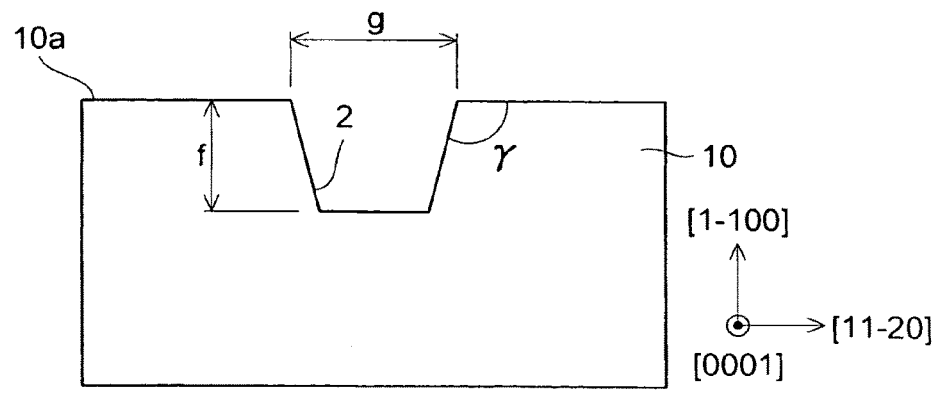
FIG. 23 is a sectional view illustrating a method of manufacture of a nitride semiconductor laser chip according to Embodiment 1 of the invention.

Thereafter, as shown in FIG. 23, by use of an etchant such as HF (hydrogen fluoride), the $SiO_2$ layer 420 (see FIG. 22) is removed.

Figure 24:
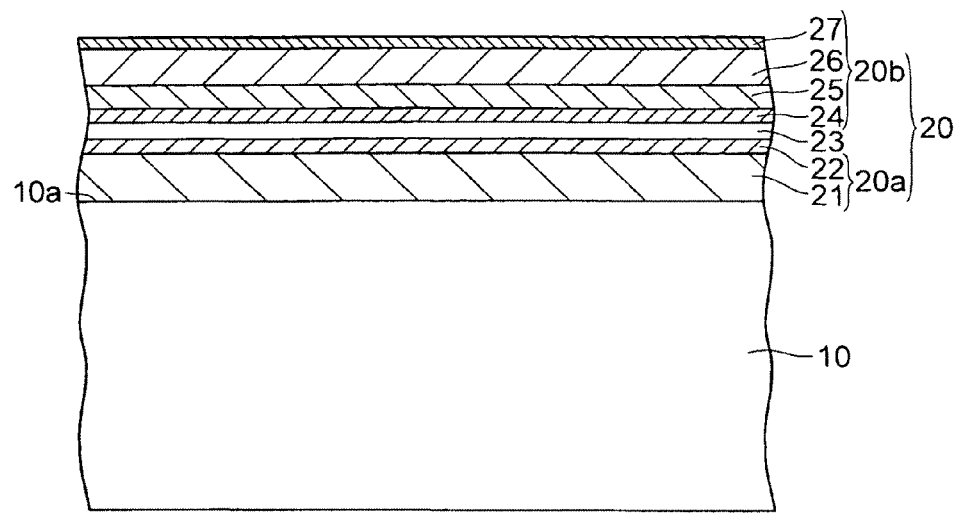
FIG. 24 is a sectional view illustrating a method of manufacture of a nitride semiconductor laser chip according to Embodiment 1 of the invention.

Next, as shown in FIG. 24, on the principal growth plane 10a of the n-type GaN substrate 10 (processed substrate) processed as described above, individual nitride semiconductor layers 21 to 27 are grown by an epitaxial growth process such as an MOCVD process. Specifically, on the principal growth plane 10a of the n-type GaN substrate 10, the following layers are grown successively: an n-type clad layer 21 of n-type $Al_{0.06}Ga_{0.94}N$ with a thickness of about 2.2 μm; an n-type guide layer 22 of n-type GaN with a thickness of about 0.1 μm; and an active layer 23. When the active layer 23 is grown, as shown in FIG. 13, two well layers 23a of $In_{x1}Ga_{1-x1}N$ and three barrier layers 23b of $In_{x2}Ga_{1-x2}N$ (where x1>x2) are alternately grown. Specifically, on the n-type guide layer 22, the following layers are grown successively from bottom up: a first barrier layer 231b with a thickness of about 30 μm; a first well layer 231a with a thickness of about 3 nm to about 4 nm; a second barrier layer 232b with a thickness of about 16 nm; a second well layer 232a with a thickness of about 3 nm to about 4 nm; and a third barrier layer 233b with a thickness of about 60 nm. In this way, on the n-type guide layer 22, an active layer 23 having a DQW structure composed of two well layers 23a and three barrier layers 23b is formed. At this time, the well layers 23a are so formed that the In composition ratio x1 there is 0.15 or more but 0.45 or less (for example, 0.2 to 0.25). On the other hand, the barrier layers 23b are so formed that the In composition ratio x2 there is, for example, 0.04 to 0.05.

Next, as shown in FIG. 24, on the active layer 23, the following layers are grown successively: a carrier block layer 24 of p-type $Al_yGa_{1-y}N$; a p-type guide layer 25 of p-type GaN with a thickness of about 0.05 μm; a p-type clad layer 26 of p-type $Al_{0.06}Ga_{0.94}N$ with a thickness of about 0.5 μm; and a p-type contact layer 27 of p-type GaN with a thickness of about 0.1 μm. At this time, it is preferable that the carrier block layer 24 be formed so as to have a thickness of 40 nm or less (for example, about 12 nm). Moreover, the carrier block layer 24 is so formed that the Al composition ratio y there is 0.08 or more but 0.35 or less (for example, about 0.15). The n-type nitride semiconductor layer 20a (the n-type clad layer 21 and the n-type guide layer 22) are doped with, for example, Si as an n-type impurity, and the p-type nitride semiconductor layer 20b (the carrier block layer 24, the p-type guide layer 25, the p-type clad layer 26, and the p-type contact layer 27) are doped with, for example, Mg as a p-type impurity.

In Embodiment 1, the n-type nitride semiconductor layer 20a is formed at a growth temperature of 900° C. or higher but lower than 1300° C. (for example, 1075° C.). The well layers 23a of the active layer 23 are formed at a growth temperature of 600° C. or higher but 770° C. or lower (for example, 700° C.). The barrier layers 23b, which are contiguous with the well layers 23a, are formed at the same growth temperature (for example, 700° C.) as the well layers 23a. The p-type nitride semiconductor layer 20b is formed at a growth temperature of 700° C. or higher but lower than 900° C. (for example, 880° C.). The growth temperature of the n-type nitride semiconductor layer 20a is preferably 900° C. or higher but lower than 1300° C., and more preferably 1000° C. or higher but lower than 1300° C. The growth temperature of the well layers 23a of the active layer 23 is preferably 600° C. or higher but 830° C. or lower, and in a case where the In composition ratio x1 in the well layers 23a is 0.15 or more, preferably 600° C. or higher but 770° C. or lower; more preferably, 630° C. or higher but 740° C. or lower. The growth temperature of the barrier layers 23b of the active layer 23 is preferably the same as or higher than that of the well layers 23a. The growth temperature of the p-type nitride semiconductor layer 20b is preferably 700° C. or higher but lower than 900° C., and more preferably 700° C. or higher but 880° C. or lower. Needless to say, since even forming the p-type nitride semiconductor layer 20b at a temperature of 900° C. or higher gives p-type conductivity, the p-type nitride semiconductor layer 20b may be formed at a temperature of 900° C. or higher.

As source materials for the growth of these nitride semiconductors, for example, the following materials can be used: as a source material of Ga, trimethylgallium (($CH_3$)$_3$Ga; TMGa); as a source material of Al, trimethylaluminium (($CH_3$)$_3$Al; TMAD; as a source material of N, $NH_3$. As a carrier gas, for example, $H_2$ can be used. As for dopants, as an n-type dopant (n-type impurity), for example, monosilane ($SiH_4$) can be used; as a p-type dopant (p-type impurity), for example, cyclopentadienylmagnesium ($CH_2Mg$) can be used.

Here, in Embodiment 1, as shown in FIG. 1, the principal growth plane 10a of the n-type GaN substrate 10 is a plane having an off-angle in the a-axis direction relative to the m plane, and this makes it difficult to fill the inside of the depressed portion 2 with the nitride semiconductor layer 20. As a result, when the nitride semiconductor layer 20 is formed on top of the n-type GaN substrate 10, a concavity 35 is formed on the surface of the nitride semiconductor layer 20 (on the surface of each individual layer constituting the nitride semiconductor layer 20) over the depressed portion 2 (carved region 3). This concavity 35 alleviates strain in the nitride semiconductor layer 20 such as results from lattice mismatch with the n-type GaN substrate 10.

Moreover, in Embodiment 1, as shown in FIG. 7, as a result of the nitride semiconductor layer 20 being formed on the principal growth plane 10a of the above-described n-type GaN substrate 10, in the nitride semiconductor layer 20 over the uncarved region 4, a gradient thickness region 5 is formed whose thickness decreases in a gradient fashion (gradually) toward the depressed portion 2 (carved region 3). As shown in FIG. 8, the gradient thickness region 5 is formed in a region closely on one (for example, right) side of the depressed portion 2 (carved region 3), substantially in the shape of a band extending in the direction parallel to the depressed portion 2 (carved region 3). This gradient thickness region 5 too serves to alleviate strain in the nitride semiconductor layer 20 such as results from lattice mismatch with the n-type GaN substrate 10.

Thus, with the method of manufacture of a nitride semiconductor laser chip according to Embodiment 1, owing to the double strain alleviating effect by the concavity 35 formed on the surface of the nitride semiconductor layer 20 and by the gradient thickness region 5 formed in the nitride semiconductor layer 20 over the uncarved region 4, it is possible to obtain a very powerful effect of suppressing cracks.

Furthermore, in Embodiment 1, using as the principal growth plane 10a of the n-type GaN substrate 10a plane having an off-angle in the a-axis direction relative to the m plane gives the nitride semiconductor layer 20 formed on the principal growth plane 10a good crystallinity. Moreover, using the above-described n-type GaN substrate 10 gives the emission portion formation region 6 in the nitride semiconductor layer 20 very good surface morphology. This makes a crack unlikely to develop in the nitride semiconductor layer 20.

Accordingly, even when an AlGaN layer with a high Al composition, which greatly differs in lattice constant etc. from the n-type GaN substrate 10, is formed on the principal growth plane 10a, development of cracks is suppressed. Thus, a nitride semiconductor layer 20 in which development of cracks is suppressed is formed on the principal growth plane 10a of the n-type GaN substrate 10.

Moreover, in the nitride semiconductor layer 20 over the uncarved region 4, an emission portion formation region 6 is formed whose thickness varies far less than that of the gradient thickness region 5 and which is suitable for formation of an emission portion (ridge portion 28). The emission portion formation region 6 has very good surface morphology, and its thickness varies very little.

Figure 25:
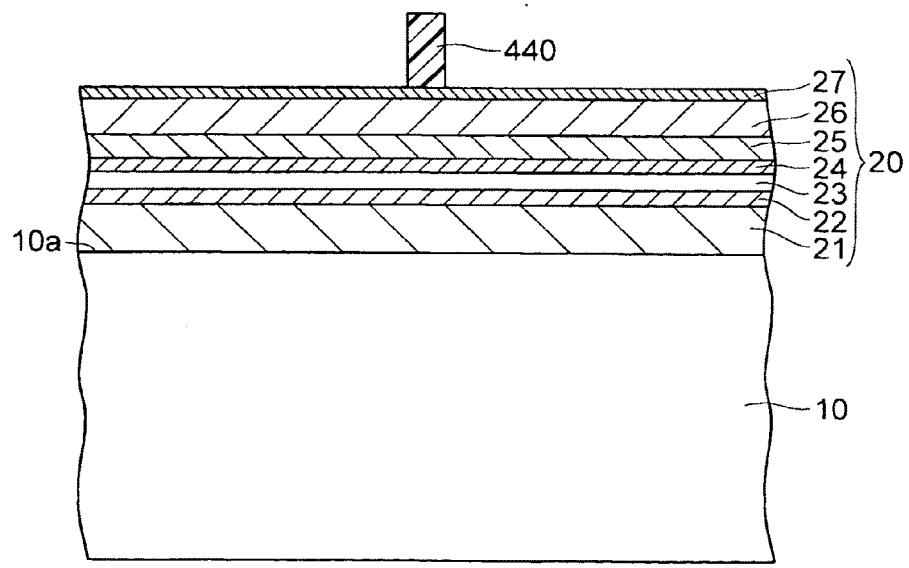
FIG. 25 is a sectional view illustrating a method of manufacture of a nitride semiconductor laser chip according to Embodiment 1 of the invention.
Figure 26:
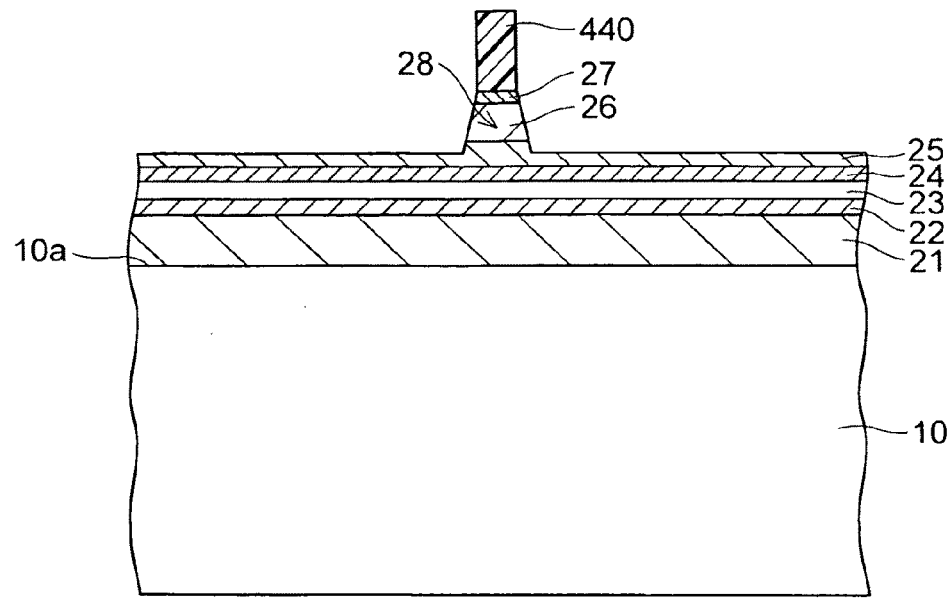
FIG. 26 is a sectional view illustrating a method of manufacture of a nitride semiconductor laser chip according to Embodiment 1 of the invention.

Subsequently, as shown in FIG. 25, by use of a photolithography technology, on the p-type contact layer 27 in the emission portion formation region 6 (see FIG. 7), a stripe-shaped (elongate) resist layer 440 is formed that has a width of about 1 μm to about 3 μm (for example, about 1.5 μm) and that extends in the c-axis [0001] direction. Then, as shown in FIG. 26, by a RIE process using chlorine-based gas such as $SiCl_4$ or $Cl_2$ or Ar gas, and with the resist layer 440 used as a mask, etching is performed halfway (not limited to exactly half) into the depth of the p-type guide layer 25. In this way, a stripe-shaped (elongate) ridge portion 28 (see FIGS. 9 and 26) is formed which is constituted by an elevated portion of the p-type guide layer 25, the p-type clad layer 26, and the p-type contact layer 27 and which extends in the c-axis [0001] direction, with each ridge portion 28 parallel to another.

Figure 27:
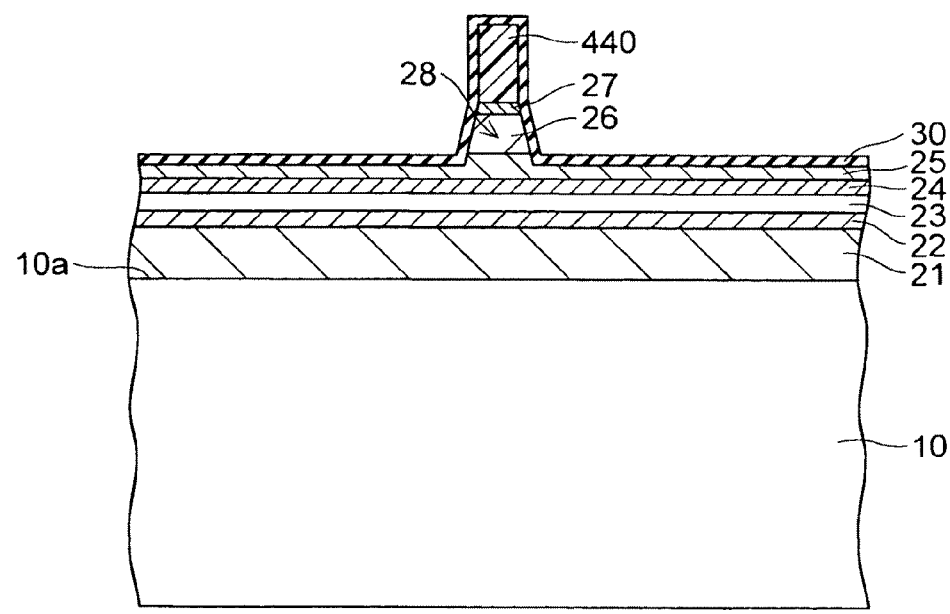
FIG. 27 is a sectional view illustrating a method of manufacture of a nitride semiconductor laser chip according to Embodiment 1 of the invention.
Figure 28:
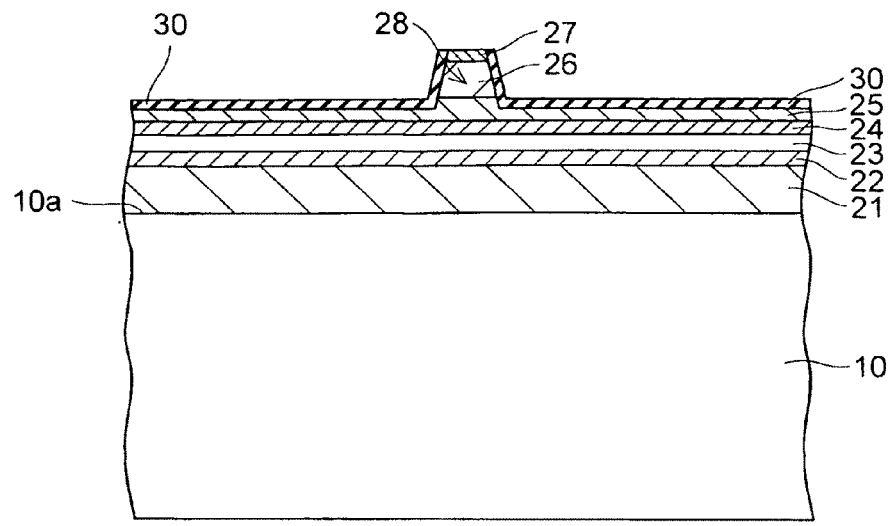
FIG. 28 is a sectional view illustrating a method of manufacture of a nitride semiconductor laser chip according to Embodiment 1 of the invention.

Next, as shown in FIG. 27, with the resist layer 440 left on the ridge portion 28, by a sputtering process or the like, an insulating layer 30 of $SiO_2$ with a thickness of about 0.1 μm to about 0.3 μm (for example, about 0.15 μm) is formed to bury the ridge portion 28. Then, the resist layer 440 is removed by lift-off so that the p-type contact layer 27 at the top of the ridge portion 28 is exposed. In this way, on each side of the ridge portion 28, an insulating layer 30 as shown in FIG. 28 is formed.

Figure 29:
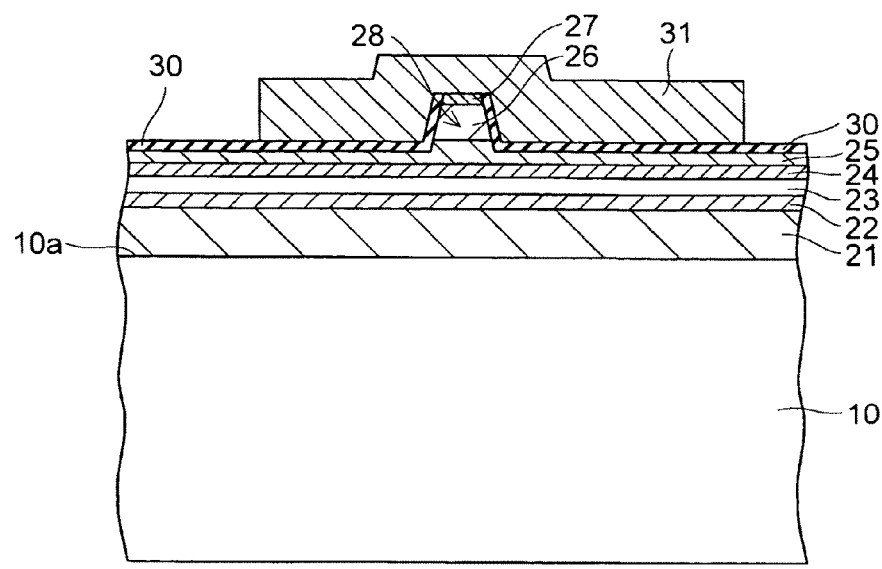
FIG. 29 is a sectional view illustrating a method of manufacture of a nitride semiconductor laser chip according to Embodiment 1 of the invention.

Next, as shown in FIG. 29, by a vacuum deposition process or the like, the following layers are formed successively from the substrate side (the insulating layer 30 side): a Pd layer (unillustrated) with a thickness of about 15 μm; and a Au layer (unillustrated) with a thickness of about 200 nm. Thus, on the insulating layer 30 (the p-type contact layer 27), a p-side electrode 31 having a multiple-layer structure is formed.

Next, to make the substrate easy to split, the back face of the n-type GaN substrate 10 is ground or polished until the thickness of the n-type GaN substrate 10 is reduced to about 100 μm. Thereafter, as shown in FIG. 1, on the back face of the n-type GaN substrate 10, by a vacuum deposition process or the like, the following layers are formed successively from the n-type GaN substrate 10's back face side: a Hf layer (unillustrated) with a thickness of about 5 nm; an Al layer (unillustrated) with a thickness of about 150 nm; a Mo layer (unillustrated) with a thickness of about 36 nm; a Pt layer (unillustrated) with a thickness of about 18 nm; and a Au layer (unillustrated) with a thickness of about 200 nm. Thus, an n-side electrode 32 having a multiple-layer structure is formed. Before the n-side electrode 32 is formed, dry etching or wet etching may be performed for the purpose of, for example, adjusting the n-side electrical characteristics.

In this way, the nitride semiconductor wafer 50 according to Embodiment 1 described above is formed.

Figure 30:
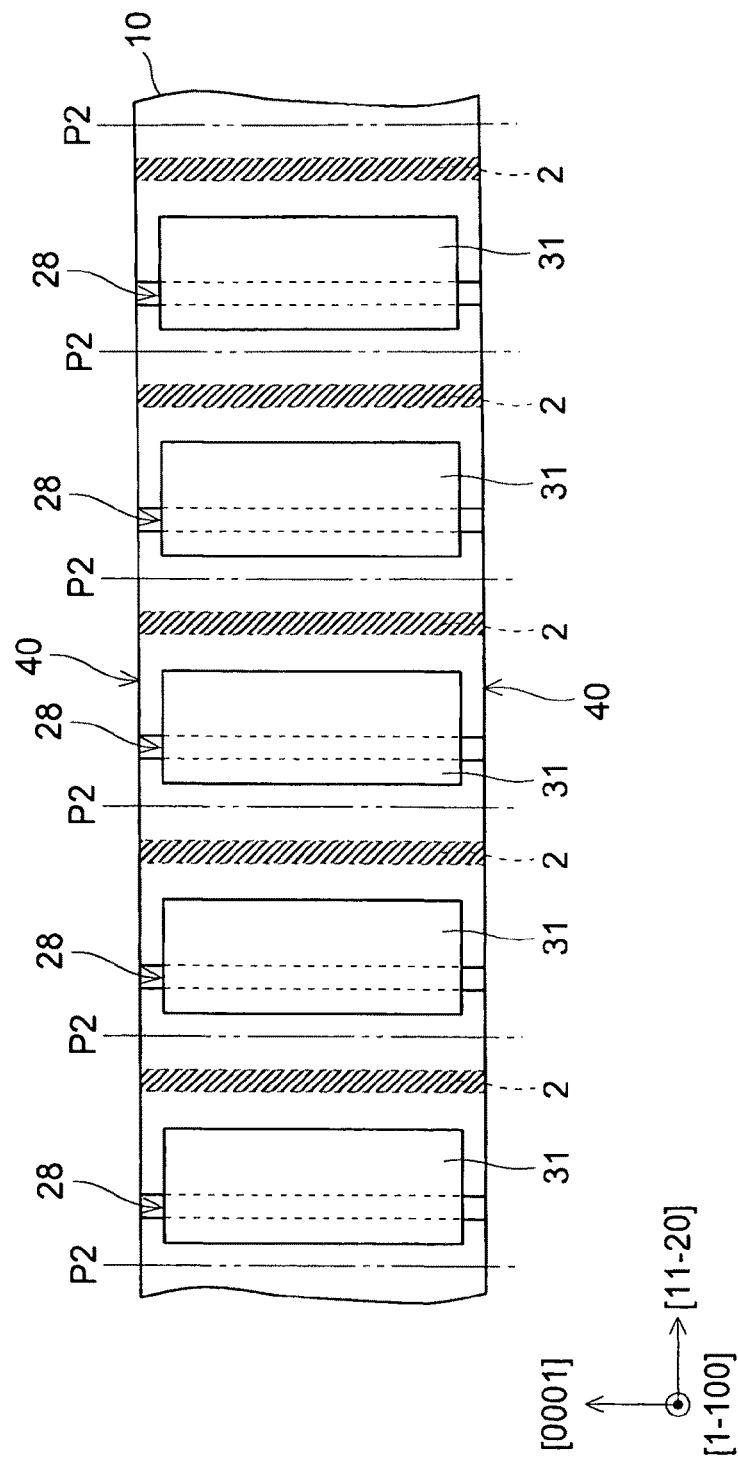
FIG. 30 is a plan view illustrating a method of manufacture of a nitride semiconductor laser chip according to Embodiment 1 of the invention.

Thereafter, as shown in FIG. 30, by a technique such as a scribing-breaking process, laser scribing, or dry etching, the wafer is split into bars. This produces a bar-shaped array of chips having resonator faces 40 at the split facets. Next, by a technique such as a vacuum deposition process or a sputtering process, a coating is applied to the facets (resonator faces 40) of the bar-shaped array of chips. Specifically, on one of the facets which will serve as a light emission face, an emission-side coating (unillustrated) of, for example, a film of aluminum oxynitride or the like is formed. On the facet opposite from it, which will serve as a light reflection face, a reflection-side coating (unillustrated) of, for example, multiple-layered films of $SiO_2$, $TiO_2$, etc. is formed.

Figure 31:
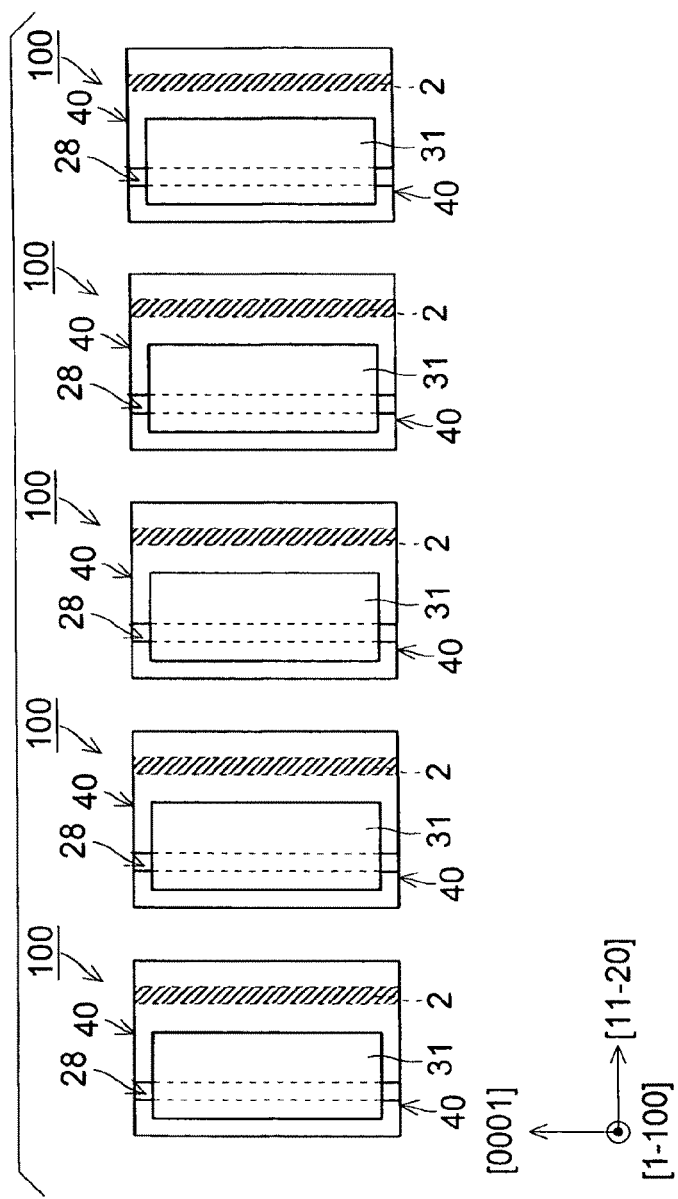
FIG. 31 is a plan view illustrating a method of manufacture of a nitride semiconductor laser chip according to Embodiment 1 of the invention.

Lastly, the bar-shaped array of chips is split along planned splitting lines P2 along the c-axis [0001] direction into separate pieces of individual nitride semiconductor laser chips as shown in FIG. 31. In this way, the nitride semiconductor laser chip 100 according to Embodiment 1 of the invention is manufactured.

Figure 32:
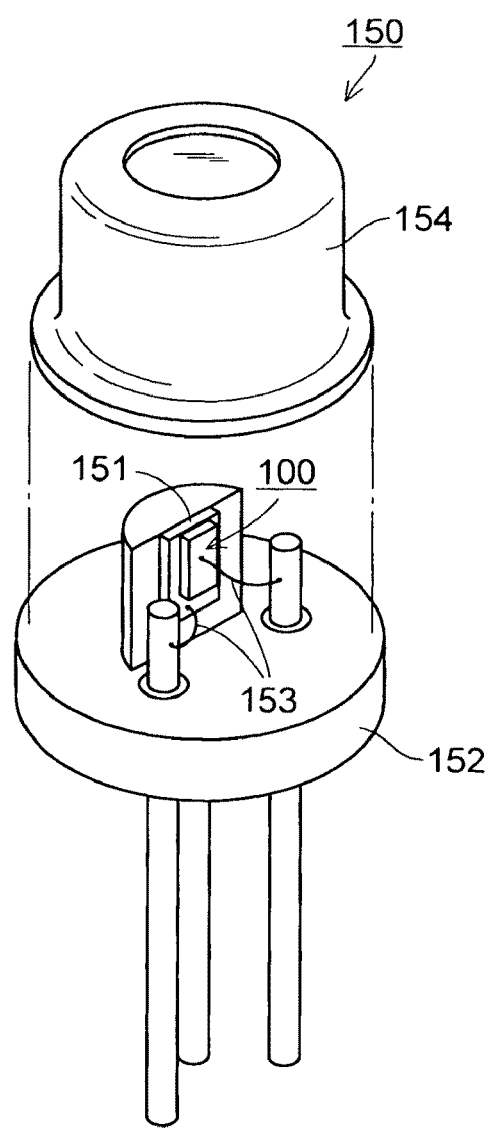
FIG. 32 is a perspective view of a nitride semiconductor laser device incorporating a nitride semiconductor laser chip according to Embodiment 1 of the invention.

The nitride semiconductor laser chip 100 according to Embodiment 1 obtained by the method of manufacture described above is, as shown in FIG. 32, mounted on a stem 152 with a sub-mount 151 interposed in between and is electrically connected to lead pins by wires 153. Then, a cap 154 is welded on top of the stem 152 to complete assemblage into a can-packaged semiconductor laser device (semiconductor device) 150.

With the method of manufacture of a nitride semiconductor laser chip according to Embodiment 1, as described above, a plane having an off-angle in the a-axis direction relative to the m plane is taken as the principal growth plane 10a of the n-type GaN substrate 10; this makes it possible to suppress a bright-spotted EL emission pattern. That is, with that scheme, it is possible to improve the EL emission pattern. This makes it possible to enhance luminous efficacy, and thus makes it possible to manufacture a high-luminance nitride semiconductor laser chip 100.

With the method of manufacture according to Embodiment 1, owing to the above scheme, since it is possible to suppress a bright-spotted EL emission pattern, it is possible to enhance luminous efficacy, and it is thus possible to manufacture a nitride semiconductor laser chip 100 with superb chip characteristics and high reliability.

With the method of manufacture according to Embodiment 1, owing to the above scheme, since it is possible to effectively suppress development of cracks in the nitride semiconductor layer 20, it is possible to increase the number of acceptable chips obtained from a single wafer. It is thus possible to increase yields.

Using the method of manufacture according to Embodiment 1 offers, as described above, a very powerful effect of suppressing cracks. This makes it possible to form, easily without developing a crack, a nitride semiconductor layer having a more different composition from the nitride semiconductor substrate. For example, in a case where a GaN substrate is used as a nitride semiconductor substrate, it is possible to form an AlGaN layer with a higher Al composition thicker than ever. This makes it possible to fabricate, with high yields, chips that require a nitride semiconductor film with a high Al composition (for example, semiconductor light-emitting chips that emit light in a ultraviolet or green region) and that have conventionally been difficult to fabricate.

With the method of manufacture according to Embodiment 1, forming the n-type nitride semiconductor layer 20a at a high temperature of 900° C. or higher helps make the surface of the n-type nitride semiconductor layer 20a flat. Thus, by forming the active layer 23 and the p-type nitride semiconductor layer 20b on the n-type nitride semiconductor layer 20a thus made flat, it is possible to suppress degradation of crystallinity in the active layer 23 and the p-type nitride semiconductor layer 20b. This too makes it possible to form a high-quality crystal. On the other hand, forming the n-type nitride semiconductor layer 20a at a growth temperature lower than 1300° C. helps suppress the inconvenience of the surface of the n-type GaN substrate 10 re-evaporating and becoming rough during the raising of temperature due to the n-type nitride semiconductor layer 20a being formed at a growth temperature of 1300° C. or higher. Thus, with this scheme, it is possible to easily manufacture a nitride semiconductor laser chip 100 with superb chip characteristics and high reliability.

With the method of manufacture according to Embodiment 1, forming the well layers 23a of the active layer 23 at a growth temperature of 600° C. or higher helps suppress the inconvenience of a shorter atom diffusion length and hence degraded crystallinity due to the well layers 23a being formed at a growth temperature lower than 600° C. On the other hand, forming the well layers 23a of the active layer 23 at a growth temperature of 770° C. or lower helps suppress the inconvenience of the active layer 23 being blackened by thermal damage due to the well layers 23a of the active layer 23 being formed at a growth temperature higher than 770° C. (for example, 830° C. or higher). The growth temperature of the barrier layers 23b, which are contiguous with the well layers 23a, is preferably, the same as or higher than that of the well layers 23a.

With the method of manufacture according to Embodiment 1, forming the p-type nitride semiconductor layer 20b at a growth temperature of 700° C. or higher helps suppress the inconvenience of the p-type nitride semiconductor layer 20b having a high resistance due to their growth temperature being too low. On the other hand, forming the p-type nitride semiconductor layer 20b at a growth temperature lower than 900° C. helps reduce thermal damage to the active layer 23. In a case where an n-type GaN substrate having the c plane as a principal growth plane is used, forming the p-type nitride semiconductor layer 20b at a growth temperature lower than 900° C. causes the p-type nitride semiconductor layer 20b to have an extremely high resistance and thus makes the resulting device (nitride semiconductor chip) difficult to use as such. By contrast, using the above-described n-type GaN substrate 10 having as the principal growth plane 10a a plane provided with an off-angle in the a-axis direction relative to the m plane makes it possible, even at a growth temperature lower than 900° C., to obtain p-type conductivity by doping with Mg as a p-type impurity. In particular, in a case where the In composition ratio x1 in the well layers 23a of the active layer 23 is 0.15 or more but 0.45 or less, the In composition tends to vary across the plane due to segregation of In and the like. Thus, the lower the growth temperature of the p-type nitride semiconductor layer 20b, the more preferable. The difference between the growth temperature of the well layers 23a of the active layer 23 and the growth temperature of the p-type nitride semiconductor layer 20b is preferably less than 200° C. from the viewpoint of avoiding thermal damage to the active layer 23, and more preferably 150° C. or less. In a case where the In composition ratio x1 is less than 0.15, no such inconvenience as segregation of In is likely, and therefore growing the p-type nitride semiconductor layer 20b at a growth temperature of 900° C. or higher poses no problem.

Next, a description will be given of experiments conducted to verify the effect of the embodiment described above.

In the experiments, first, a test sample was fabricated in which individual nitride semiconductor layers like those in Embodiment 1 were formed on top of an n-type GaN substrate like the one in Embodiment 1, and was tested for an effect of suppressing cracks. The n-type GaN substrate used in the test sample had an off-angle of +2.2 degrees in the a-axis direction and an off-angle of −0.18 degrees in the c-axis direction. The period of the depressed portions (carved regions) was 400 μm. In other respects, the test sample had a structure similar to that in Embodiment 1 described above. Also, a comparison sample in which individual nitride semiconductor layers like those in Embodiment 1 were formed on top of an n-type GaN substrate having no off-angle in the a-axis direction (a substantially m-plane just substrate) was fabricated, and was subjected to the same inspection as the test sample. The n-type GaN substrate used in the comparison sample had an off-angle of 0 degrees in the a-axis direction and an off-angle of +0.05 degrees in the c-axis direction. In the comparison sample, no depressed portions (carved regions) were formed. In other respects, the comparison sample had the same structure as the test sample. The formation of the individual nitride semiconductor layers in the test sample and in the comparison sample was conducted simultaneously on an MOCVD machine.

Figure 33:
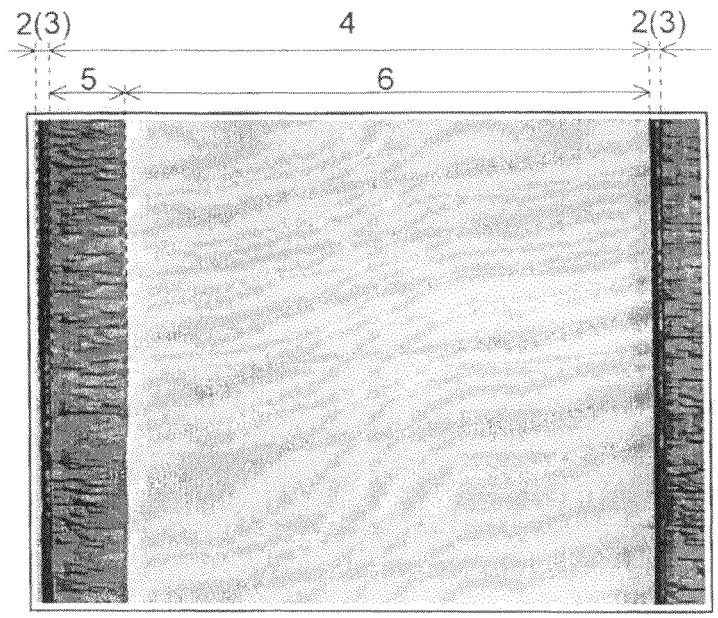
FIG. 33 is a microscope image of the surface of a nitride semiconductor layer formed on an n-type GaN substrate by a method of manufacture according to Embodiment 1 (a microscope image of the surface of a nitride semiconductor layer as observed in a test sample)
Figure 34:
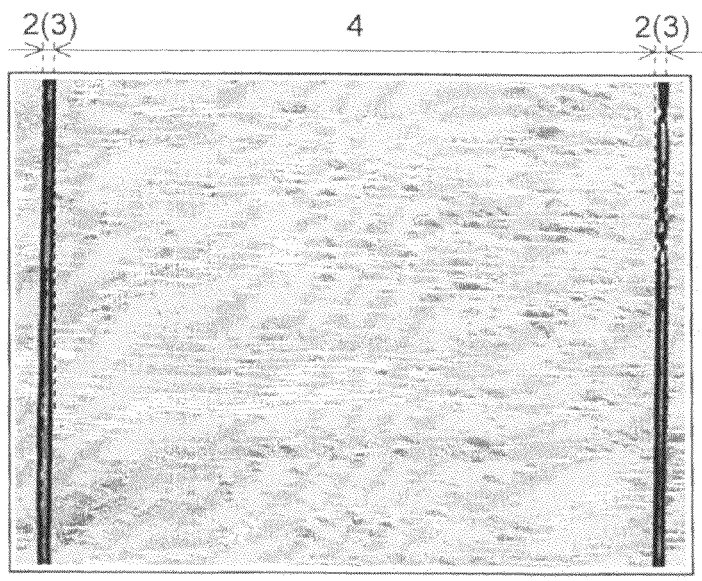
FIG. 34 is a microscope image of the surface of a nitride semiconductor layer as observed in a comparison sample.

FIG. 33 is a microscope image of the surface of the nitride semiconductor layer as actually observed in the test sample, and FIG. 34 is a microscope image of the surface of the nitride semiconductor layer as actually observed in the comparison sample.

As shown in FIGS. 33 and 34, in the test sample, in which an n-type GaN substrate having an off-angle in the a-axis direction was used, it was observed that, in the nitride semiconductor layer over the uncarved region 4, a gradient thickness region 5 was formed whose thickness decreased in a gradient fashion (gradually) toward the depressed portion 2 (carved region 3). It was also confirmed that the gradient thickness region 5 was formed in a region closely on one (for example, right) side of the depressed portion 2 (carved region 3), substantially in the shape of a band extending in the direction parallel to the depressed portion 2 (carved region 3).

In the test sample, it was further clearly observed that the region (emission portion formation region 6) of the nitride semiconductor layer over the uncarved region 4 other than the gradient thickness region 5 had very good surface morphology. This confirms that using a substrate having an off-angle in the a-axis direction helps improve surface morphology.

Moreover, whereas in the comparison sample, development of cracks of the order of 10 to 20 cracks per $cm^2$ was observed after the formation of the nitride semiconductor layer, in the test sample, no development of cracks was observed after the layer formation.

The foregoing confirms that forming a depressed portion (carved region) on an n-type GaN substrate having as the principal growth plane a plane having an off-angle in the a-axis direction relative to the m plane offers a very powerful effect of suppressing cracks.

Next, to test for the effect of the off-angle in the a-axis direction on the gradient thickness region, on each of four n-type GaN substrates having different off-angles in the a-axis direction, individual nitride semiconductor layers like those in Embodiment 1 described above were formed, and then the width of the gradient thickness region formed in the nitride semiconductor layer was inspected. The four n-type GaN substrates had off-angles of +0.5 degrees, +1.0 degree, +2.0 degrees, and +3.0 degrees, respectively, in the a-axis direction. The four n-type GaN substrates all had off-angles of about −0.2 degrees in the c-axis direction. As in Embodiment 1, the depressed portions (carved regions) were formed with a width of 5 μm and a depth of 5 μm. The period of the depressed portions (carved regions) was 400 μm. The formation of the individual nitride semiconductor layers on top of the substrate was conducted in a similar manner as in Embodiment 1 described above.

The results were as follows. It was observed that, as the off-angle in the a-axis direction increased, the width of the gradient thickness region tended to decrease. Specifically, with the off-angle in the a-axis direction equal to +0.5 degrees, the width of the gradient thickness region was 188.4 μm; with the off-angle in the a-axis direction equal to +1.0 degrees, the width of the gradient thickness region was 92.2 μm; with the off-angle in the a-axis direction equal to +2.0 degrees, the width of the gradient thickness region was 46.5 μm; and with the off-angle in the a-axis direction equal to +3.0 degrees, the width of the gradient thickness region was 32.7 μm.

It was also observed that, as the off-angle in the a-axis direction increased, the gradient of the gradient thickness region (thickness gradient angle) tended to become steeper.

Incidentally, with the off-angle in the a-axis direction equal to +0.5 degrees, about a half of the nitride semiconductor layer formed over the uncarved region was occupied by the gradient thickness region. Thus, with an off-angle in the a-axis direction smaller than 0.5 degrees, more than a half of the nitride semiconductor layer formed over the uncarved region will be occupied by the gradient thickness region. Here, it is preferable that the region where the device operation takes place (in a light-emitting device, the light-emitting region) be formed in the emission portion formation region, which has good surface morphology. Accordingly, from the viewpoint of securing a region (emission portion formation region) in which to fabricate a region for device operation (emission portion (ridge portion)), it is preferable that the off-angle in the a-axis direction be 0.5 degrees or larger.

Figure 35:
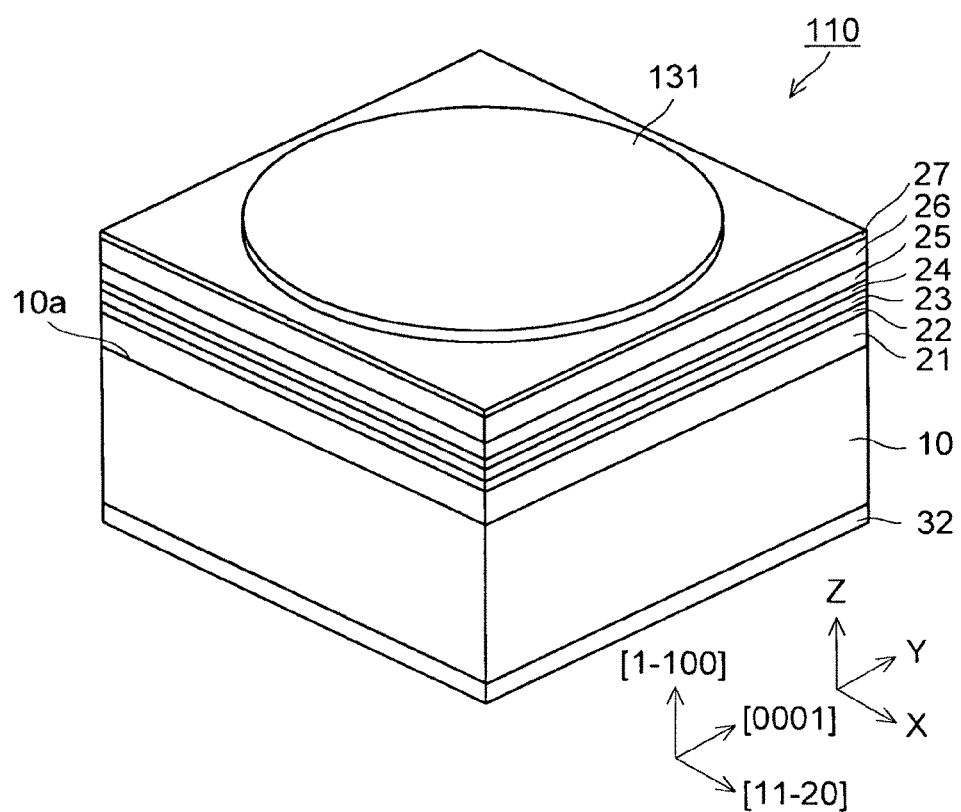
FIG. 35 is a perspective view of a light-emitting diode chip fabricated to verify the effect of a nitride semiconductor laser chip according to Embodiment 1 of the invention.

Next, as a test chip, a light-emitting diode chip 110 as shown in FIG. 35 was fabricated, and the EL emission pattern was inspected. The reason that a light-emitting diode chip was used for the inspection of the EL emission pattern is that, with a nitride semiconductor laser chip, which has a constricted current injection region as a result of a ridge portion being formed, it is difficult to inspect the EL emission pattern.

Figure 36:
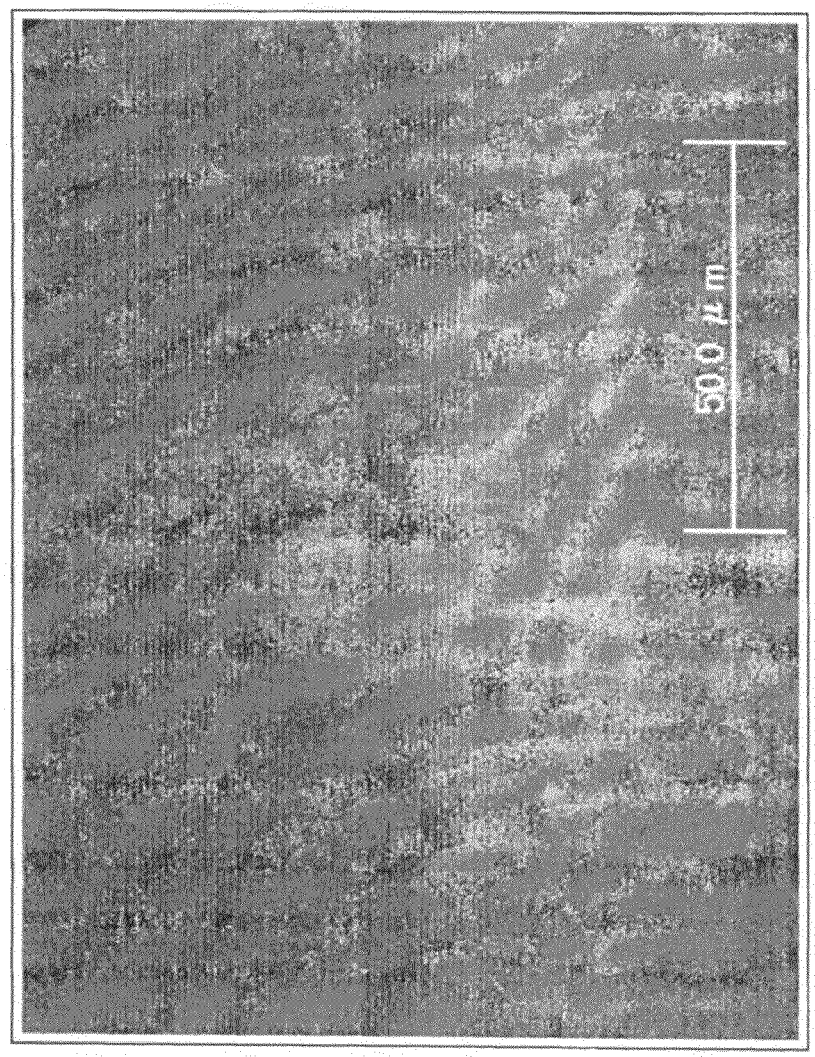
FIG. 36 is a microscope image of an EL emission pattern as observed in a light-emitting diode chip fabricated to verify the effect of a nitride semiconductor laser chip according to Embodiment 1 of the invention (a microscope image of an EL emission pattern as observed in a test chip)

The test chip (light-emitting diode chip 110) was fabricated by forming a nitride semiconductor layer (individual semiconductor layers) similar to the one in Embodiment 1 described above on top of an n-type GaN substrate 10 similar to the one in Embodiment 1 described above. The formation of the nitride semiconductor layer was conducted in a similar manner as in Embodiment 1 described above. Specifically, as shown in FIG. 35, by use of an n-type GaN substrate 10 having as a principal growth plane 10a a plane having an off-angle relative to the m plane, on its principal growth plane 10a, the following layers were formed successively: an n-type clad layer 21; an n-type guide layer 22; an active layer 23; a carrier block layer 24; a p-type guide layer 25; a p-type clad layer 26; and a p-type contact layer 27. Next, on the p-type contact layer 27, a p-side electrode 131 was formed. The P-side electrode 131 was formed transparent to allow inspection of the EL emission pattern. On the back face of the n-type GaN substrate 10, an n-side electrode 32 was formed. In the test chip, the n-type GaN substrate 10 had an off-angle of +2.2 degrees in the a-axis direction and an off-angle of −0.18 degrees in the c-axis direction. In the test chip, the In composition ratio in the well layers was 0.25. The test chip was so formed that the emission portion formation region acted as a light-emitting region. Current was injected into the thus fabricated test chip (the light-emitting diode chip 110) to make it emit light, and the light distribution across the plane was inspected. FIG. 36 shows a microscope image of the EL emission pattern observed in the test chip.

On the other hand, as a comparison chip, a light-emitting diode chip employing an n-type GaN substrate having the m plane as a principal growth plane (an m-plane just substrate) was fabricated. This comparison chip was fabricated in the same manner as the test chip described above. The gas flow amount of In was the same as for the test chip, but in the comparison chip, the In composition ratio in the well layers was 0.2. As with the test chip, the light distribution across the plane was inspected. Except employing an m-plane just substrate as the n-type GaN substrate and having an In composition ratio of 0.2 in the well layers, the comparison chip had a similar structure to the test chip (the light-emitting diode chip 110). The EL emission pattern shown in FIG. 47 is (a microscope image of) the EL emission pattern observed in the comparison chip.

Figure 47:
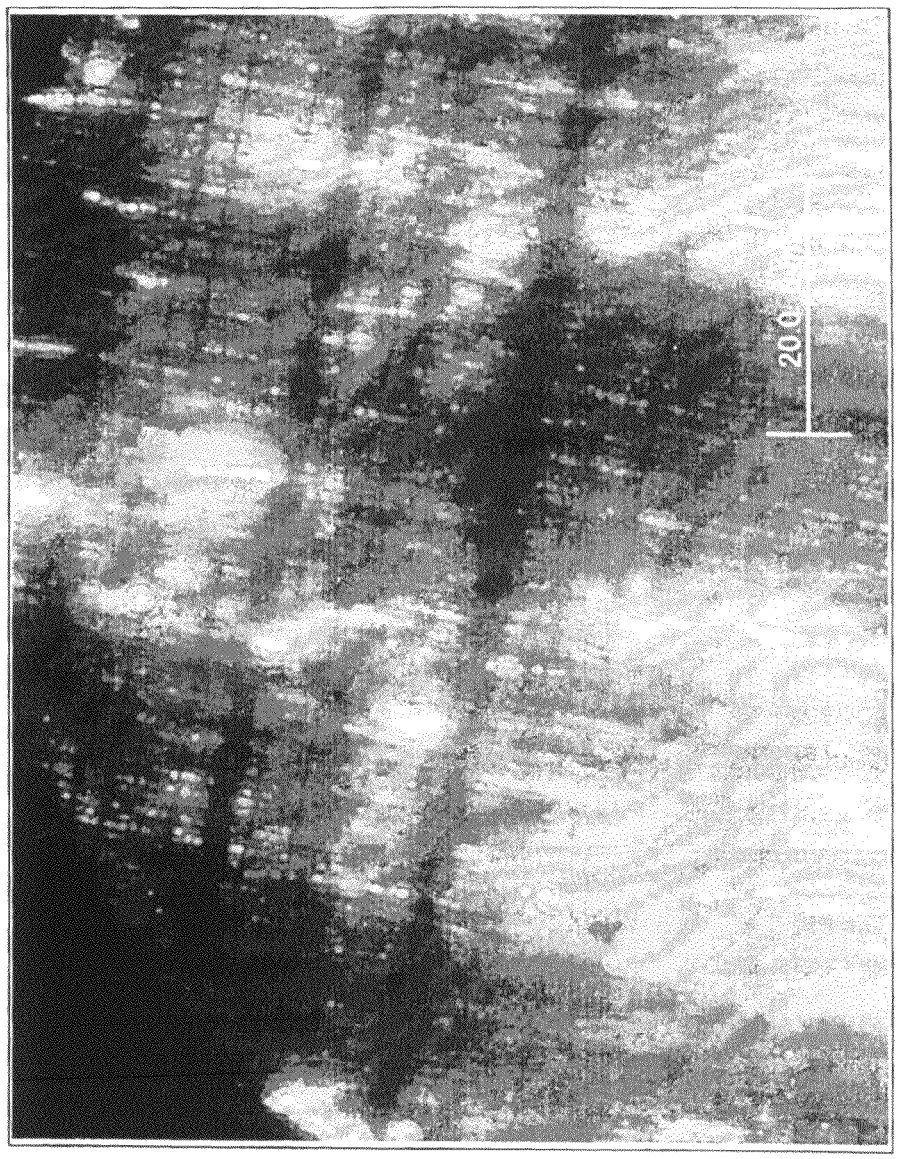
FIG. 47 is a microscope image showing a bright-spotted EL emission pattern (a microscope image of an EL emission pattern as observed in a comparison chip).

Whereas as shown in FIG. 47 the comparison chip exhibits a bright-spotted EL emission pattern, as shown in FIG. 36 the test chip, despite having a higher In composition ratio in the well layers than the comparison chip, exhibits an EL emission pattern of even light emission as a result of a bright-spotted EL emission pattern being suppressed. This confirms that using an n-type GaN substrate 10 having as a principal growth plane 10a a plane having an off-angle in the a-axis direction relative to the m plane helps suppress a bright-spotted EL emission pattern. On the other hand, through measurement of luminous efficacy with the test chip and the comparison chip, it was confirmed that the luminous efficacy of the test chip was increased to 1.5 times that of the comparison chip. The emission wavelength of the test chip was 510 nm, and the emission wavelength of the comparison chip was 500 nm. This confirms that the test chip, in which the off-angle is controlled, is more efficient also in terms of In absorption than the comparison chip, which uses an m-plane just substrate. The foregoing confirms that providing an off-angle in the a-axis direction relative to the m plane helps suppress bright-spotted emission and increase luminous efficacy in a wavelength region of green.

Subsequently, by use of a plurality of n-type GaN substrates with different off-angles in the a- and c-axis directions, a plurality of chips like the light-emitting diode chip 110 shown in FIG. 35 were fabricated, and were subjected to experiments including inspection of the EL emission pattern.

The results reveal that providing an off-angle in the a-axis direction relative to the m plane gives the effect of suppressing a bright-spotted EL emission pattern. It is found that, whereas the effect of suppressing bright-spotted emission is weak with the off-angle in the a-axis direction in the range of 0.1 degrees or smaller, the effect of suppressing a bright-spotted EL emission pattern is prominent with the off-angle in the a-axis direction equal to 0.1 degrees or larger. It is also found that, in a case where an off-angle is provided also in the c-axis direction, the effect of suppressing bright-spotted emission is weak with the off-angle in the c-axis direction in the range of ±0.1 degrees or smaller. It is considered that, with the off-angles in the a- and c-axis directions both in the range of ±0.1 degrees or less, the off-angles are so small as to be almost the same as in a substrate provided with no off-angle (a just substrate) and this makes it difficult to obtain the effect of suppressing bright-spotted emission. Thus, it is confirmed that by using as the principal growth plane of an n-type GaN substrate a plane having an off-angle in the a-axis direction relative to the m plane, it is possible to suppress a bright-spotted EL emission pattern. It is also confirmed that, with the absolute value of the off-angle in the a-axis direction larger than 10 degrees, while the effect of suppressing bright-spotted emission is obtained, surface morphology tends to deteriorate. It is moreover confirmed that, with the absolute value of the off-angle in the a-axis direction in the range of 0.1 degrees or smaller, surface morphology deteriorates. It is further confirmed that, in a case where an off-angle is provided also in the c-axis direction, with the off-angle in the c-axis direction in the range of ±0.1 degrees or smaller, the thickness of the n-type semiconductor layer and that of the p-type semiconductor layer vary across the plane. It is in addition confirmed that the off-angle in the c-axis direction shows similar tendencies in the + and − directions and can therefore be discussed in terms of an absolute value.

In a case where off-angles are provided in both the a- and c-axis directions, with regard to the effect of suppressing bright-spotted emission, a strong correlation is observed between the off-angle in the a-axis direction and the off-angle in the c-axis direction. Specifically, a large off-angle in the c-axis direction tends to weaken the effect of the off-angle in the a-axis direction (its effect of suppressing bright-spotted emission). More specifically, it is observed that, even in a case where the off-angles in the a- and c-axis directions are both larger than ±0.1 degrees, an off-angle in the c-axis direction larger than the off-angle in the a-axis direction tends to diminish the effect of the off-angle in the a-axis direction (its effect of suppressing bright-spotted emission). Here, the off-angle in the c-axis direction shows similar tendencies in the + and − directions. Thus, it is confirmed that a more preferred condition with regard to the relationship between the off-angles in the a- and c-axis directions is that the absolute value of the off-angle in the a-axis direction is larger than the absolute value of the off-angle in the c-axis direction. With this condition fulfilled, it is possible to obtain the effect of suppressing bright-spotted emission under a wider range of growth conditions. The fact that the effect of suppressing bright-spotted emission varies according to the relationship between the off-angles in the a- and c-axis directions as described above is considered to result from the fact that the direction of migration of atoms varies as the off-angle in the c-axis direction increases.

Based on the above findings, it is confirmed that, with consideration given to surface morphology etc., a preferred off-angle in the a-axis direction is larger than 0.1 degrees but 10 degrees or smaller. It is also confirmed that, in a case where an off-angle is provided also in the c-axis direction, a preferred off-angle in the c-axis direction is larger than ±0.1 degrees but smaller than ±10 degrees, and that it is preferable that the off-angle in the c-axis direction be smaller than the off-angle in the a-axis direction.

Practical Example 1

As a nitride semiconductor laser chip according to Practical Example 1, a nitride semiconductor laser chip similar to the one according to Embodiment 1 described above was fabricated by use of an n-type GaN substrate having an off-angle of +2.2 degrees in the a-axis direction and an off-angle of −0.18 degrees in the c-axis direction relative to the m plane {1-100}. In Practical Example 1, the In composition ratio in the well layers was 0.25, and the Al composition ratio in the carrier block layer was 0.15. In other respects, the structure in Practical Example 1 was similar to that in Embodiment 1 described above. Another nitride semiconductor laser chip fabricated in a similar manner to the one according to Embodiment 1 described above but by using an n-type GaN substrate having no off-angle (an m-plane just substrate) was taken as Comparative Example 1. It should be noted that in Comparison Example 1, the chip was fabricated with no depressed portions (carved regions) formed on the substrate. In other respects, the structure of the nitride semiconductor laser chip in Comparison Example 1 was similar to that in Embodiment 1.

With respect to Practical Example 1 and Comparison Example 1, the threshold current was measured. Whereas with the nitride semiconductor laser chip of Comparison Example 1 the value of the threshold current was about 100 mA, with the nitride semiconductor laser chip of Practical Example 1 the value of the threshold current was 60 mA; thus, it was confirmed that the threshold current was far lower with the nitride semiconductor laser chip of Practical Example 1 than with that of Comparison Example 1. The reason is considered to be that suppressed bright-spotted emission leads to even light emission across the plane and hence a higher gain. Also with regard to the driving voltage, it was confirmed that the driving voltage as observed when a current of 50 mA was injected was about 0.32 V lower with the nitride semiconductor laser chip of Practical Example 1 than with that of Comparison Example 1. One reason for these results is considered to be that using as the principal growth plane of an n-type GaN substrate a plane having an off-angle in the a-axis direction relative to the m plane improves the crystallinity in the carrier block layer. Another reason is considered to be that doing so also changes how Mg is absorbed into the p-type semiconductor layer in such a way as to enhance the activation rate.

In Comparison Example 1, development of cracks of the order of 10 to 20 cracks per cm² was observed. By contrast, in Practical Example 1, no development of cracks was observed.

Practical Example 2

As a nitride semiconductor laser chip according to Practical Example 2, a nitride semiconductor laser chip similar to the one according to Embodiment 1 described above was fabricated by use of an n-type GaN substrate having an off-angle of +1.0 degree in the a-axis direction and an off-angle of −0.5 degrees in the c-axis direction relative to the m plane {1-100}. In Practical Example 2, the In composition ratio in the active layer (well layers) was 0.25, and the Al composition ratio in the carrier block layer was 0.35. The width of the gradient thickness region was 92.2 μm. As distinct from Embodiment 1 described above, in Practical Example 2, formed as the n-type clad layer was an AlGaN layer of n-type $Al_{0.1}Ga_{0.9}N$ (with an Al composition ratio of 0.1) with a thickness of about 2.0 μm. In other respects, the structure in Practical Example 2 was similar to that in Embodiment 1 described above.

Also, another nitride semiconductor laser chip similar to that of Practical Example 2 described above was fabricated by use of an n-type GaN substrate having no off-angle (an m-plane just substrate), and this nitride semiconductor laser chip was taken as Comparison Example 2. It should be noted that in Comparison Example 2, the chip was fabricated with no depressed portions (carved regions) formed on the substrate.

In Practical Example 2, despite the Al composition ratio in the n-type clad layer being as high as 0.1, no development of cracks was observed. On the other hand, in Comparison Example 2, development of cracks of the order of 50 to 70 cracks per cm² was observed. Thus, in Practical Example 2, a very powerful effect of suppressing cracks was confirmed, and similar effects on the threshold value and the voltage as in Practical Example 1 described above were obtained.

Practical Example 3

As a nitride semiconductor laser chip according to Practical Example 3, a nitride semiconductor laser chip similar to the one according to Embodiment 1 described above was fabricated by use of an n-type GaN substrate having an off-angle of −5.0 degrees in the a-axis direction and an off-angle of −1 degree in the c-axis direction relative to the m plane {1-100}. In Practical Example 3, the In composition ratio in the active layer (well layers) was 0.23, and the Al composition ratio in the carrier block layer was 0.13. The width of the gradient thickness region was 18.4 μm. As distinct from Embodiment 1 described above, in Practical Example 3, formed as the n-type clad layer was an AlGaN layer of n-type $Al_{0.12}Ga_{0.88}N$ (with an Al composition ratio of 0.12) with a thickness of about 1.8 μm. In other respects, the structure in Practical Example 3 was similar to that in Embodiment 1 described above.

Also, another nitride semiconductor laser chip similar to that of Practical Example 3 described above was fabricated by use of an n-type GaN substrate having no off-angle (an m-plane just substrate), and this nitride semiconductor laser chip was taken as Comparison Example 3. It should be noted that in Comparison Example 3, the chip was fabricated with no depressed portions (carved regions) formed on the substrate.

In Practical Example 3, despite the Al composition ratio in the n-type clad layer being as high as 0.12, no development of cracks was observed. On the other hand, in Comparison Example 3, development of cracks of the order of 50 to 70 cracks per cm² was observed. Thus, in Practical Example 3, a very powerful effect of suppressing cracks was confirmed, and similar effects on the threshold value and the voltage as in Practical Example 1 described above were obtained.

In Practical Examples 1 to 3 described above, the emission wavelengths of the nitride semiconductor laser chips were 490 nm to 495 nm.

Embodiment 2

Figure 37:
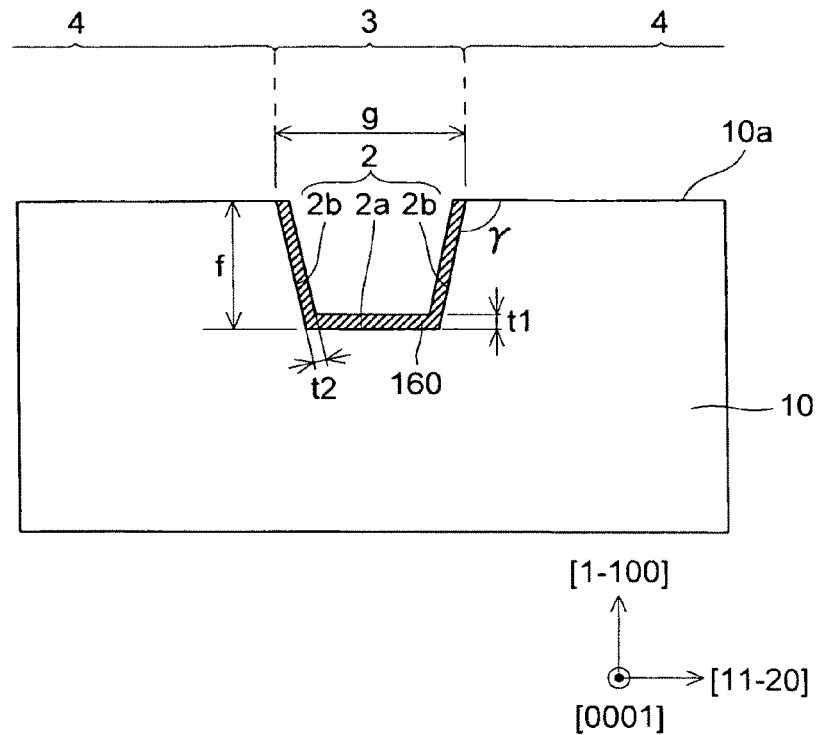
FIG. 37 is a sectional view illustrating a nitride semiconductor wafer and a nitride semiconductor laser chip according to Embodiment 2 of the invention (a diagram showing a section of part of a substrate used in a nitride semiconductor wafer and a nitride semiconductor laser chip according to Embodiment 2)

FIG. 37 is a sectional view illustrating a nitride semiconductor wafer and a nitride semiconductor laser chip according to a second embodiment (Embodiment 2) of the invention. FIG. 37 shows a section of part of a substrate used in a nitride semiconductor wafer and a nitride semiconductor laser chip according to Embodiment 2. Next, with reference to FIGS. 1, 7, and 37, a nitride semiconductor wafer and a nitride semiconductor laser chip according to Embodiment 2 will be described. Embodiment 2 deals with an example in which a nitride semiconductor chip according to the invention is applied to a nitride semiconductor laser chip.

In a nitride semiconductor wafer and a nitride semiconductor laser chip according to Embodiment 2, in addition to the structure of Embodiment 1 described previously, there is further provided a growth suppression film for suppressing growth of a nitride semiconductor crystal. Specifically, in Embodiment 2, as shown in FIG. 37, in the carved region 3 (in the region inside the depressed portion 2) on the n-type GaN substrate 10, there is further formed a growth suppression film 160 which is a nitride film, specifically an AlN film. The growth suppression film 160 is formed so as to cover the floor surface portion 2a and the side surface portions 2b of the depressed portion 2. Moreover, the growth suppression film 160 is formed with such a thickness as not to fill the inside of the depressed portion 2 (carved region 3).

Furthermore, the growth suppression film 160 is so formed that the thickness t2 of its part formed on the side surface portions 2b is smaller than the thickness t1 of its part formed on the floor surface portion 2a. Specifically, the growth suppression film 160 is formed so that the thickness t1 of its part formed on the floor surface portion 2a of the depressed portion 2 is about 100 nm and that the thickness t2 of its part formed on the side surface portions 2b of the depressed portion 2 is about 80 nm. With this structure, it is possible to effectively suppress a defect such as exfoliation of the growth suppression film 160.

It is preferable that the thickness t1 of the growth suppression film 160 be equal to or less than a half of the depth f of the depressed portion 2. It is also preferable that the thickness t2 of the growth suppression film 160 be equal to or less than a half of the opening width g of the depressed portion 2. With this structure, it is possible to suppress the filling of the inside of the depressed portion 2 with the growth suppression film.

Moreover, in Embodiment 2, the growth suppression film 160 is formed so as to extend along the depressed portion 2 (so as to extend in the c-axis [0001] direction).

In other respects, the structure in Embodiment 2 is similar to that in Embodiment 1 described previously In Embodiment 2, as described above, the growth suppression film 160 for suppressing growth of a nitride semiconductor crystal is formed in the carved region 3 (depressed portion 2) on the n-type GaN substrate 10; this makes it possible to surely suppress the filling of the inside of the depressed portion 2 (carved region 3) with the nitride semiconductor layer 20 (the individual semiconductor layers constituting the nitride semiconductor layer 20) during formation of the nitride semiconductor layer 20 (see FIGS. 1 and 7). As a result, it is possible to readily form a concavity on the surface of the nitride semiconductor layer 20 (each individual layer constituting the nitride semiconductor layer 20) over the depressed portion 2 (carved region 3). Thus, even in a case where a large difference in lattice constant, thermal expansion coefficient, etc. between the n-type GaN substrate 10 and the nitride semiconductor layer 20 produces strain in the nitride semiconductor layer 20, the strain in the nitride semiconductor layer 20 formed over the uncarved region 4 can be alleviated with the concavity formed on the nitride semiconductor layer 20 over the depressed portion 2 (carved region 3).

In particular, in a case where a particular nitride semiconductor layer (for example, the n-type clad layer) needs to be formed thicker, the depressed portion 2 (carved region 3) is more likely to be filled; in such a case, therefore, it is very effective to form a growth suppression film 160 as described above inside the depressed portion 2 (carved region 3). This is because if the inside of the depressed portion 2 (carved region 3) is completely filled (if no concavity is formed), it is difficult to alleviate strain, leading to a diminished effect of suppressing cracks.

In Embodiment 2, forming the growth suppression film 160 with such a thickness as not to fill the inside of the depressed portion 2 (carved region 3) makes it possible to readily form a concavity on the surface of the nitride semiconductor layer 20 (each individual layer constituting the nitride semiconductor layer 20) over the depressed portion 2 (carved region 3).

In Embodiment 2, forming the growth suppression film 160 out of an AlN film, that is, a film of a nitride of aluminum, makes it possible to obtain a more powerful effect of suppressing cracks. Since AlN can have a crystal structure similar to that of a nitride semiconductor, a continuous crystal structure is obtained between the growth suppression film 160 and the region where the growth suppression film 160 is not formed. Thus, AlN can be said to be a suitable material for the growth suppression film.

The other effects of Embodiment 2 are similar to those of Embodiment 1 described previously.

Figure 38:
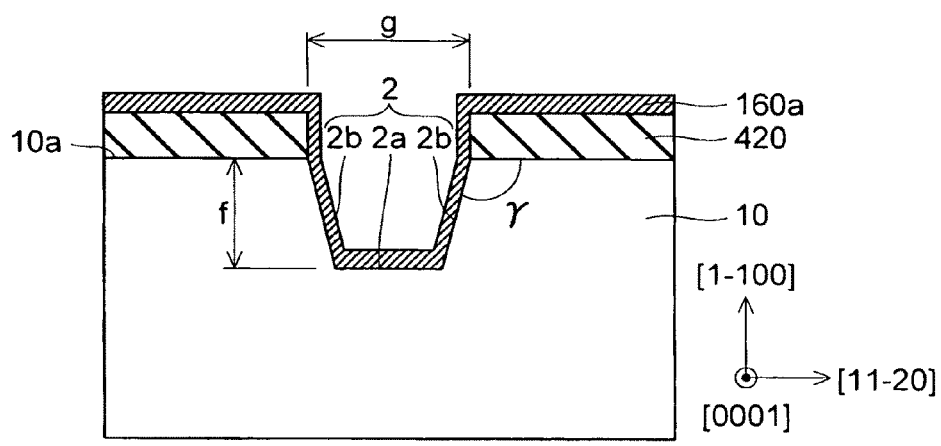
FIG. 38 is a sectional view illustrating a method of manufacture of a nitride semiconductor laser chip according to Embodiment 2 of the invention.
Figure 39:
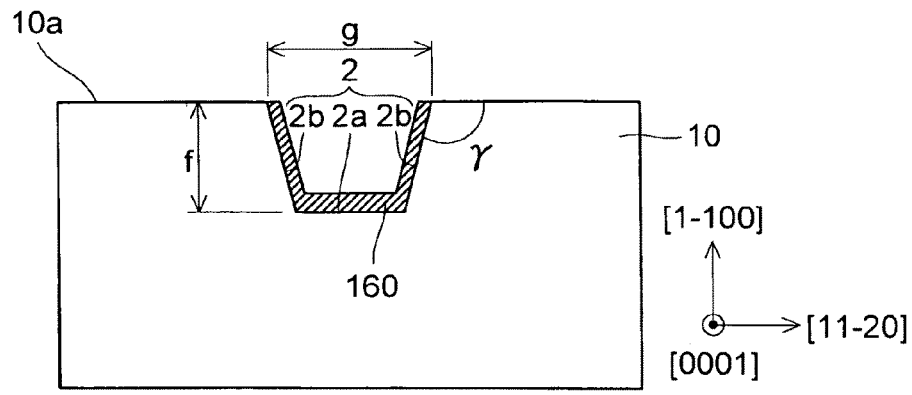
FIG. 39 is a sectional view illustrating a method of manufacture of a nitride semiconductor laser chip according to Embodiment 2 of the invention.

FIGS. 38 and 39 are sectional views illustrating a method of manufacture of a nitride semiconductor laser chip according to Embodiment 2 of the invention. Next, with reference to FIGS. 19 to 22, 38, and 39, a description will be given of a method of manufacture of a nitride semiconductor laser chip according to Embodiment 2 of the invention. The steps in Embodiment 2 other than that for forming the growth suppression film 160 are similar to those in Embodiment 1 described previously, and accordingly the following description only discusses the step for forming the growth suppression film 160.

First, an n-type GaN substrate having as a principal growth plane a plane having an off-angle in the a-axis direction relative to the m plane is prepared, and by a method similar to that used in Embodiment 1 shown in FIGS. 19 to 22, a depressed portion 2 is formed on the n-type GaN substrate.

Next, as shown in FIG. 38, by a sputtering process using an ECR (electron cyclotron resonance) machine, an AlN film 160a as a growth suppression film is formed with a thickness of about 100 nm over the entire surface. At this time, through adjustment of the sputtering conditions etc., the AlN film 160a is so formed that the thickness of the part of the AlN film 160a formed on the side surface portions 2b of the depressed portion 2 is about 80 nm.

Then, as shown in FIG. 39, by use of an etchant such as HF (hydrogen fluoride), the $SiO_2$ layer 420 (see FIG. 38) is removed. Thus, by lift-off, the above-described growth suppression film 160 formed of an AlN film is formed on the side surface portions 2b and the floor surface portion 2a of the depressed portion 2.

Figure 40:
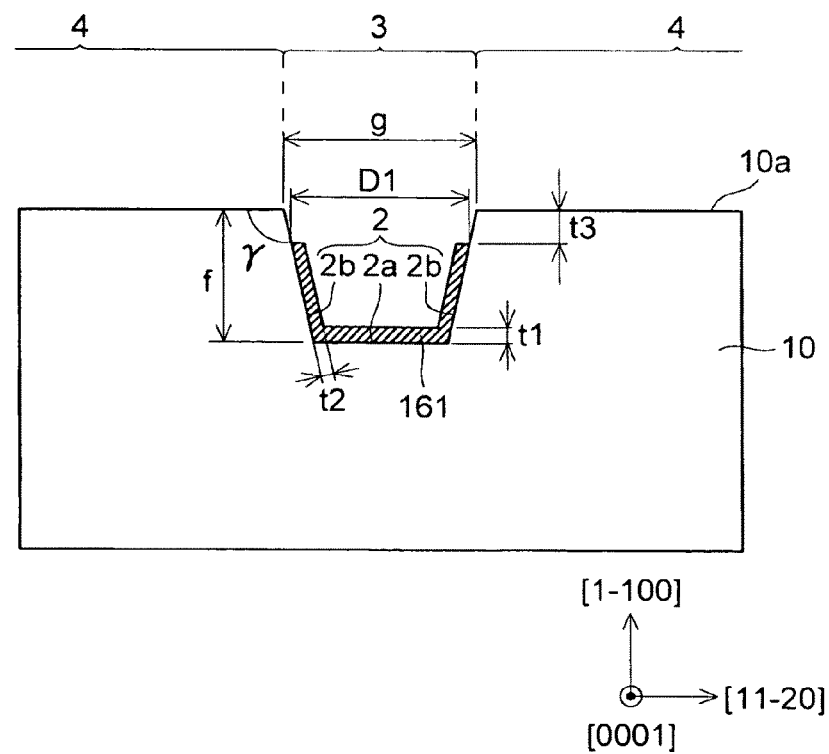
FIG. 40 is a sectional view illustrating a nitride semiconductor wafer and a nitride semiconductor laser chip according to a first modified example of Embodiment 2 of the invention

FIG. 40 is a sectional view illustrating a nitride semiconductor wafer and a nitride semiconductor laser chip according to a first modified example of Embodiment 2. Now, with reference to FIGS. 23 and 40, a description will be given of, as a first modified example of Embodiment 2, a case where the growth suppression film is given a different shape.

In the first modified example of Embodiment 2, as shown in FIG. 40, a growth suppression film 161 formed of an AlN film is formed in a region (position) lower than the principal growth plane 10a inside the depressed portion 2. The growth suppression film 161 here is formed on part of the side surface portions 2b and on the floor surface portion 2a of the depressed portion 2 so as to have a substantially square-cornered U-shaped (substantially depressed) sectional shape.

Moreover, the growth suppression film 161 has a predetermined width D1 smaller than the opening width g of the depressed portion 2, and is, as in Embodiment 2 described above, formed so as to extend along the depressed portion 2 (so as to extend in the c-axis [0001] direction).

Moreover, in the first modified example of Embodiment 2, the distance t3 from the principal growth plane 10a (the surface of the uncarved region 4) to the growth suppression film 161 is set at, for example, about 1.5 μm. Too small a distance t3 makes it difficult to form the growth suppression film 161; it is therefore preferable that the distance t3 be set at 0.5 μm or more.

In other respects, the structure in the first modified example of Embodiment 2 is similar to that in Embodiment 2 described above. The effects of the first modified example of Embodiment 2 are similar to those of Embodiment 2 described above.

The above-described growth suppression film 161 can be formed, for example, in the following manner.

First, by a method similar to that used in Embodiment 1 described previously, a depressed portion (carved region) is formed on a substrate to prepare an n-type GaN substrate 10 having a depressed portion 2 (carved region) formed on it as shown in FIG. 23. Next, a resist is applied over the entire surface of the principal growth plane 10a of the n-type GaN substrate 10. Then, by use of a photolithography technology, part of the resist in an area narrower than the opening width g (see FIG. 40) of the depressed portion 2 is selectively removed. In this way, an opening as a resist pattern is formed such as to expose part of the side surface portions 2b of the depressed portion 2 and the floor surface portion 2a of the depressed portion 2.

Subsequently, by a sputtering process using an ECR sputtering machine, an AlN film as a growth suppression film is formed over the entire surface, and then by use of a resist removal liquid or organic solvent (for example, acetone, ethanol, etc.), the resist is removed. Thus, by lift-off, a growth suppression film 161 as shown in FIG. 40 is formed.

Figure 41:
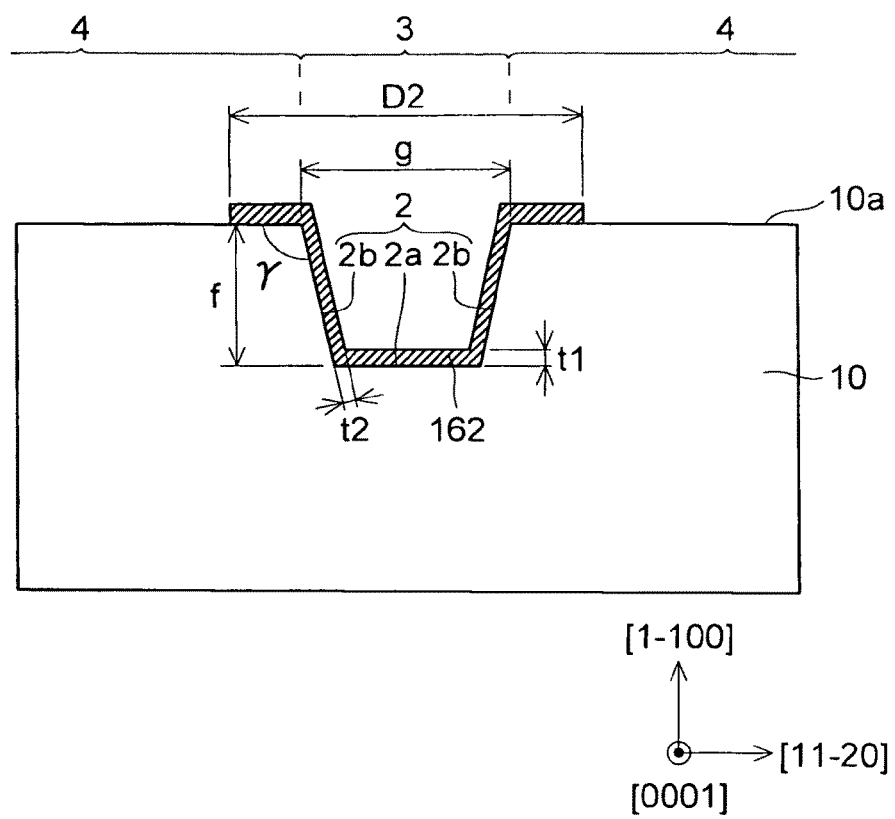
FIG. 41 is a sectional view illustrating a nitride semiconductor wafer and a nitride semiconductor laser chip according to a second modified example of Embodiment 2 of the invention.

FIG. 41 is a sectional view illustrating a nitride semiconductor wafer and a nitride semiconductor laser chip according to a second modified example of Embodiment 2. Now, with reference to FIG. 41, a description will be given of, as a second modified example of Embodiment 2, a case where the growth suppression film is given a different shape.

In the second modified example of Embodiment 2, as shown in FIG. 41, a growth suppression film 162 formed of an AlN film is formed not only inside the depressed portion 2 (carved region 3) but also on part of the uncarved region 4.

Moreover, the growth suppression film 162 has a predetermined width D2 larger than the opening width g of the depressed portion 2, and is, as in Embodiment 2 described above, formed so as to extend along the depressed portion 2 (so as to extend in the c-axis [0001] direction).

In other respects, the structure in the second modified example of Embodiment 2 is similar to that in Embodiment 2 described above. The effects of the second modified example of Embodiment 2 are similar to those of Embodiment 2 described above.

The above-described growth suppression film 162 can be formed, for example, by using a modified resist pattern in the method of manufacture of the first modified example described above. Specifically, by use of a photolithography technology, part of the resist in an area wider than the opening width g of the depressed portion 2 is selectively removed, so that an opening as a resist pattern is formed such as to expose the depressed portion 2 (carved region 3) and part of the uncarved region 4. Thereafter, by a method similar to that used in the first modified example described above, a growth suppression film 162 as shown in FIG. 41 is formed.

Embodiment 3

Figure 42:
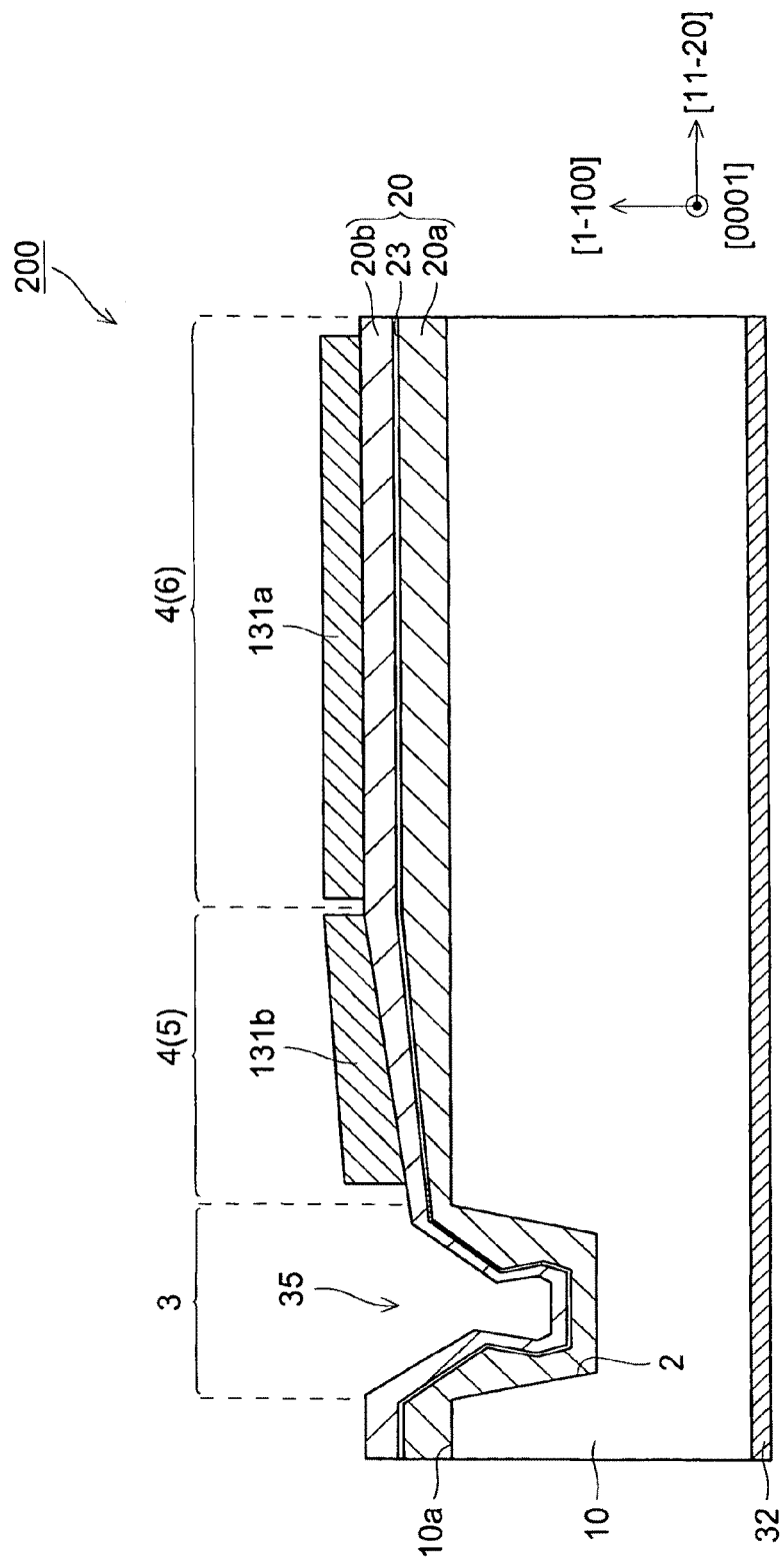
FIG. 42 is a sectional view schematically showing a light-emitting diode chip according to Embodiment 3 of the invention.

FIG. 42 is a sectional view schematically showing a light-emitting diode chip according to a third embodiment (Embodiment 3) of the invention. Next, with reference to FIGS. 21 and 42, a description will be given of, as Embodiment 3, an example in which a nitride semiconductor chip according to the invention is applied to a light-emitting diode chip.

The light-emitting diode chip 200 according to Embodiment 3 is formed by stacking a nitride semiconductor layer 20 similar to the one in Embodiment 1 described previously on an n-type GaN substrate 10 similar to the one in Embodiment 1 described previously. Specifically, the light-emitting diode chip 200 has a structure in which, as shown in FIG. 21, a nitride semiconductor layer 20 including an n-type nitride semiconductor layer 20a, an active layer 23, and a p-type nitride semiconductor layer 20b is formed on the principal growth plane 10a of the n-type GaN substrate 10. The n-type nitride semiconductor layer 20a includes an n-type clad layer and an n-type guide layer; the p-type nitride semiconductor layer 20b includes a carrier block layer, a p-type clad layer, a p-type guide layer, and a p-type contact layer.

Moreover, in the light-emitting diode chip 200 according to Embodiment 3, in a predetermined region of the n-type GaN substrate 10, a depressed portion 2 (carved region 3) similar to that in Embodiment 1 is formed. Furthermore, in Embodiment 3, as a result of the nitride semiconductor layer 20 being formed on the principal growth plane 10a of the n-type GaN substrate 10, a gradient thickness region 5 and an emission portion formation region 6 are formed in the nitride semiconductor layer 20 over the uncarved region 4.

Here, compared with the emission portion formation region 6, the gradient thickness region 5 has a weaker effect of suppressing bright-spotted emission but does permit EL emission to occur. Moreover, the gradient thickness region 5 emits light at a shorter wavelength than the emission portion formation region 6. Accordingly, in the light-emitting diode chip 200 according to Embodiment 3, p-side electrodes 131a and 131b which are transparent electrodes are formed on both the emission portion formation region 6 and the gradient thickness region 5 respectively. The p-side electrodes 131a and 131b are formed separate from each other so that light emission in the emission portion formation region 6 and in the gradient thickness region 5 can be controlled separately.

On the back face of the n-type GaN substrate 10, an n-side electrode 32 as a common electrode is formed.

A nitride semiconductor wafer according to Embodiment 3 is formed so as to include a plurality of the light-emitting diode chip 200 according to Embodiment 3 described above.

In Embodiment 3, as described above, light-emitting regions are formed in both the gradient thickness region 5 and the emission portion formation region 6, and this makes it possible to obtain a light-emitting chip (light-emitting diode chip) that, in a single chip, has two or more emission peaks.

In Embodiment 3, a structure that permits light emission in the emission portion formation region 6 and in the gradient thickness region 5 to be controlled separately is adopted, and this makes it possible to obtain a novel light-emitting chip (light-emitting diode chip) that emits light in a very wide range of emission wavelength.

It should be understood that the embodiments disclosed herein are in every respect illustrative and not restrictive. The scope of the present invention is set out not in the description of the embodiments presented above but in the appended claims, and encompasses any variations and modifications within the sense and scope equivalent to those of the claims.

For example, although Embodiments 1 to 3 described above deal with examples in which the invention is applied to a nitride semiconductor light-emitting chip (nitride semiconductor laser chip, light-emitting diode chip) as an example of a nitride semiconductor chip, this is not meant to limit the invention; the invention may be applied to semiconductor chips other than nitride semiconductor light-emitting chips. For example, the invention may be applied to electronic devices (semiconductor chips) such as ICs (integrated circuits), LSIs (large-scale integrated circuits), and transistors. In such cases, the device can be formed in a region over the uncarved region other than the gradient thickness region (that is, in a region corresponding to the emission portion formation region). With that structure, it is possible to obtain an electronic device with superb characteristics.

Although Embodiments 1 to 3 described above deal with examples in which the off-angle in the a-axis direction is set to be larger than 0.1 degrees, this is not meant to limit the invention; the off-angle in the a-axis direction may be 0.1 degrees or smaller. With consideration given to the effect of suppressing bright-spotted emission and to surface morphology, however, it is preferable that the off-angle in the a-axis direction be larger than 0.1 degrees.

Although Embodiments 1 to 3 described above deal with examples in which the off-angle in the a-axis direction is set to be 10 degrees or smaller, this is not meant to limit the invention; the off-angle in the a-axis direction may be 10 degrees or larger. Too large an off-angle in the a-axis direction, however, may degrade surface morphology, and therefore it is preferable that the off-angle in the a-axis direction be 10 degrees or smaller.

In Embodiments 1 to 3 described above, the principal growth plane of the substrate has only to have an off-angle in the a-axis direction, and does not necessarily have to have an off-angle in the c-axis direction.

In Embodiments 1 to 3 described above, with regard to the individual nitride semiconductor layers grown as a crystal on top of the substrate, their respective thicknesses, compositions, etc. may be differently combined or changed appropriately to suit the desired characteristics. For example, a semiconductor layer may be added or eliminated, or the order of semiconductor layers may be partly changed. For another example, a layer such as a buffer layer of GaN may be formed between the GaN substrate and the n-type clad layer. The conductivity types of semiconductor layers may be partly changed. That is, any variations and modifications are possible so long as the basic characteristics of a nitride semiconductor chip are obtained.

In Embodiments 1 to 3 described above, the opening width and depth of the depressed portion formed on the substrate may be changed as necessary. It is, however, preferable that the opening width of the depressed portion be 1 μm or more but 50 μm or less. With the opening width of the depressed portion less than 1 μm, it is difficult to obtain, among others, the effect of suppressing cracks. On the other hand, with the opening width of the depressed portion more than 50 μm, the depressed portion (carved region) occupies too large a proportion of the area of the wafer surface. This, since it is undesirable to form the ridge portion over the depressed portion (carved region), reduces the number of chips obtained from a single wafer. It is preferable that the depth of the depressed portion be 0.1 μm or more but 15 μm or less. With the depth of the depressed portion less than 0.1 μm, the depressed portion is filled too readily. On the other hand, with the depth of the depressed portion more than 15 μm, it takes too long to form the depressed portion.

Figure 43:
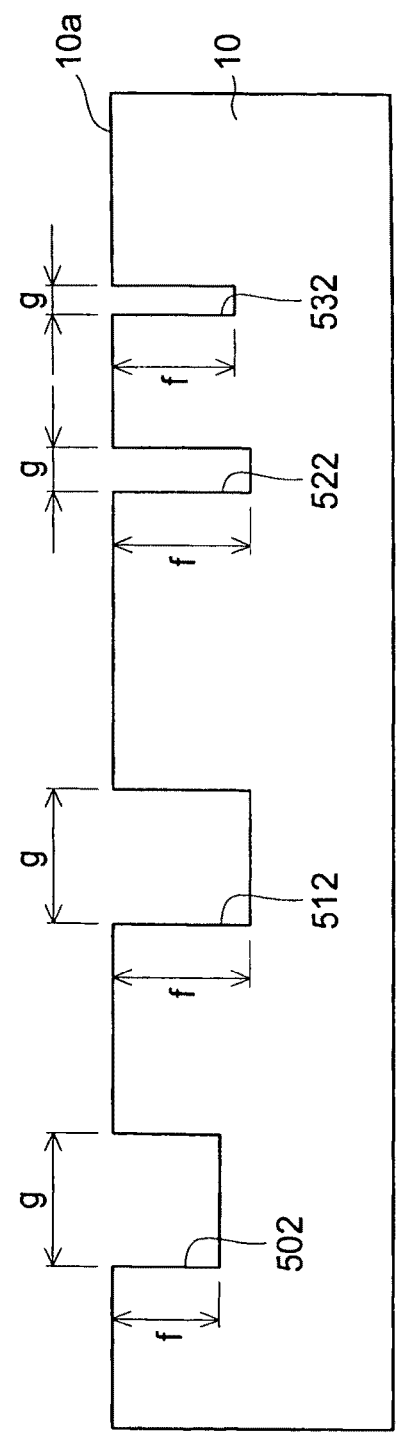
FIG. 43 is a sectional view illustrating examples of other shapes of a depressed portion (carved region) in Embodiments 1 to 3.
Figure 44:
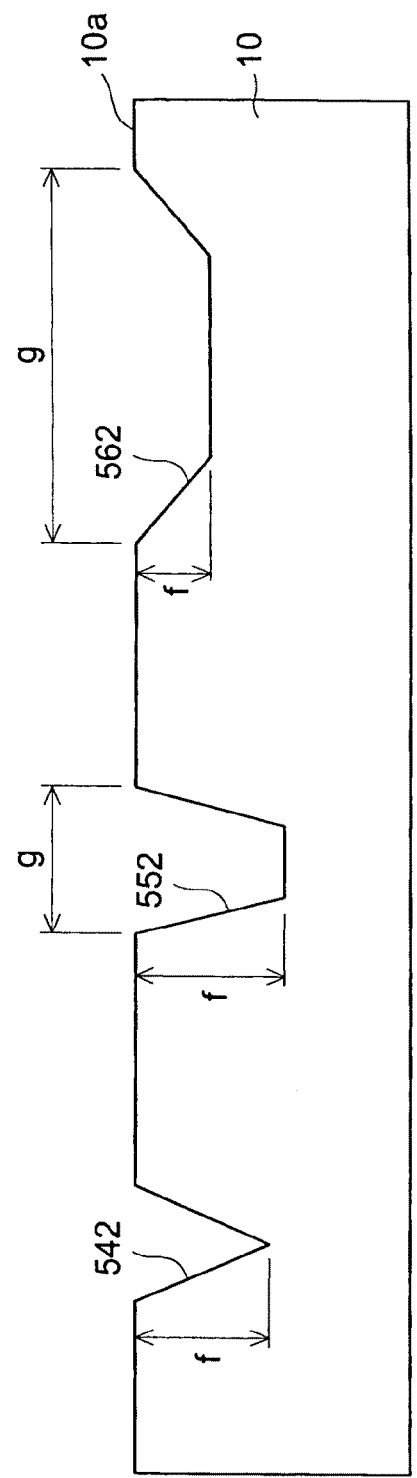
FIG. 44 is a sectional view illustrating examples of other shapes of a depressed portion (carved region) in Embodiments 1 to 3.

In Embodiments 1 to 3 described above, the sectional shape of the depressed portion may be changed as necessary. For example, the depressed portion may be formed to have a rectangular sectional shape as shown in FIG. 43. In this case, the depressed portion may be formed, like the depressed portion 502, such that the opening width g is larger than the depth f, or may be formed, like the depressed portion 512, such that the opening width g and the depth f are approximately equal; it may even be formed, like the depressed portions 522 and 532, such that the depth f is larger than the opening width g. The depressed portion may be formed such that its side surface portions are inclined surfaces as shown in FIG. 44. In this case, the depressed portion may be formed, like the depressed portion 542, to have a V-shaped (inverted triangular) sectional shape, or may be formed, like the depressed portions 552 and 562, to have a trapezoidal sectional shape. In this case, the depressed portion may be formed, like the depressed portion 552, such that the opening width g and the depth f are approximately equal, or may be formed, like the depressed portion 562, such that the opening width g is larger than the depth f. That is, the depressed portion (carved region) formed on the substrate has simply to produce a level difference between depressed and elevated parts. With regard to the relationship between the opening width and depth of the depressed portion, it is preferable that the opening width be larger than the depth. With the opening width equal to or smaller than the depth, when the growth suppression film is formed, its part on the floor surface portion of the depressed portion may be formed thinner. By contrast, with the opening width larger than the depth, the growth suppression film can be formed with a stable thickness.

Figure 45:
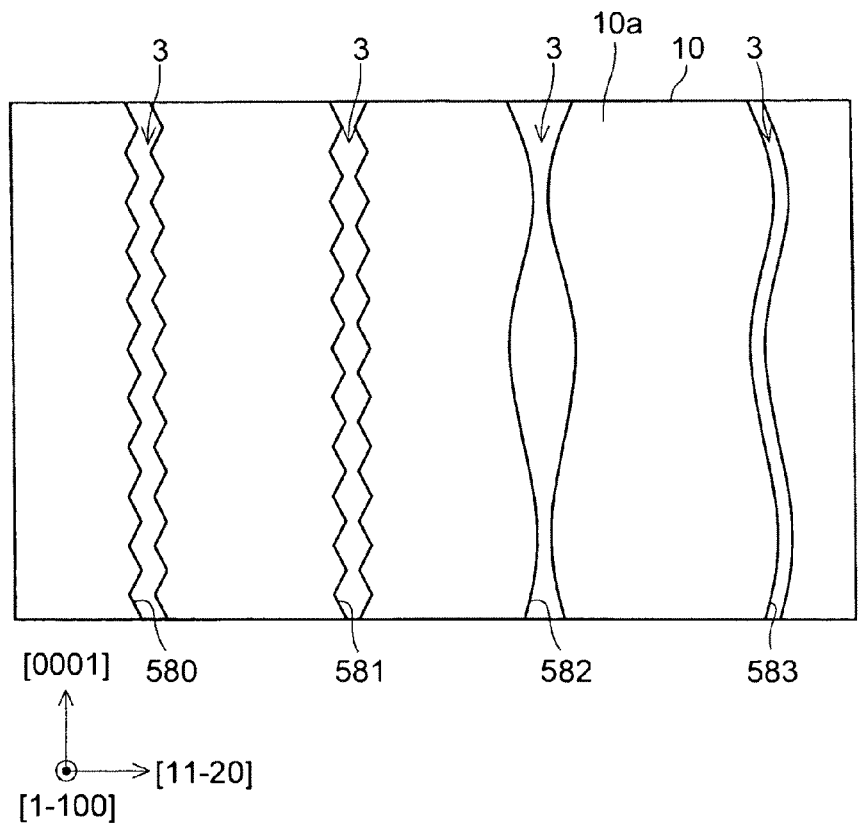
FIG. 45 is a plan view illustrating examples of other shapes of a depressed portion (carved region) in Embodiments 1 to 3.

Although Embodiments 1 to 3 described above deal with examples in which the carved region is formed on the substrate by forming a depressed portion with a constant opening width in a rectilinear shape, this is not meant to limit the invention; the carved region may be formed on the substrate by forming a depressed portion in any other shape. For example, as shown in FIG. 45, the carved region 3 may be formed on the substrate by forming a depressed portion 580 in a zigzag shape, or a depressed portion 58 in a wavy shape; the carved region may be formed on the substrate by forming a depressed portion 581 or 582 with a varying opening width. With any of the carved regions formed in these ways, it is possible to obtain the effects of the invention.

Although Embodiments 1 to 3 described above deal with examples in which a GaN substrate is used as a nitride semiconductor substrate, this is not meant to limit the invention; any nitride semiconductor substrate other than a GaN substrate may be used. As a nitride semiconductor substrate, it is possible to use a substrate of a nitride semiconductor such as GaN, AlN, InN, BN, TlN, or a mixed crystal of any of these. It is also possible to use a substrate in which a layer of a nitride semiconductor having carved and uncarved regions is formed on top of a substrate of a nitride semiconductor or on top of a substrate of other than a nitride semiconductor. For example, it is possible to use a substrate obtained by first forming a primer layer of a nitride semiconductor on top of a base substrate such as a GaN substrate, a sapphire substrate, or SiC substrate and then forming a depressed portion in the primer layer. A "nitride semiconductor substrate" according to the invention conceptually includes such substrates.

Although Embodiments 1 to 3 described above deal with examples in which a plurality of depressed portions are formed at equal intervals, this is not meant to limit the invention; a plurality of depressed portions may be formed with varying intervals between adjacent depressed portions. It is possible to form depressed portions of different sectional shapes on a single substrate.

Although Embodiments 1 to 3 described above deal with examples in which the period of the depressed portions is set at about 400 µm, the period of the depressed portions can be determined according to the chip width of the nitride semiconductor laser chip: in a case where the chip width is set at, for example, about 200 µm, the period of the depressed portions can be set at about 200 µm. It is preferable that the period of (interval between) the depressed portions (carved regions) be 1 mm or less, and more preferably 400 µm or less. With this structure, even if the wafer (substrate) has a defective part and this produces a variation in thickness, the concavity over the depressed portion severs lateral growth and thereby suppresses the spread of the defect-induced variation in thickness. On the other hand, with the period of (interval between) the depressed portions (carved regions) equal to or less than 5 µm, it is difficult to form the ridge portion, and therefore it is preferable that the period of (interval between) the depressed portions (carved regions) be more than 5 µm.

Although Embodiments 1 to 3 described above deal with examples in which the depressed portion (carved region) is formed so as to extend, as seen in a plan view, in the direction parallel to the c-axis direction, this is not meant to limit the invention; the depressed portion (carved region) may be formed so as to extend in a direction crossing the c-axis direction at a predetermined angle as observed on the principal growth plane. For example, the depressed portion (carved region) may be formed to extend in a direction crossing the c-axis direction at an angle of ±15 degrees or smaller. Also with the depressed portion (carved region) formed in this way, it is possible to easily form the gradient thickness region in the nitride semiconductor layer.

In Embodiments 1 to 3 described above, the depressed portion (carved region) may be formed after first growing a layer of a nitride semiconductor such as GaN, InGaN, AlGaN, InAlGaN, or InAlN on the substrate. That is, the contents of the present specification apply also in cases where growth is performed first and then the depressed portion (carved region) is formed.

In Embodiments 1 to 3 described above, the method for etching used in the manufacturing procedure of the nitride semiconductor chip (nitride semiconductor laser chip, light-emitting diode chip) may be vapor-phase etching or liquid-phase etching.

Although Embodiments 1 to 3 described above deal with examples in which the nitride semiconductor wafer is split such that the nitride semiconductor chip (nitride semiconductor laser chip, light-emitting diode chip) includes one depressed portion (carved region), this is not meant to limit the invention; the nitride semiconductor wafer may be split such that the nitride semiconductor chip (nitride semiconductor laser chip, light-emitting diode chip) includes no depressed portion (carved region). Or the nitride semiconductor wafer may be split such that the nitride semiconductor chip (nitride semiconductor laser chip, light-emitting diode chip) includes a plurality of depressed portions (carved regions). Or the nitride semiconductor wafer may be split such that the nitride semiconductor chip (nitride semiconductor laser chip, light-emitting diode chip) includes part of a depressed portion (carved region). With any of these structures, it is possible to obtain a nitride semiconductor chip (nitride semiconductor laser chip, light-emitting diode chip) with superb chip characteristics at satisfactory yields.

Although Embodiments 1 and 2 described above deal with examples in which the nitride semiconductor wafer is split such that the nitride semiconductor chip includes at least part of the gradient thickness region, this is not meant to limit the invention; the nitride semiconductor wafer may be split such that the nitride semiconductor chip includes no part of the gradient thickness region.

Figure 46:
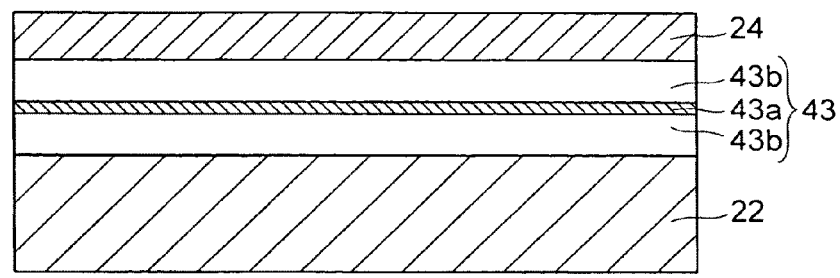
FIG. 46 is a sectional view illustrating an example of another structure of an active layer in Embodiments 1 to 3 (a sectional view showing an example of an active layer having an SQW structure)

Although Embodiments 1 to 3 described above deal with examples in which the quantum well structure of the active layer is a DQW structure, this is not meant to limit the invention; the active layer may be formed to have a quantum well structure other than a DQW structure. For example, the quantum well structure of the active layer may be an SQW (single quantum well) structure. Specifically, for example, as shown in FIG. 46, on the n-type guide layer 22, it is possible to form an active layer 43 having an SQW structure which has one well layer 43a of InGaN and two barrier layers 43b of InGaN alternately stacked. The well layer 43a is given a thickness of about 3 nm to about 4 nm, and the barrier layers 43b are given a thickness of about 70 nm. In the structures according to Embodiments 1 to 3 described above, giving the active layer an SQW structure helps reduce the driving voltage compared with giving it a DQW structure. Specifically, with an active layer having an SQW structure, the driving voltage as observed when a current of 50 mA is injected is about 0.1 V to 0.25 V lower than with an active layer having a DQW structure. This is considered to result possibly from the fact that, in a DQW structure, depletion of carriers in the barrier layer sandwiched between two well layers produces a strong electric field in the barrier layer. The active layer may be given, other than an SQW structure, an MQW structure. Also in cases where the active layer is given an SQW or MQW structure, it is possible to obtain the effect of suppressing bright-spotted emission. The composition, thickness, etc. of the active layer (well layers, barrier layers) may be changed as necessary.

Although Embodiments 1 to 3 described above deal with examples in which the In composition ratio in the well layers is 0.2 to 0.28, this is not meant to limit the invention; the In composition ratio in the well layers may be changed as necessary within the range of 0.15 or more but 0.45 or less. The In composition ratio in the well layers may be less than 0.15. The well layers may contain Al so long as its content is 5% or less.

Although Embodiments 1 to 3 described above deal with examples in which the In composition ratio in the barrier layers is 0.04 to 0.05, this is not meant to limit the invention; the In composition ratio in the barrier layers may be changed as necessary within the range less than the In composition ratio in the well layers.

Although Embodiments 1 to 3 described above deal with examples in which the barrier layers are formed of InGaN, this is not meant to limit the invention; the barrier layers may be formed of GaN. Forming the barrier layers out of GaN in this way helps suppress dislocations that develop in the direction parallel to the c-axis direction (and appear as dark lines in the EL emission pattern) when the In composition ratio in the well layers is increased. In a case where the barrier layers are formed of GaN, for effective light confinement, for example, the In composition ratio in the guide layers etc. is increased.

Although Embodiments 1 to 3 described above deal with examples in which the distance between the carrier block layer and the well layers is made equal to the thickness of the third barrier layer, it is also possible to form a plurality of nitride semiconductor layers of different compositions between the carrier block layer and the well layers (the most carrier block layer-side one of the well layers). Also preferable is to dope, to p-type, part of the interface between the carrier block layer and the well layers (the most carrier block layer-side one of the well layers) with a p-type impurity such as Mg. In Embodiments 1 to 3 described above, no such doping is done.

Although Embodiments 1 to 3 described above deal with examples in which the carrier block layer is given a thickness of 40 nm or less, this is not meant to limit the invention; the carrier block layer may be given a thickness more than 40 nm. Even when the carrier block layer contains about 3% of In, the effects of the present invention can be obtained. For the purpose of reducing the driving voltage, it is preferable that the Al composition ratio in the carrier block layer be higher than the Al composition ratio in the p-type clad layer.

Although Embodiments 1 to 3 described above deal with examples in which a carrier block layer is formed as a layer for preventing the carriers (electrons) injected into the active layer from flowing into the p-type semiconductor layer, this is not meant to limit the invention; in a nitride semiconductor laser chip, a clad layer containing Al can be used as a layer for blocking such carriers. In that case, it is preferable that the Al composition ratio in the clad layer be 0.08 or more.

Although Embodiments 1 to 3 described above deal with examples in which Si is used as an n-type impurity, this is not meant to limit the invention; as an n-type impurity other than Si, it is possible to use, for example, O, Cl, S, C, Ge, Zn, Cd, Mg, or Be. Particularly preferable n-type impurities are Si, O, and Cl.

In Embodiments 1 to 3 described above, as an epitaxial growth process other than an MOCVD process, it is possible to use, for example, an HYPE (hydride vapor phase epitaxy) process, an MBE (molecular beam epitaxy) process, or the like.

Although Embodiments 1 and 2 described above deal with examples in which the insulating layer is formed of $SiO_2$, this is not meant to limit the invention; the insulating layer may be formed of an insulating material other than $SiO_2$. For example, the insulating layer may be formed of SiN, $Al_2O_3$, $ZrO_2$, or the like.

Although Embodiment 2 described above deals with an example in which a growth suppression film of AlN is formed in the carved region, this is not meant to limit the invention; so long as crystal growth of a nitride semiconductor can be suppressed, any material other than AlN can be used to form a growth suppression film in the carved region. As the growth suppression film, it is preferable to use a film of a nitride of aluminum (Al), a film of an oxynitride of aluminum (Al), or a film of a nitride of aluminum (Al) and gallium (Ga). These materials offer powerful effects in all of the following aspects: suppression of cracks; improvement of surface morphology; and suppression of variation in the composition of the nitride semiconductor layer. Moreover, those materials can have a crystal structure similar to that of a nitride semiconductor, and thus a continuous crystal structure is obtained between the growth suppression film and the region where the growth suppression film is not formed. This makes those materials suitable for the growth suppression film. Materials of second choice for the growth suppression film include an oxide, a nitride, and an oxynitride of silicon (Si), an oxide of aluminum (Al), an oxide of titanium (Ti), an oxide of zirconium (Zr), an oxide of yttrium (Y), an oxide of niobium (Nb), an oxide of hafnium (Hf), an oxide of tantalum (Ta), and an oxynitride and a nitride of any of these materials. Materials of third choice include high-melting-point metals such as molybdenum (Mo), tungsten (W), and tantalum (Ta). In the effect of suppressing growth of a nitride semiconductor, a film of an oxide is the most powerful, followed by a film of an oxynitride and a film of nitride in order of decreasing effect. Accordingly, it is more preferable to form a film of an oxide as the growth suppression film inside the depressed portion.

Although Embodiment 2 described above deals with an example in which the growth suppression film is formed by a sputtering process using an ECR sputtering machine, this is not meant to limit the invention; the growth suppression film may be formed by any method other than specifically mentioned above. For example, the growth suppression film can be formed by a sputtering process using a magnetron sputtering machine, an EB (electron beam) vapor deposition process, a plasma CVD process, or the like.

The growth suppression film may be formed in any shape other than that specifically mentioned with regard to Embodiment 2 above so long as it is so shaped as to allow a concavity to be formed on the surface of the nitride semiconductor layer over the depressed portion (carved region).

Although Embodiment 3 described above deals with a light-emitting diode chip that has light-emitting regions in both the gradient thickness region and the emission portion formation region, this is not meant to limit the invention; a light-emitting diode chip may have a light-emitting region only in one of the gradient thickness region and the emission portion formation region. In a case where a light-emitting diode chip has a light-emitting region only in the emission portion formation region, the nitride semiconductor wafer may be split such that the light-emitting diode chip does not include the gradient thickness region.

What is claimed is:

1. A nitride semiconductor wafer comprising:
a nitride semiconductor substrate having, as a principal growth plane, a plane having an off-angle in an a-axis direction relative to an m plane; and
a nitride semiconductor layer formed on the principal growth plane of the nitride semiconductor substrate,
wherein the nitride semiconductor substrate includes a carved region, which is a region carved from the principal growth plane in a thickness direction, and an uncarved region, which is a region not carved, and
wherein the nitride semiconductor layer includes a gradient thickness region, which is formed over the uncarved region and whose thickness decreases in a gradient fashion toward the carved region.

2. The nitride semiconductor wafer according to claim 1, wherein a growth suppression film for suppressing growth of a nitride semiconductor is formed in the carved region.

3. The nitride semiconductor wafer according to claim 1, wherein the carved region is formed to extend in a direction crossing the a-axis direction as seen in a plan view.

4. A nitride semiconductor chip formed by use of the nitride semiconductor wafer according to claim 1.

5. A nitride semiconductor chip comprising:
a nitride semiconductor substrate having, as a principal growth plane, a plane having an off-angle in an a-axis direction relative to an m plane; and
a nitride semiconductor layer formed on the principal growth plane of the nitride semiconductor substrate,
wherein the nitride semiconductor substrate includes a carved region, which is a region carved from the principal growth plane in a thickness direction, and an uncarved region, which is a region not carved, and wherein the nitride semiconductor layer includes a gradient thickness region, which is formed over the uncarved region and whose thickness decreases in a gradient fashion toward the carved region.

6. The nitride semiconductor chip according to claim 5, wherein a growth suppression film for suppressing growth of a nitride semiconductor is formed in the carved region.

7. The nitride semiconductor chip according to claim 5, wherein the carved region is formed to extend in a direction crossing the a-axis direction as seen in a plan view.

8. The nitride semiconductor chip according to claim 5, wherein an absolute value of the off-angle in the a-axis direction in the nitride semiconductor substrate is larger than 0.1 degrees.

9. The nitride semiconductor chip according to claim 8, wherein the absolute value of the off-angle in the a-axis direction in the nitride semiconductor substrate is 0.5 degrees or larger.

10. The nitride semiconductor chip according to claim 5, wherein
the nitride semiconductor substrate has an off-angle in a c-axis direction in addition to in the a-axis direction, and
the off-angle in the a-axis direction is larger than the off-angle in the c-axis direction.

11. The nitride semiconductor chip according to claim 5, wherein
the nitride semiconductor layer has an active layer containing In, and
an In composition ratio in the active layer is 0.15 or more but 0.45 or less.

12. The nitride semiconductor chip according to claim 5, wherein
the nitride semiconductor layer has a p-type semiconductor layer containing Al, and
an Al composition ratio in the p-type semiconductor layer is 0.08 or more but 0.35 or less.

13. The nitride semiconductor chip according to claim 5, wherein
the nitride semiconductor layer includes an optical waveguide region, and
the optical waveguide region is located over the uncarved region.

14. The nitride semiconductor chip according to claim 13, wherein
the optical waveguide region is formed to extend in a c-axis direction as seen in a plan view.

15. The nitride semiconductor chip according to claim 5, wherein
the nitride semiconductor layer includes a light-emitting region, and
the light-emitting region is located over the uncarved region.

16. The nitride semiconductor chip according to claim 5, wherein the nitride semiconductor substrate is formed of GaN.

* * * * *